(12) United States Patent
Osumi et al.

(10) Patent No.: US 11,894,321 B2
(45) Date of Patent: Feb. 6, 2024

(54) SEMICONDUCTOR DEVICE WITH A TRANSMITTING INSULATING ELEMENT

(71) Applicant: ROHM CO., LTD., Kyoto (JP)

(72) Inventors: Yoshizo Osumi, Kyoto (JP); Hiroaki Matsubara, Kyoto (JP); Tomohira Kikuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 237 days.

(21) Appl. No.: 17/465,973

(22) Filed: Sep. 3, 2021

(65) Prior Publication Data
US 2022/0077082 A1    Mar. 10, 2022

(30) Foreign Application Priority Data

Sep. 10, 2020  (JP) ................. 2020-152192

(51) Int. Cl.
| | |
|---|---|
| H01L 29/00 | (2006.01) |
| H01L 23/64 | (2006.01) |
| H01L 23/31 | (2006.01) |
| H01L 23/495 | (2006.01) |
| H01L 21/48 | (2006.01) |
| H01L 21/56 | (2006.01) |
| H02P 27/08 | (2006.01) |
| B60K 6/22 | (2007.10) |
| B60L 50/50 | (2019.01) |

(52) U.S. Cl.
CPC ........ *H01L 23/645* (2013.01); *H01L 21/4825* (2013.01); *H01L 21/4828* (2013.01); *H01L 21/565* (2013.01); *H01L 23/3107* (2013.01); *H01L 23/4952* (2013.01); *H01L 23/49503* (2013.01); *H01L 23/49575* (2013.01); *B60K 6/22* (2013.01); *B60L 50/50* (2019.02); *B60Y 2200/91* (2013.01); *B60Y 2200/92* (2013.01); *H02P 27/08* (2013.01)

(58) Field of Classification Search
CPC ............... H01L 23/645; H01L 23/3107; H01L 23/49503; H01L 23/4952; H01L 23/49575
USPC ...................................................... 257/531
See application file for complete search history.

(56) References Cited

U.S. PATENT DOCUMENTS

| | | | |
|---|---|---|---|
| 2015/0069423 A1* | 3/2015 | Yamamoto ........... | H01L 31/0203 257/782 |
| 2016/0013163 A1* | 1/2016 | Muto .................... | H01L 29/739 257/140 |

FOREIGN PATENT DOCUMENTS

JP    2014155412 A    8/2014

* cited by examiner

*Primary Examiner* — Caleb E Henry
*Assistant Examiner* — Dilinh P Nguyen
(74) *Attorney, Agent, or Firm* — HAMRE, SCHUMANN, MUELLER & LARSON, P.C.

(57) ABSTRACT

A semiconductor device includes a conductive support member, a first semiconductor element, a second semiconductor element, an insulating element, and a sealing resin. The conductive support member includes a first die pad and a second die pad, which are separated from each other in a first direction. The first die pad and the second die pad overlap each other when viewed along the first direction. When viewed along a thickness direction, a peripheral edge of the first die pad has a first near-angle portion including a first end portion in a second direction orthogonal to both the thickness direction and the first direction. The first near-angle portion is separated from the second die pad in the first direction toward the first end portion in the second direction.

16 Claims, 39 Drawing Sheets

SEMICONDUCTOR DEVICE WITH A TRANSMITTING INSULATING ELEMENT

CROSS-REFERENCE TO RELATED APPLICATION

This application is based upon and claims the benefit of priority from Japanese Patent Application No. 2020-152192, filed on Sep. 10, 2020, the entire contents of which are incorporated herein by reference.

TECHNICAL FIELD

The present disclosure relates to a semiconductor device in which signals are communicated via an insulating element between a plurality of semiconductor elements mounted in one package.

BACKGROUND

Semiconductor devices are used in inverter devices used in electric vehicles, hybrid vehicles, home appliances, and the like. An inverter device includes, for example, a semiconductor device and a power semiconductor such as an IGBT (Insulated Gate Bipolar Transistor) or a MOSFET (Metal Oxide Semiconductor Field Effect Transistor). The semiconductor device includes a control element and a drive element. In the inverter device, a control signal output from an ECU (Engine Control Unit) is input to the control element of the semiconductor device. The control element converts the control signal into a PWM (Pulse Width Modulation) control signal and transmits the PWM control signal to the drive element. The drive element causes, for example, six power semiconductors to perform a switching operation at a desired timing based on the PWM control signal. As the six power semiconductors perform the switching operation at the desired timing, three-phase AC power for driving a motor is generated from DC power of a vehicle-mounted battery.

However, a power supply voltage required for the control element and a power supply voltage required for the drive element may differ from each other. In such a case, in a semiconductor device in which a plurality of semiconductor elements are mounted in one package, since there is a difference in applied power supply voltage between two conduction paths, that is, a conduction path to the control element and a conduction path to the drive element, it is required to improve an insulation withstand voltage between these conduction paths.

SUMMARY

Some embodiments of the present disclosure provide a semiconductor device capable of improving an insulation withstand voltage.

A semiconductor device according to a first aspect of the present disclosure includes: a conductive support member including a first die pad and a second die pad, which are separated from each other in a first direction orthogonal to a thickness direction and have relatively different potentials from each other; a first semiconductor element that is mounted on the first die pad and forms a first circuit together with the first die pad; a second semiconductor element that is mounted on the second die pad and forms a second circuit together with the second die pad; an insulating element that conducts to the first semiconductor element and the second semiconductor element and insulates the first circuit and the second circuit from each other; and a sealing resin that covers the first die pad, the second die pad, the first semiconductor element, the second semiconductor element, and the insulating element and insulates the first die pad and the second die pad from each other, wherein the first die pad and the second die pad overlap each other when viewed along the first direction, wherein when viewed along the thickness direction, a peripheral edge of the first die pad has a first near-angle portion including a first end portion in a second direction orthogonal to both the thickness direction and the first direction, and wherein the first near-angle portion is separated from the second die pad in the first direction toward the first end portion in the second direction.

A semiconductor device according to a second aspect of the present disclosure includes: a conductive support member including a first die pad and a second die pad, which are separated from each other in a first direction orthogonal to a thickness direction and have relatively different potentials from each other; a first semiconductor element that is mounted on the first die pad and forms a first circuit together with the first die pad; a second semiconductor element that is mounted on the second die pad and forms a second circuit together with the second die pad; an insulating element that conducts to the first semiconductor element and the second semiconductor element and insulates the first circuit and the second circuit from each other; and a sealing resin that covers the first die pad, the second die pad, the first semiconductor element, the second semiconductor element, and the insulating element and insulates the first die pad and the second die pad from each other, wherein the first die pad and the second die pad overlap each other when viewed along the first direction, wherein the first die pad has a first main surface, which faces the thickness direction and on which the first semiconductor element is mounted, and a first back surface facing an opposite side to the first main surface in the thickness direction, wherein the second die pad has a second main surface, which faces the thickness direction and on which the second semiconductor element is mounted, and a second back surface facing an opposite side to the second main surface in the thickness direction, and wherein when viewed along a second direction orthogonal to both the thickness direction and the first direction, a distance in the first direction between the first back surface and the second back surface is larger than a distance in the first direction between the first main surface and the second main surface.

A semiconductor device according to a third aspect of the present disclosure includes: a first die pad that is arranged on one side of a first direction orthogonal to a thickness direction; a second die pad that is arranged on the other side of the first direction with respect to the first die pad, is located away from the first die pad in the first direction, and has a potential that is relatively different from a potential of the first die pad; a first semiconductor element that is mounted on the first die pad and forms a first circuit together with the first die pad; a second semiconductor element that is mounted on the second die pad and forms a second circuit together with the second die pad; an insulating element that is mounted on one of the first die pad and the second die pad, relays transmission and reception of signals between the first circuit and the second circuit, and insulates the first circuit and the second circuit from each other; a plurality of first terminals that includes a portion located on the one side of the first direction with respect to the first die pad and is arranged along a second direction orthogonal to both the thickness direction and the first direction, at least one of the plurality of first terminals conducting to the first circuit; a plurality of second terminals that includes a portion located on the other side of the first direction with respect to the second die pad and is arranged along the second direction, at least one of the plurality of second terminals conducting to the second circuit; and a sealing resin that covers the first die pad, the second die pad, the first semiconductor element, the second semiconductor element, the insulating element, and a portion of each of the plurality of first terminals and the plurality of second terminals, and insulates the first die pad and the second die pad from each other, wherein the sealing resin has a first side surface located on the one side of the first direction, a second side surface located on the other side of the first direction, and a third side surface and a fourth side surface that are separated from each other in the second direction and are connected to the first side surface and the second side surface, wherein a first gate mark having a surface roughness larger than that in the other regions of the third side surface is formed on the third side surface, and wherein when viewed along the second direction, the first gate mark overlaps a pad gap provided between the first die pad and the second die pad in the first direction.

A semiconductor device according to a fourth aspect of the present disclosure includes: a first die pad that is arranged on one side of a first direction orthogonal to a thickness direction; a second die pad that is arranged on the other side of the first direction with respect to the first die pad, is located away from the first die pad in the first direction, and has a potential that is relatively different from a potential of the first die pad; a first semiconductor element that is mounted on the first die pad and forms a first circuit together with the first die pad; a second semiconductor element that is mounted on the second die pad and forms a second circuit together with the second die pad; an insulating element that is mounted on one of the first die pad and the second die pad, relays transmission and reception of signals between the first circuit and the second circuit, and insulates the first circuit and the second circuit from each other; a plurality of first terminals that includes a portion located on the one side of the first direction with respect to the first die pad and is arranged along a second direction orthogonal to both the thickness direction and the first direction, at least one of the plurality of first terminals conducting to the first circuit; a plurality of second terminals that includes a portion located on the other side of the first direction with respect to the second die pad and is arranged along the second direction, at least one of the plurality of second terminals conducting to the second circuit; and a sealing resin that covers the first die pad, the second die pad, the first semiconductor element, the second semiconductor element, the insulating element, and a portion of each of the plurality of first terminals and the plurality of second terminals, and insulates the first die pad and the second die pad from each other, wherein the sealing resin has a top surface facing a side where the first semiconductor element is located with respect to the first die pad in the thickness direction, a bottom surface facing an opposite side to the top surface in the thickness direction, a first side surface located on the one side of the first direction and connected to the top surface and the bottom surface, a second side surface located on the other side of the first direction and connected to the top surface and the bottom surface, and a third side surface located on any side of the second direction and connected to the first side surface and the second side surface, wherein the plurality of first terminals includes a first edge terminal exposed from the first side surface and located closest to the third side surface, wherein the plurality of second terminals includes a second edge terminal exposed from the second side surface and located closest to the third side surface, and wherein a first creepage distance, which is a shortest distance from the first edge terminal to the second edge terminal along the first side surface, the third side surface, and the second side surface, is shorter than a second creepage distance, which is a shortest distance from the first edge terminal to the second edge terminal along the first side surface, the bottom surface, and the second side surface.

A semiconductor device according to a fifth aspect of the present disclosure includes: a first die pad that is arranged on one side of a first direction orthogonal to a thickness direction; a second die pad that is arranged on the other side of the first direction with respect to the first die pad, is located away from the first die pad in the first direction, and has a potential that is relatively different from a potential of the first die pad; a first semiconductor element that is mounted on the first die pad and forms a first circuit together with the first die pad; a second semiconductor element that is mounted on the second die pad and forms a second circuit together with the second die pad; an insulating element that is mounted on one of the first die pad and the second die pad, relays transmission and reception of signals between the first circuit and the second circuit, and insulates the first circuit and the second circuit from each other; a plurality of first terminals that includes a portion located on the one side of the first direction with respect to the first die pad and is arranged along a second direction orthogonal to both the thickness direction and the first direction, at least one of the plurality of first terminals conducting to the first circuit; a plurality of second terminals that includes a portion located on the other side of the first direction with respect to the second die pad and is arranged along the second direction, at least one of the plurality of second terminals conducting to the second circuit; and a sealing resin that covers the first die pad, the second die pad, the first semiconductor element, the second semiconductor element, the insulating element, and a portion of each of the plurality of first terminals and the plurality of second terminals, and insulates the first die pad and the second die pad from each other, wherein the sealing resin has a top surface facing a side where the first semiconductor element is located with respect to the first die pad in the thickness direction, a bottom surface facing an opposite side to the top surface in the thickness direction, and a first side surface located on the one side of the first direction and connected to the top surface and the bottom surface, wherein the first side surface includes a first region connected to the top surface, a second region connected to the bottom surface, and a third region connected to the first region and the second region, the plurality of first terminals being exposed to the third region, and wherein a surface roughness of each of the top surface, the bottom surface, the first region, and the second region is larger than a surface roughness of the third region.

Other features and advantages of the present disclosure will become more apparent with the detailed description given below based on the accompanying drawings.

DETAILED DESCRIPTION

Embodiments for carrying out the present disclosure will be described with reference to the accompanying drawings.

First Embodiment

Figure 1:
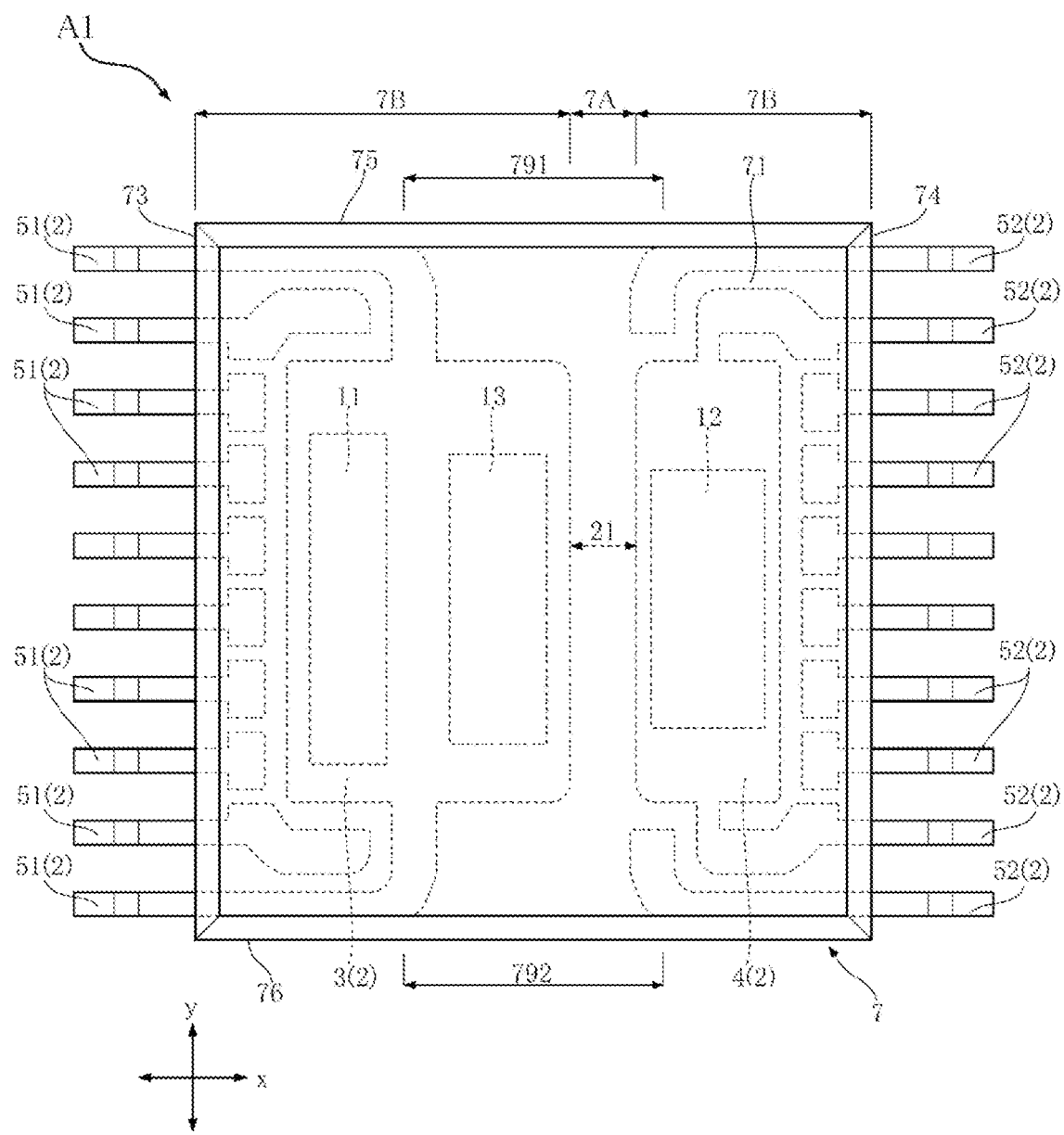
FIG. 1 is a plan view of a semiconductor device according to a first embodiment of the present disclosure.
Figure 2:
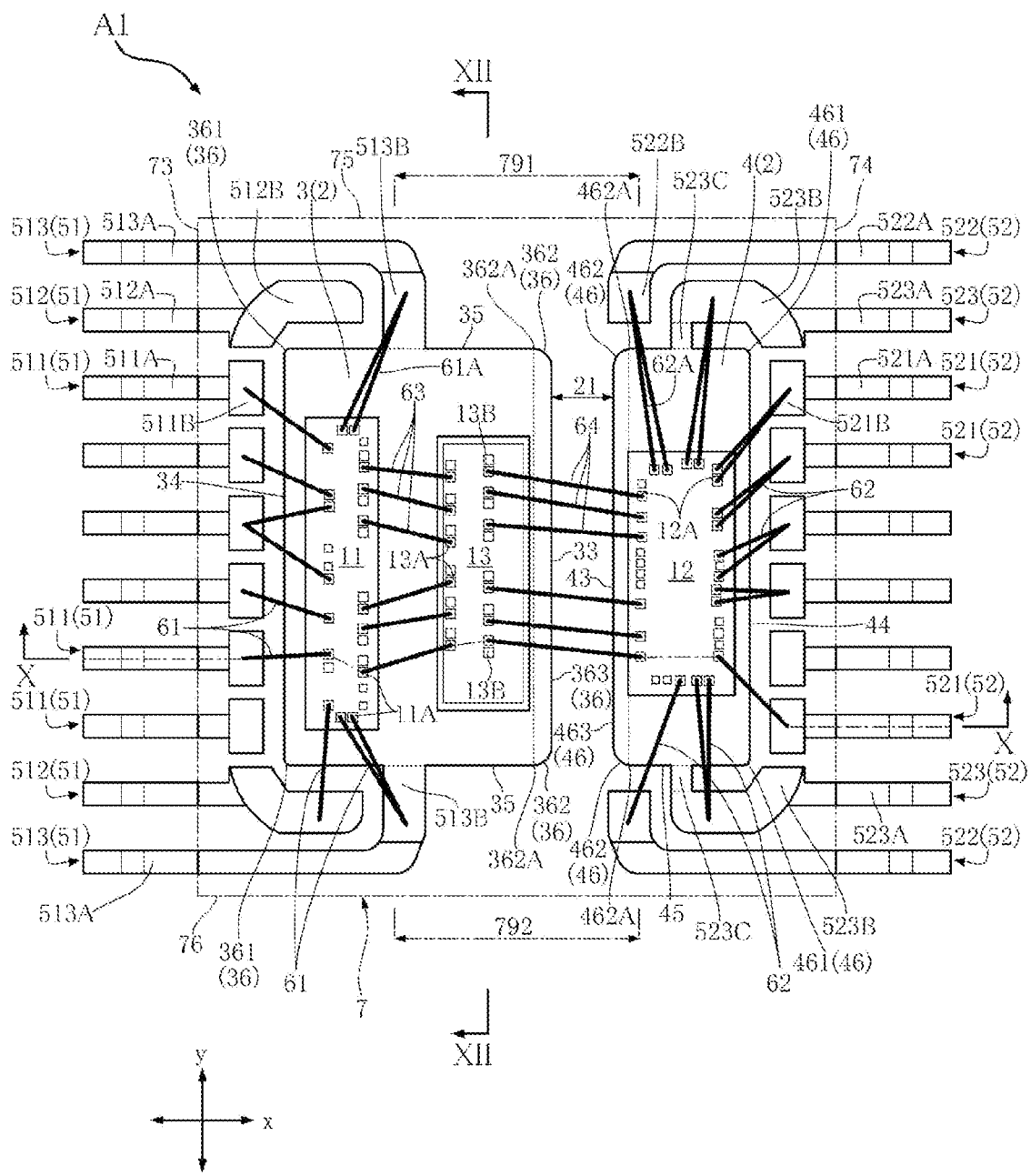
FIG. 2 is a plan view that corresponds to FIG. 1 and is transparent to a sealing resin.

A semiconductor device A1 according to a first embodiment of the present disclosure will be described with reference to FIGS. 1 to 14. The semiconductor device A1 includes a first semiconductor element 11, a second semiconductor element 12, an insulating element 13, a conductive support member 2, a plurality of first wires 61, a plurality of second wires 62, a plurality of third wires 63, a plurality of fourth wires 64, and a sealing resin 7. Among these, the conductive support member 2 includes a first die pad 3, a second die pad 4, a plurality of first terminals 51, and a plurality of second terminals 52. The semiconductor device A1 is surface-mounted on a wiring board of an inverter device of an electric vehicle, a hybrid vehicle, or the like. A package format of the semiconductor device A1 is SOP (Small Outline Package). However, the package format of the semiconductor device A1 is not limited to SOP. Here, for convenience of understanding, FIG. 2 is transparent to the sealing resin 7. In FIG. 2, the sealing resin 7 to which FIG. 2 is transparent is shown by an imaginary line (two-dot chain line).

In the description of the semiconductor device A1, a thickness direction of each of the first die pad 3 and the second die pad 4 is referred to as a "z direction (thickness direction)." A direction orthogonal to the z direction is referred to as an "x direction (first direction)." A direction orthogonal to both the z direction and the x direction is referred to as a "y direction (second direction)." Further, a "plan view" refers to a viewpoint along the z direction.

The first semiconductor element 11, the second semiconductor element 12, and the insulating element 13 are elements that serve as functional centers of the semiconductor device A1. As shown in FIG. 2, in the semiconductor device A1, all of the first semiconductor element 11, the second semiconductor element 12, and the insulating element 13 are configured as individual elements. In a plan view, each of the first semiconductor element 11, the second semiconductor element 12, and the insulating element 13 has a rectangular shape having a long side in the y direction.

The first semiconductor element 11 includes a circuit that converts a control signal input from an ECU or the like into a PWM control signal, a transmitting circuit for transmitting the PWM control signal to the second semiconductor element 12, and a receiving circuit that receives an electric signal from the second semiconductor element 12.

The second semiconductor element 12 includes a receiving circuit that receives the PWM control signal, a circuit (gate driver) that performs a switching operation of a switching element (for example, an IGBT, a MOSFET, etc.) based on the PWM control signal, and a transmitting circuit for transmitting the electric signal to the first semiconductor element 11. An example of the electric signal may include an output signal from a temperature sensor installed near a motor.

The insulating element 13 is an element for transmitting the PWM control signal and other electric signals in an insulated state. The insulating element 13 is, for example, of an inductive type. The inductive type insulating element is, for example, an insulated transformer and transmits an electric signal in an insulated state by inductively coupling two inductors (coils). The insulating element 13 has a substrate formed of Si. An inductor formed of Cu is formed on the substrate. The inductor includes a transmitting side inductor and a receiving side inductor which are laminated with each other in the thickness direction (z direction) of the insulating element 13. A dielectric layer formed of $SiO_2$ or the like is interposed between the transmitting side inductor and the receiving side inductor. The transmitting side inductor and the receiving side inductor are electrically isolated from each other by the dielectric layer. In the semiconductor device A1, the insulating element 13 shows a case where it is of an inductive type, but it may be of a capacitive type. The capacitive type insulating element 13 is, for example, a capacitor. Further, the insulating element 13 may be a photocoupler.

In the semiconductor device A1, the second semiconductor element 12 requires a higher voltage than the first semiconductor element 11. Therefore, a significant potential difference is generated between the first semiconductor element 11 and the second semiconductor element 12. Therefore, in the semiconductor device A1, a first circuit including the first semiconductor element 11 and a second circuit including the second semiconductor element 12 are insulated by the insulating element 13. That is, the insulating element 13 insulates the first circuit including the first semiconductor element 11 having a relatively low voltage and the second circuit including the second semiconductor element 12 having a relatively high voltage. For example, in an inverter device of an electric vehicle or a hybrid vehicle, a power supply voltage required for the first semiconductor element 11 is about 5 V, whereas a power supply voltage required for the second semiconductor element 12 is 600 V or more.

Figure 10:
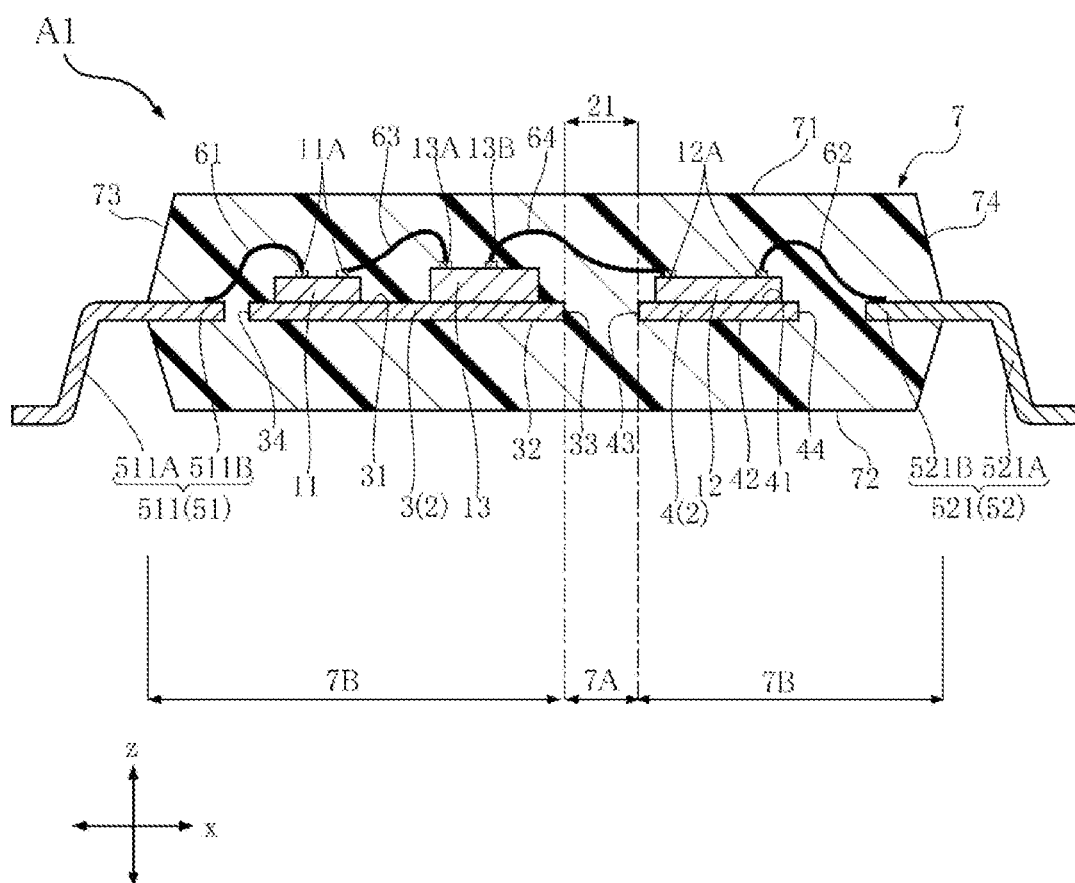
FIG. 10 is a cross-sectional view taken along line X-X of FIG. 2.

As shown in FIGS. 2 and 10, the insulating element 13 is located between the first semiconductor element 11 and the second semiconductor element 12 in the x direction. The first semiconductor element 11 and the insulating element 13 are mounted on a portion (the first die pad 3 to be described later) of the conductive support member 2. The second semiconductor element 12 is mounted on a portion (the second die pad 4 to be described later) of the conductive support member 2. A plurality of electrodes 11A is provided on an upper surface (a surface facing the z direction) of the first semiconductor element 11. The plurality of electrodes 11A conducts to a circuit configured in the first semiconductor element 11. Similarly, a plurality of electrodes 12A is provided on an upper surface (a surface facing the z direction) of the second semiconductor element 12. The plurality of electrodes 12A conducts to a circuit configured in the second semiconductor element 12. A plurality of first electrodes 13A and a plurality of second electrodes 13B are provided on an upper surface (a surface facing the z direction) of the insulating element 13. Each of the plurality of first electrodes 13A and the plurality of second electrodes 13B conducts to either the transmitting side inductor or the receiving side inductor.

Figure 13:
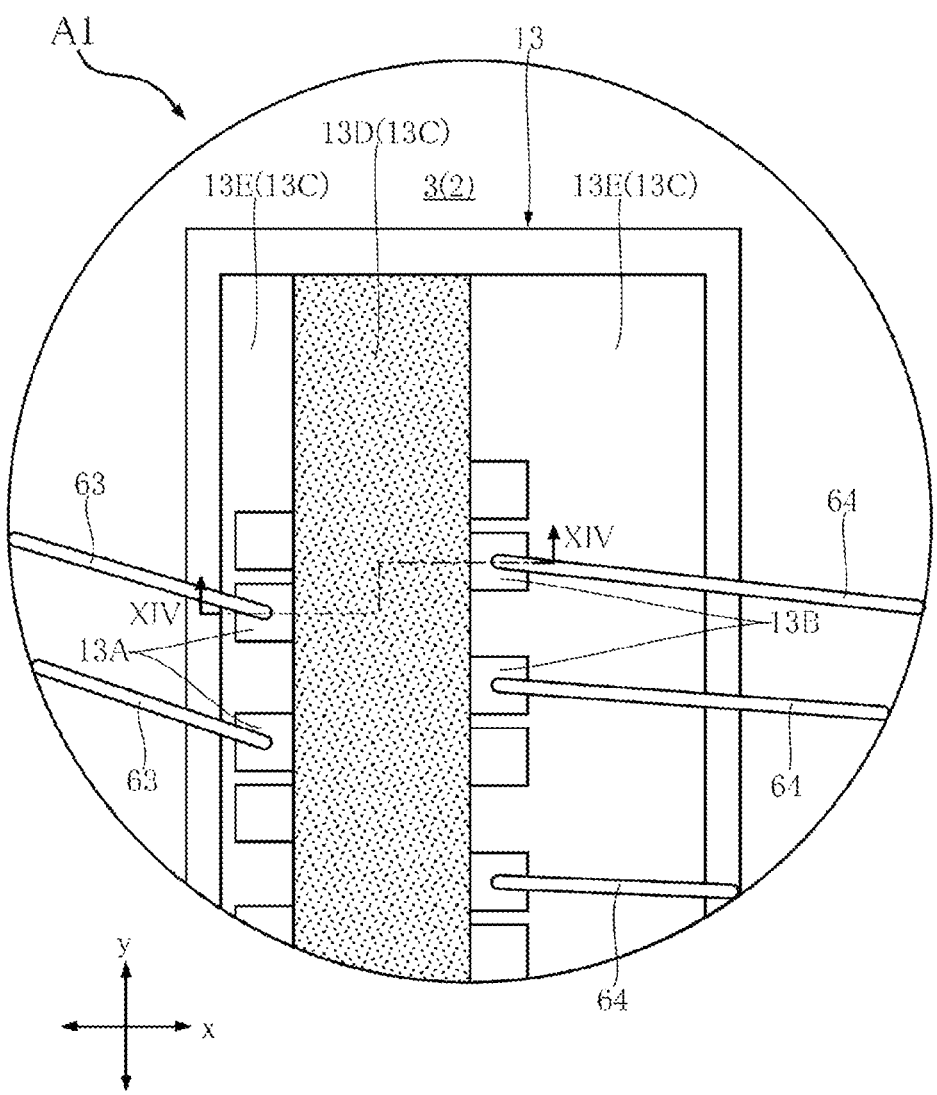
FIG. 13 is a partially-enlarged view of FIG. 2.
Figure 14:
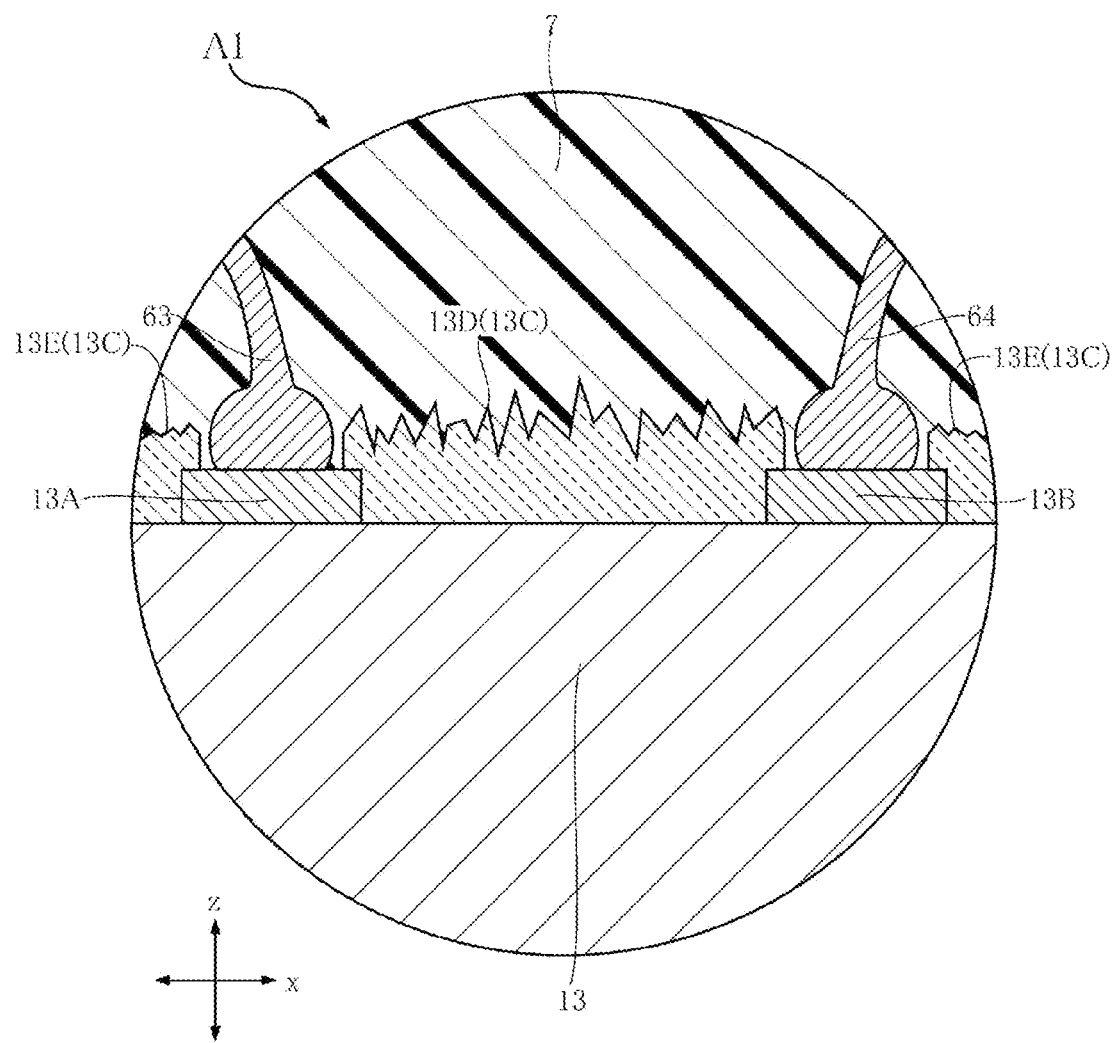
FIG. 14 is a cross-sectional view taken along line XIV-XIV of FIG. 13.

As shown in FIG. 13, in the insulating element 13, the plurality of first electrodes 13A are arranged along the y direction. Similarly, the plurality of second electrodes 13B are also arranged along the y direction. The insulating element 13 has a passivation film 13C. The passivation film 13C is formed of, for example, a material containing polyimide. The passivation film 13C is located on the upper surface of the insulating element 13. Each of the plurality of first electrodes 13A and the plurality of second electrodes 13B is exposed from the passivation film 13C. The passivation film 13C includes a first film 13D and a second film 13E. The first film 13D is located between the plurality of first electrodes 13A and the plurality of second electrodes 13B in the x direction. The second film 13E is a portion obtained by removing the first film 13D from the passivation film 13C. As shown in FIG. 14, a surface roughness of the first film 13D is larger than a surface roughness of the second film 13E. This makes it possible to increase a creepage distance from each of the plurality of first electrodes 13A to any of the plurality of second electrodes 13B located closest to the first electrode 13A. This contributes to improvement of an insulation withstand voltage of the insulating element 13.

In the semiconductor device A1, the conductive support member 2 is a member that constitutes a conduction path between the first semiconductor element 11, the second semiconductor element 12, and the insulating element 13 and the wiring board of the inverter device. The conductive support member 2 is formed of, for example, an alloy containing Cu in its composition. The conductive support member 2 is formed from a lead frame 81 which will be described later. The conductive support member 2 mounts the first semiconductor element 11, the second semiconductor element 12, and the insulating element 13. As shown in FIG. 1, the conductive support member 2 includes the first die pad 3, the second die pad 4, the plurality of first terminals 51, and the plurality of second terminals 52. As shown in FIG. 2, the first die pad 3 is disposed on one side in the x direction. The second die pad 4 is disposed on the other side in the x direction with respect to the first die pad 3 and is located away from the first die pad 3 in the x direction. Therefore, a pad gap 21 is provided between the first die pad 3 and the second die pad 4 in the x direction. In a plan view, the pad gap 21 extends along the y direction.

As shown in FIGS. 2 and 10, the first semiconductor element 11 and the insulating element 13 are mounted on the first die pad 3. The first die pad 3 conducts with the first semiconductor element 11 and is an element of the above-mentioned first circuit. The first die pad 3 has substantially a rectangular shape in a plan view. A thickness (dimension in the z direction) of the first die pad 3 is, for example, 100 μm or more and 300 μm or less. The first die pad 3 has a first main surface 31, a first back surface 32, a first facing surface 33, a first end surface 34, and a pair of first side surfaces 35.

Figure 11:
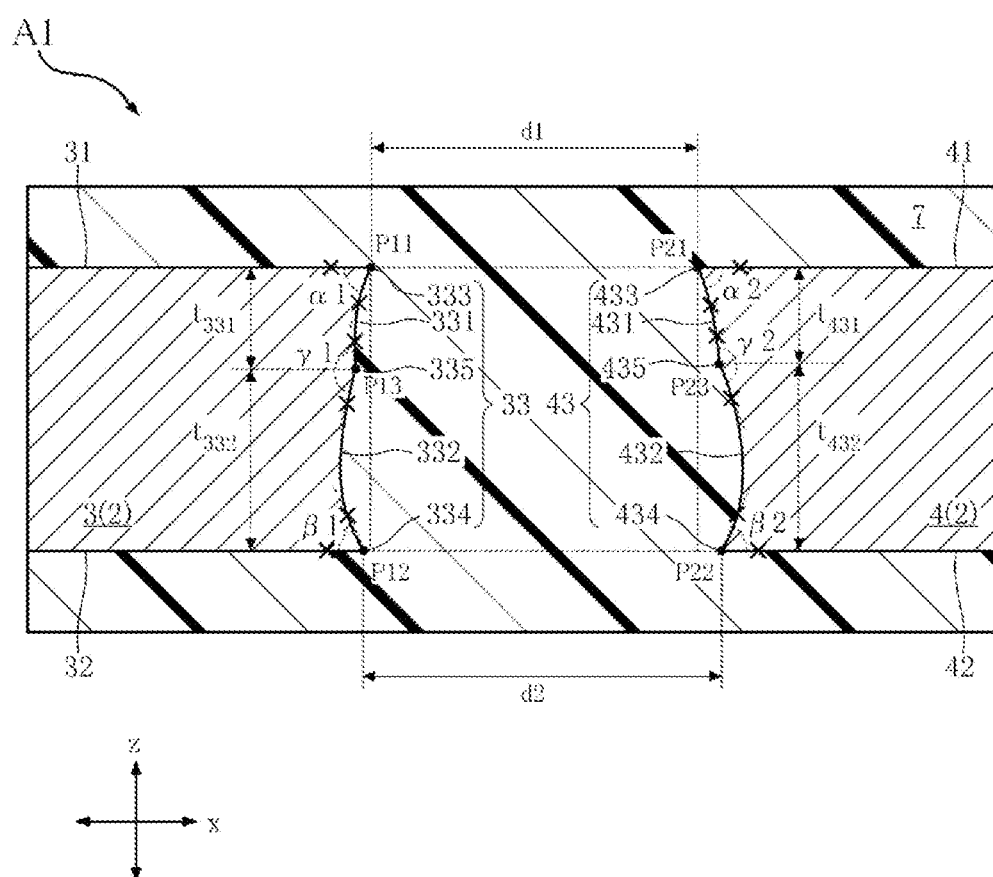
FIG. 11 is a partially-enlarged view of FIG. 10.
Figure 12:
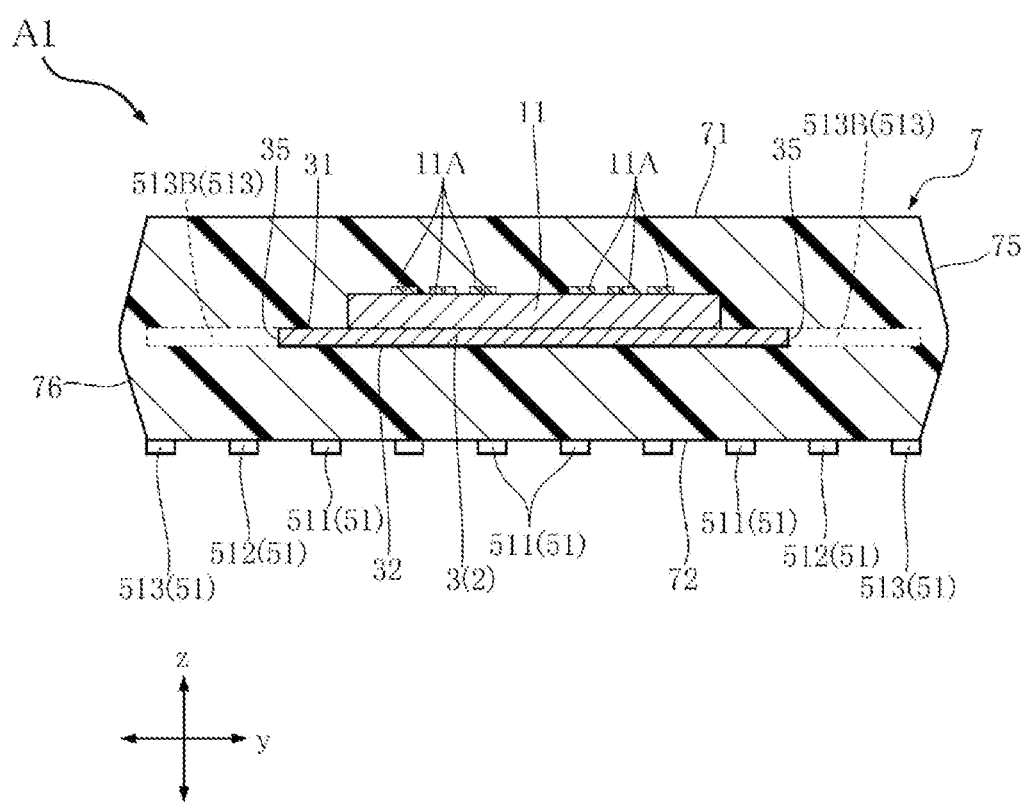
FIG. 12 is a cross-sectional view taken along line XII-XII of FIG. 2.

The first main surface 31 and the first back surface 32 are located apart from each other in the z direction, as shown in FIGS. 10 and 11. The first main surface 31 and the first back surface 32 face opposite to each other in the z direction. Each of the first main surface 31 and the first back surface 32 is substantially flat. A distance in the z direction between the first main surface 31 and the first back surface 32 is, for example, 100 μm or more and 300 μm or less. The first semiconductor element 11 and the insulating element 13 are bonded to the first main surface 31 by a conductive bonding material (solder, metal paste, sintered metal, and the like) (not shown).

Each of the first facing surface 33, the first end surface 34, and the pair of first side surfaces 35 is connected to the first main surface 31 and the first back surface 32, and is sandwiched between the first main surface 31 and the first back surface 32 in the z direction. As shown in FIGS. 2, 10, and 11, the first facing surface 33 faces the second die pad 4 in the x direction. The first facing surface 33 includes a first main surface side recess 331, a first back surface side recess 332, a first main surface side protrusion 333, a first back surface side protrusion 334, and a first intermediate protrusion 335.

As shown in FIG. 11, the first main surface side recess 331 is a portion connected to the first main surface 31 and the first back surface side recess 332. When viewed along the y direction, the first main surface side recess 331 is recessed and curved inward of the first die pad 3.

As shown in FIG. 11, the first back surface side recess 332 is a portion connected to the first back surface 32 and the first main surface side recess 331. When viewed along the y direction, the first back surface side recess 332 is recessed and curved inward of the first die pad 3. As a result, the first facing surface 33 is configured to include two recesses (the first main surface side recess 331 and the first back surface side recess 332) arranged in the z direction. As shown in FIG. 11, a dimension t332 of the first back surface side recess 332 in the z direction is larger than a dimension t331 of the first main surface side recess 331 in the z direction. A ratio of the dimension t332 to the dimension t331 (t332/t331) is 1 or more and 2 or less.

As shown in FIG. 11, the first main surface side protrusion 333 is a portion formed by the first main surface 31 and the first main surface side recess 331. When viewed along the y direction, an angle α1 of the first main surface side protrusion 333 is, for example, 70 degrees or more and 80 degrees or less. As shown in FIG. 11, when a tip end of the first main surface side protrusion 333 viewed along the y direction is set as an apex P11, the angle α1 is an angle determined by the apex P11 and two half straight lines extending from the apex P11. When viewed along the y direction, one of the two half straight lines passes through a point which is located on the first main surface 31, and is separated by a straight line distance of 20 μm or more and 40 μm or less (standard 30 μm) from the apex P11. When viewed along the y direction, the other of the two half straight lines passes through a point which is located on the first main surface side recess 331, and is separated by a straight line distance of 20 μm or more and 40 μm or less (standard 30 μm) from the apex P11. For convenience of understanding, in FIG. 11, the apex P11 is indicated by a black circle, and each point through which the two half straight lines pass is indicated by an 'x' mark.

As shown in FIG. 11, the first back surface side protrusion 334 is a portion formed by the first back surface 32 and the first back surface side recess 332. When viewed along the y direction, an angle β1 of the first back surface side protrusion 334 is smaller than the above-mentioned angle α1. The angle β1 is, for example, 60 degrees or more and 80 degrees or less. As shown in FIG. 11, when a tip end of the first back surface side protrusion 334 viewed along the y direction is set as an apex P12, the angle β1 is an angle determined by the apex P12 and two half straight lines extending from the apex P12. When viewed along the y direction, one of the two half straight lines passes through a point which is located on the first back surface 32, and is separated by a straight line distance of 20 μm or more and 40 μm or less (standard 30 μm) from the apex P12. When viewed along the y direction, the other of the two half straight lines passes through a point which is located on the first back surface side recess 332, and is separated by a straight line distance of 20 μm or more and 40 μm or less (standard 30 μm) from the apex P12. For convenience of understanding, in FIG. 11, the apex P12 is indicated by a black circle, and each point through which the two half lines pass is indicated by an 'x' mark.

As shown in FIG. 11, the first intermediate protrusion 335 is a portion formed by the first main surface side recess 331 and the first back surface side recess 332. When viewed along the y direction, an angle γ1 of the first intermediate protrusion 335 is equal to or larger than a sum (α1+β1) of the above-mentioned angle α1 and the above-mentioned angle β1. The angle γ1 is, for example, 160 degrees or more and 180 degrees or less. As shown in FIG. 11, when a tip end of the first intermediate protrusion 335 viewed along the y direction is set as an apex P13, the angle γ1 is an angle determined by the apex P13 and two half straight lines extending from the apex P13. When viewed along the y direction, one of the two half straight lines passes through a point which is located on the first main surface side recess 331, and is separated by a straight line distance of 20 μm or more and 40 μm or less (standard 30 μm) from the apex P13. When viewed along the y direction, the other of the two half straight lines passes through a point which is located on the first back surface side recess 332, and is separated by a straight line distance of 20 μm or more and 40 μm or less (standard 30 μm) from the apex P13. For convenience of understanding, in FIG. 11, the apex P13 is indicated by a black circle, and each point through which the two half lines pass is indicated by an 'x' mark.

In the example shown in FIG. 11, among the first main surface side protrusion 333, the first back surface side protrusion 334, and the first intermediate protrusion 335, the first main surface side protrusion 333 is closest to the second die pad 4 in the x direction. Therefore, in the x direction, the first main surface side protrusion 333 is located closer to the second die pad 4 than the first back surface side protrusion 334 and the first intermediate protrusion 335. Further, the first intermediate protrusion 335 is located at a position farther from the second die pad 4 than each of the first main surface side protrusion 333 and the first back surface side protrusion 334 in the x direction. Unlike the example shown in FIG. 11, the first intermediate protrusion 335 may be located at a position farther from the second die pad 4 than the first main surface side protrusion 333 in the x direction and may be located closer to the second die pad 4 than the first back surface side protrusion 334 in the x direction.

As shown in FIG. 2, the first end surface 34 is located away from the first facing surface 33 in the x direction. The first end surface 34 faces a side opposite to the first facing surface 33 in the x direction. The first end surface 34 is, for example, substantially flat. The first end surface 34 may include two recesses arranged in the z direction, similarly to the first facing surface 33.

As shown in FIG. 2, the paired first side surfaces 35 are located apart from each other in the y direction. The paired first side surfaces 35 face opposite to each other in the y direction. Each of the paired first side surfaces 35 is, for example, substantially flat. In addition, each of the paired first side surfaces 35 may include two recesses arranged in the z direction, similarly to the first facing surface 33. Each of the paired first side surfaces 35 extends along the x direction in a plan view.

Figure 3:
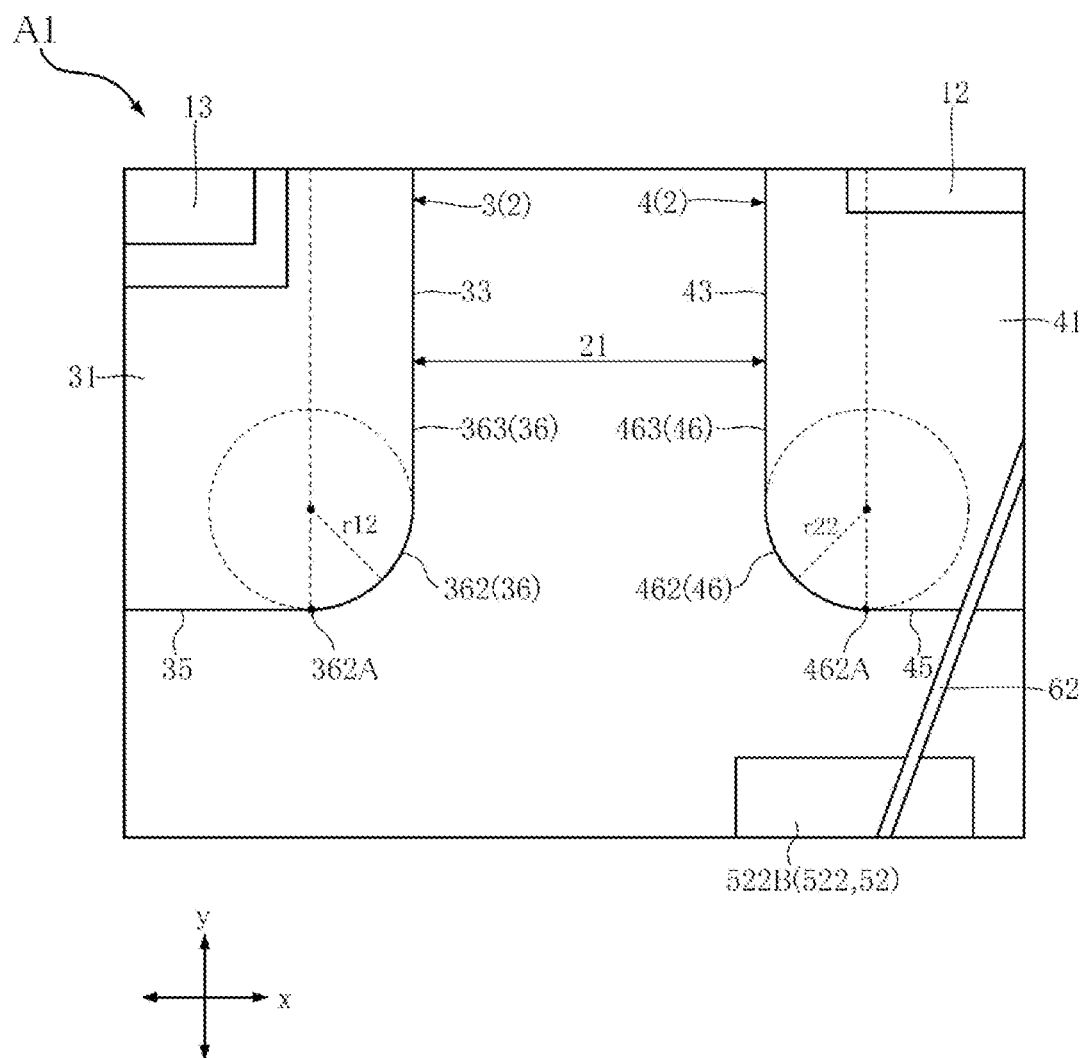
FIG. 3 is a partially-enlarged view of FIG. 2.
Figure 4:
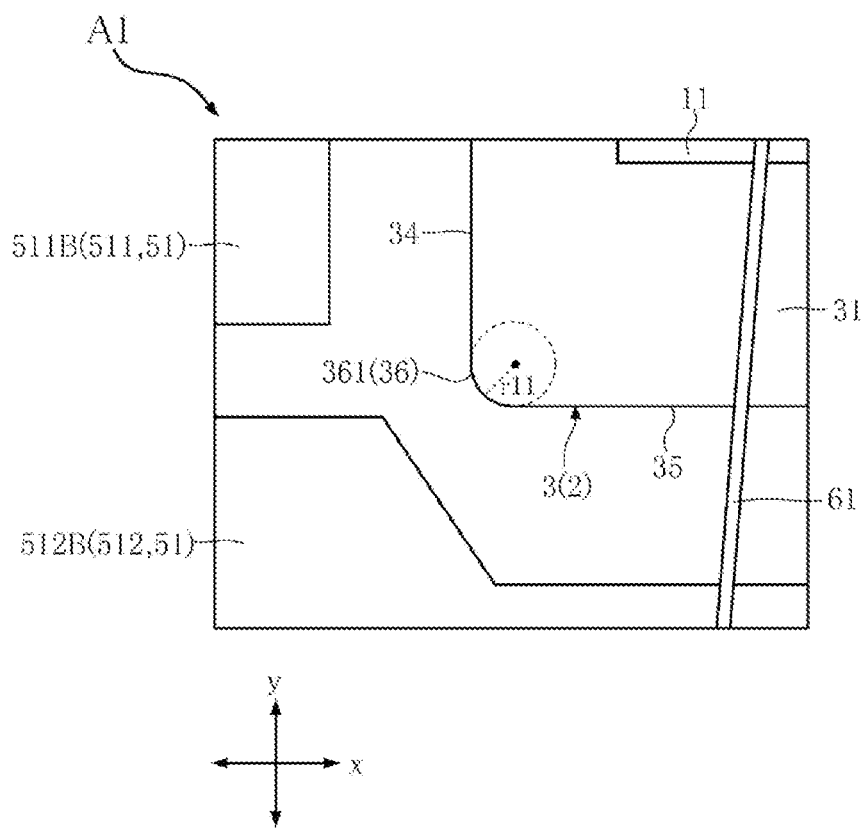
FIG. 4 is a partially-enlarged view of FIG. 2.

As shown in FIGS. 2, 3, and 4, a peripheral edge 36 of the first main surface 31 includes a pair of first far-angle portions 361, a pair of first near-angle portions 362, and a first near-end edge 363.

As shown in FIG. 2, the paired first far-angle portions 361 correspond to two corners, which are located farthest from the second die pad 4 in the x direction, among four corners of the first die pad 3 in a plan view. In a plan view, each of the paired first far-angle portions 361 is a portion formed by the first end surface 34 and one of the paired first side surfaces 35. In a plan view, each of the paired first far-angle portions 361 is a curved line and is composed of, for example, a single curve. The single curve is an arc with a constant radius of curvature. In a plan view, the radius of curvature r11 of each of the paired first far-angle portions 361 is, for example, 20 µm or more and 80 µm or less. In a plan view, each of the paired first far-angle portions 361 may be formed at substantially a right angle instead of the curved line. Further, the radius of curvature r11 may be appropriately changed depending on a size of the first die pad 3 in a plan view.

As shown in FIG. 2, the paired first near-angle portions 362 correspond to two corners, which are located closest to the second die pad 4 in the x direction, among the four corners of the first die pad 3 in a plan view. The paired first near-angle portions 362 individually include a pair of first end portions 362A. In a plan view, each of the paired first near-angle portions 362 goes away from the second die pad 4 in the x direction toward the first end portion 362A in the y direction. Therefore, in each of the paired first near-angle portions 362, the first end portion 362A is located farthest from the second die pad 4 in the x direction. As shown in FIG. 3, each of the paired first near-angle portions 362 is a curved line and is composed of, for example, a single curve. In a plan view, a radius of curvature r12 of each of the paired first near-angle portions 362 is larger than the radius of curvature r11 of each of the paired first far-angle portions 361. In a plan view, the radius of curvature r12 of each of the paired first near-angle portions 362 is, for example, 60 µm or more and 240 µm or less (preferably 120 µm). The radius of curvature r12 may be appropriately changed depending on the size of the first die pad 3 in a plan view. In the semiconductor device A1, the paired first near-angle portions 362 are intentionally formed.

As shown in FIGS. 2 and 3, in a plan view, a line segment connecting the paired first end portions 362A is located closer to the second die pad 4 than the insulating element 13 in the x direction. In addition, the line segment may overlap the insulating element 13 in a plan view.

As shown in FIG. 2, the first near-end edge 363 is located closest to the second die pad 4 among the peripheral edge 36 of the first main surface 31. The first near-end edge 363 extends along the y direction. The first near-end edge 363 is connected to the paired first near-angle portions 362 at both ends of the first near-end edge 363 in the y direction. The first near-end edge 363 is an element included in the above-described first main surface side protrusion 333. The first near-end edge 363 may be formed with a section recessed inward of the first die pad 3 in the x direction.

As shown in FIGS. 2 and 3, in a plan view, the first die pad 3 includes a portion protruding from the insulating element 13 toward the second die pad 4. A dimension of this portion in the x direction is 0.3 times or more and 3 times or less (preferably 1 times) than a dimension of the insulating element 13 in the z direction.

In the semiconductor device A1, an example is shown in which each of the paired first far-angle portions 361 and the paired first near-angle portions 362 is composed of a single curve in a plan view, but the present disclosure is not limited thereto. For example, unlike the example shown in these figures, it may include a portion composed of a single curve and a portion composed of a transition curve. The transition curve is a curve in which a curvature gradually decreases, and is a curve that smoothly connects a simple curve and a straight line. In addition, it may be composed of a composite curve. The composite curve is a curve composed of two or more arcs that bend in the same direction and have different radii, and the arcs are appropriately connected by a common tangent line or a sliding curve.

As shown in FIGS. 2 and 10, the second semiconductor element 12 is mounted on the second die pad 4. The second die pad 4 conducts with the second semiconductor element 12 and is an element of the above-mentioned second circuit. The second die pad 4 has substantially a rectangular shape in a plan view. The first die pad 3 and the second die pad 4 are arranged in the x direction while being separated from each other. In the example shown in FIG. 2, the second die pad 4 is arranged, for example, on the x direction side of the first die pad 3. The first die pad 3 and the second die pad 4 are galvanically insulated. A thickness (dimension in the z direction) of the second die pad 4 is, for example, 100 µm or more and 300 µm or less. The second die pad 4 has a second main surface 41, a second back surface 42, a second facing surface 43, a second end surface 44, and a pair of second side surfaces 45.

The second main surface 41 and the second back surface 42 are located apart from each other in the z direction, as shown in FIGS. 10 and 11. The second main surface 41 and the second back surface 42 face opposite to each other in the z direction. Each of the second main surface 41 and the second back surface 42 is substantially flat. A distance in the z direction between the second main surface 41 and the second back surface 42 is, for example, 100 µm or more and 300 µm or less. Further, each of the thickness of the first die pad 3 and the thickness of the second die pad 4 is 0.2 times or more and 1.2 times or less than a length of the pad gap 21. The second semiconductor element 12 is bonded to the second main surface 41 by a conductive bonding material (for example, solder, metal paste, sintered metal, and the like) (not shown).

Each of the second facing surface 43, the second end surface 44, and the pair of second side surfaces 45 is connected to the second main surface 41 and the second back surface 42, and is sandwiched between the second main surface 41 and the second back surface 42 in the z direction. As shown in FIGS. 2, 10, and 11, the second facing surface 43 faces the first facing surface 33 of the first die pad 3. The second facing surface 43 includes a second main surface side recess 431, a second back surface side recess 432, a second main surface side protrusion 433, a second back surface side protrusion 434, and a second intermediate protrusion 435.

As shown in FIG. 11, the second main surface side recess 431 is a portion connected to the second main surface 41 and the second back surface side recess 432. When viewed along the y direction, the second main surface side recess 431 is recessed and curved inward of the second die pad 4.

As shown in FIG. 11, the second back surface side recess 432 is a portion connected to the second back surface 42 and the second main surface side recess 431. When viewed along the y direction, the second back surface side recess 432 is recessed and curved inward of the second die pad 4. As a result, the second facing surface 43 is configured to include two recesses (the second main surface side recess 431 and the second back surface side recess 432) arranged in the z direction. As shown in FIG. 11, a dimension t432 of the second back surface side recess 432 in the z direction is larger than a dimension t431 of the second main surface side recess 431 in the z direction. A ratio of the dimension t432 to the dimension t431 (t432/t431) is 1 or more and 2 or less.

As shown in FIG. 11, the second main surface side protrusion 433 is a portion formed by the second main surface 41 and the second main surface side recess 431. When viewed along the y direction, an angle α2 of the second main surface side protrusion 433 is, for example, 70 degrees or more and 80 degrees or less. As shown in FIG. 11, when a tip end of the second main surface side protrusion 433 viewed along the y direction is set as an apex P21, the angle α2 is an angle determined by the apex P21 and two half straight lines extending from the apex P21. When viewed along the y direction, one of the two half straight lines passes through a point which is located on the second main surface 41, and is separated by a straight line distance of 20 µm or more and 40 µm or less (standard 30 µm) from the apex P21. When viewed along the y direction, the other of the two half straight lines passes through a point which is located on the second main surface side recess 431, and is separated by a straight line distance of 20 µm or more and 40 µm or less (standard 30 µm) from the apex P21. For convenience of understanding, in FIG. 11, the apex P21 is indicated by a black circle, and each point through which the two half straight lines pass is indicated by an 'x' mark.

As shown in FIG. 11, the second back surface side protrusion 434 is a portion formed by the second back surface 42 and the second back surface side recess 432. When viewed along the y direction, an angle β2 of the second back surface side protrusion 434 is smaller than the above-mentioned angle α2. The angle β2 is, for example, 60 degrees or more and 80 degrees or less. As shown in FIG. 11, when a tip end of the second back surface side protrusion 434 viewed along the y direction is set as an apex P22, the angle β2 is an angle determined by the apex P22 and two half straight lines extending from the apex P22. When viewed along the y direction, one of the two half straight lines passes through a point which is located on the second back surface 42, and is separated by a straight line distance of 20 µm or more and 40 µm or less (standard 30 µm) from the apex P22. When viewed along the y direction, the other of the two half straight lines passes through a point which is located on the second back surface side recess 432, and is separated by a straight line distance of 20 µm or more and 40 µm or less (standard 30 µm) from the apex P22. For convenience of understanding, in FIG. 11, the apex P22 is indicated by a black circle, and each point through which the two half straight lines pass is indicated by an 'x' mark.

As shown in FIG. 11, the second intermediate protrusion 435 is a portion formed by the second main surface side recess 431 and the second back surface side recess 432. When viewed along the y direction, an angle γ2 of the second intermediate protrusion 435 is equal to or larger than the sum (α2+β2) of the above-mentioned angle α2 and the above-mentioned angle β2, for example, 160 degrees or more and 180 degrees or less. As shown in FIG. 11, when a tip end of the second intermediate protrusion 435 viewed along the y direction is set as an apex P23, the angle γ2 is an angle determined by the apex P23 and two half straight lines extending from the apex P23. When viewed along the y direction, one of the two half straight lines passes through a point which is located on the second main surface side recess 431, and is separated by a straight line distance of 20 µm or more and 40 µm or less (standard 30 µm) from the apex P23. When viewed along the y direction, the other of the two half straight lines passes through a point which is located on the second back surface side recess 432, and is separated by a straight line distance of 20 µm or more and 40 µm or less (standard 30 µm) from the apex P23. For convenience of understanding, in FIG. 11, the apex P23 is indicated by a black circle, and each point through which the two half straight lines pass is indicated by an 'x' mark.

In the example shown in FIG. 11, among the second main surface side protrusion 433, the second back surface side protrusion 434, and the second intermediate protrusion 435, the second main surface side protrusion 433 is located closest to the first die pad 3 in the x direction. Therefore, in the x direction, the second main surface side protrusion 433 is located closer to the first die pad 3 than the second back surface side protrusion 434 and the second intermediate protrusion 435. Further, the second intermediate protrusion 435 is located at a position farther from the first die pad 3 than the second main surface side protrusion 433 in the x direction, and is located at a position closer to the first die pad 3 than the second back surface side protrusion 434 in the x direction. Unlike the example shown in FIG. 11, the second intermediate protrusion 435 may be located at a position farther from the first die pad 3 than each of the second main surface side protrusion 433 and the second back surface side protrusion 434 in the x direction.

As shown in FIG. 11, when viewed along the y direction, a separation distance d2 between the first back surface 32 and the second back surface 42 is larger than a separation distance d1 between the first main surface 31 and the second main surface 41. Here, the separation distance d1 corresponds to a distance in the x direction between the first main surface side protrusion 333 of the first facing surface 33 and the second main surface side protrusion 433 of the second facing surface 43. The separation distance d2 corresponds to a distance in the x direction between the first back surface side protrusion 334 of the first facing surface 33 and the second back surface side protrusion 434 of the second facing surface 43. Therefore, a distance in the x direction between the first main surface side protrusion 333 and the second main surface side protrusion 433 is smaller than the distance in the x direction between the first back surface side protrusion 334 and the second back surface side protrusion 434. The separation distance d1 is 250 µm or more and 500 µm or less. The separation distance d2 is 250 µm or more and 500 µm or less and is larger than the separation distance d1.

As shown in FIG. 2, the second end surface 44 is separated from the second facing surface 43 in the x direction. The second end surface 44 faces the opposite side of the first die pad 3 in the x direction and faces the x direction in the semiconductor device A1. The second end surface 44 is, for example, substantially flat. The second end surface 44 may include two recesses arranged in the z direction, similarly to the second facing surface 43.

As shown in FIG. 2, the paired second side surfaces 45 are separated from each other in the y direction. One of the paired second side surfaces 45 faces the y direction, and the other of the paired second side surfaces 45 faces the y direction. Each of the paired second side surfaces 45 is, for example, substantially flat. Each of the paired second side surfaces 45 may include two recesses arranged in the z direction, similarly to the second facing surface 43. Each of the paired second side surfaces 45 extends along the x direction in a plan view.

Figure 5:
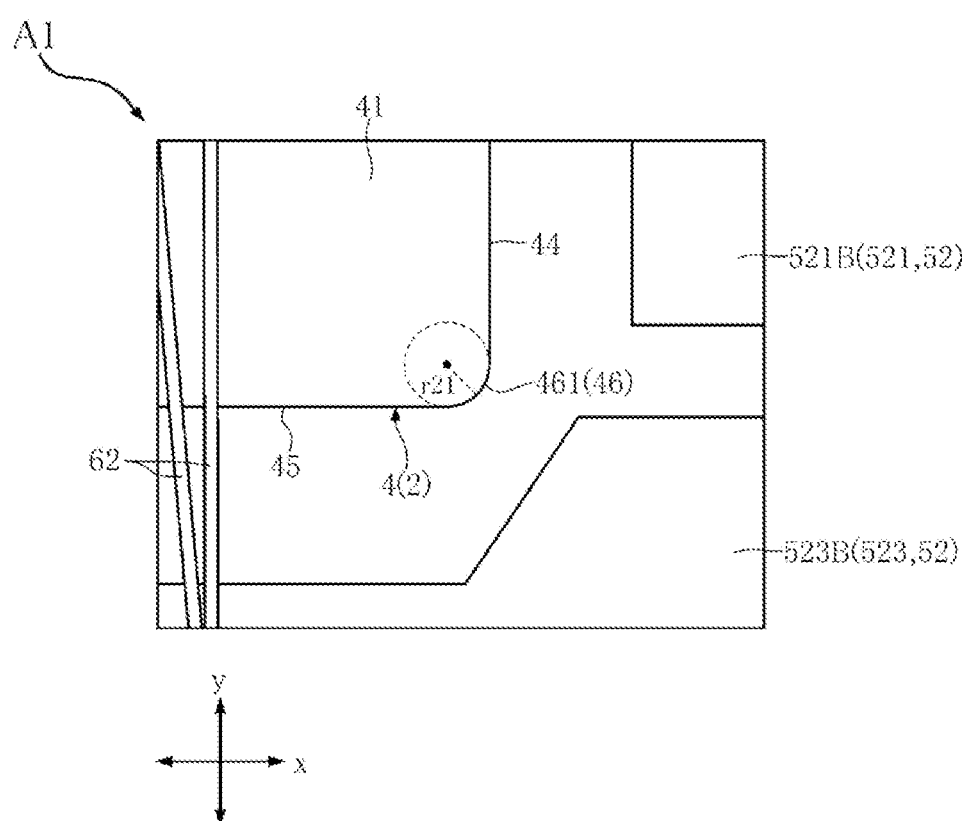
FIG. 5 is a partially-enlarged view of FIG. 2.

As shown in FIGS. 2, 3, and 5, the peripheral edge 46 of the second main surface 41 includes a pair of second far-angle portions 461, a pair of second near-angle portions 462, and a second near-end edge 463.

As shown in FIG. 2, the paired second far-angle portions 461 correspond to two corners, which are located farthest from the first die pad 3 in the x direction, among four corners of the second die pad 4 in a plan view. In a plan view, each of the paired second far-angle portions 461 is a portion formed by the second end surface 44 and one of the paired second side surfaces 45. In a plan view, each of the paired second far-angle portions 461 is a curved line and is composed of, for example, a single curve. The single curve is an arc with a constant radius of curvature. The radius of curvature r21 of each of the paired second far-angle portions 461 is, for example, 20 µm or more and 80 µm or less. In a plan view, each of the paired second far-angle portions 461 may be formed at substantially a right angle instead of the curved line. Further, the radius of curvature r21 may be appropriately changed depending on a size of the second die pad 4 in a plan view.

As shown in FIG. 2, the paired second near-angle portions 462 correspond to two corners, which are located closest to the first die pad 3 in the x direction, among the four corners of the second die pad 4 in a plan view. The paired second near-angle portions 462 individually include a pair of second end portions 462A. In a plan view, each of the paired second near-angle portions 462 goes away from the first die pad 3 in the x direction toward the second end portion 462A in the y direction. Therefore, in each of the paired second near-angle portions 462, the second end portion 462A is located farthest from the first die pad 3 in the x direction. As shown in FIG. 3, each of the paired second near-angle portions 462 is a curved line and is composed of, for example, a single curve. In a plan view, a radius of curvature r22 of each of the paired second near-angle portions 462 is larger than the radius of curvature r21 of each of the paired second far-angle portions 461. In a plan view, the radius of curvature r22 of each of the paired second near-angle portions 462 is, for example, 60 µm or more and 240 µm or less (preferably 120 µm). The radius of curvature r22 may be appropriately changed depending on the size of the second die pad 4 in a plan view. In the semiconductor device A1, the paired second near-angle portions 462 are intentionally formed.

As shown in FIGS. 2 and 3, in a plan view, a line segment connecting the paired second end portions 462A overlaps the second semiconductor element 12 in the x direction. In addition, the line segment may be located closer to the first die pad 3 than the second semiconductor element 12 in a plan view.

As shown in FIG. 2, in the peripheral edge 46 of the second main surface 41, the second near-end edge 463 is located closest to the first die pad 3. The second near-end edge 463 extends along the y direction. In a plan view, the second near-end edge 463 is substantially parallel to the first near-end edge 363. The second near-end edge 463 is connected to the paired second near-angle portions 462 at both ends of the second near-end edge 463 in the y direction. The second near-end edge 463 is an element included in the above-mentioned second main surface side protrusion 433. The second near-end edge 463 may be formed with a section recessed inward of the second die pad 4 in the x direction.

The example shown in FIGS. 2, 3, and 5 is shown in which each of the paired second far-angle portions 461 and the paired second near-angle portions 462 is composed of a single curve, but the present disclosure is not limited thereto. For example, unlike the example shown in these figures, it may include a portion composed of a single curve and a portion composed of a transition curve. In addition, it may be composed of a composite curve.

Figure 8:
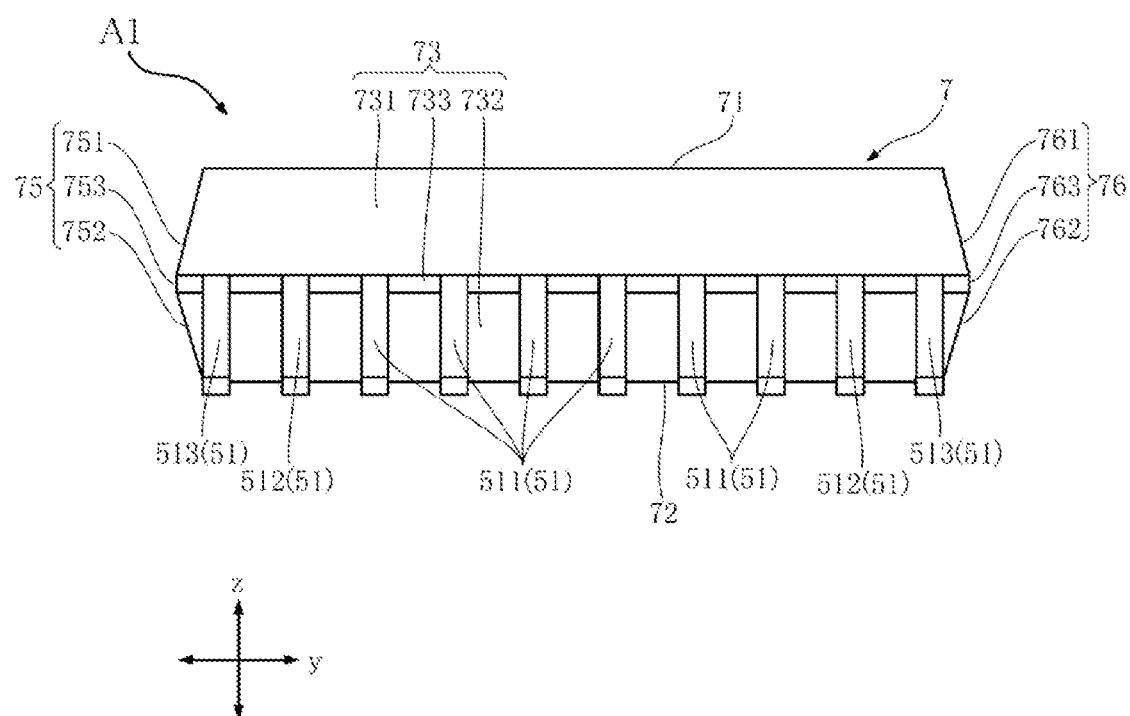
FIG. 8 is a left-hand side view of the semiconductor device shown in FIG. 1.

The plurality of first terminals 51 is a member that forms a conduction path between the semiconductor device A1 and a wiring board of an inverter device and the like by being bonded to the wiring board. At least one of the plurality of first terminals 51 is conducting to the first semiconductor element 11. The plurality of first terminals is an element of the above-mentioned first circuit. As shown in FIGS. 1, 2, and 8, the plurality of first terminals 51 is arranged along the y direction while being separated from one another. Each of the plurality of first terminals 51 extends in the x direction so as to be exposed from the sealing resin 7 (a first side surface 73 to be described later). All of the plurality of first terminals 51 are located on the x direction side of the second die pad 4. Further, all of the plurality of first terminals 51 are located on the x direction side of the first near-end edge 363 in a plan view. The plurality of first terminals 51 includes a plurality of first intermediate terminals 511, a pair of first side terminals 512, and a pair of first support terminals 513.

As shown in FIGS. 2 and 8, the plurality of first intermediate terminals 511 is arranged so as to be sandwiched between the paired first side terminals 512. As shown in FIG. 2, each of the plurality of first intermediate terminals 511 includes a lead part 511A and a pad part 511B.

Figure 6:
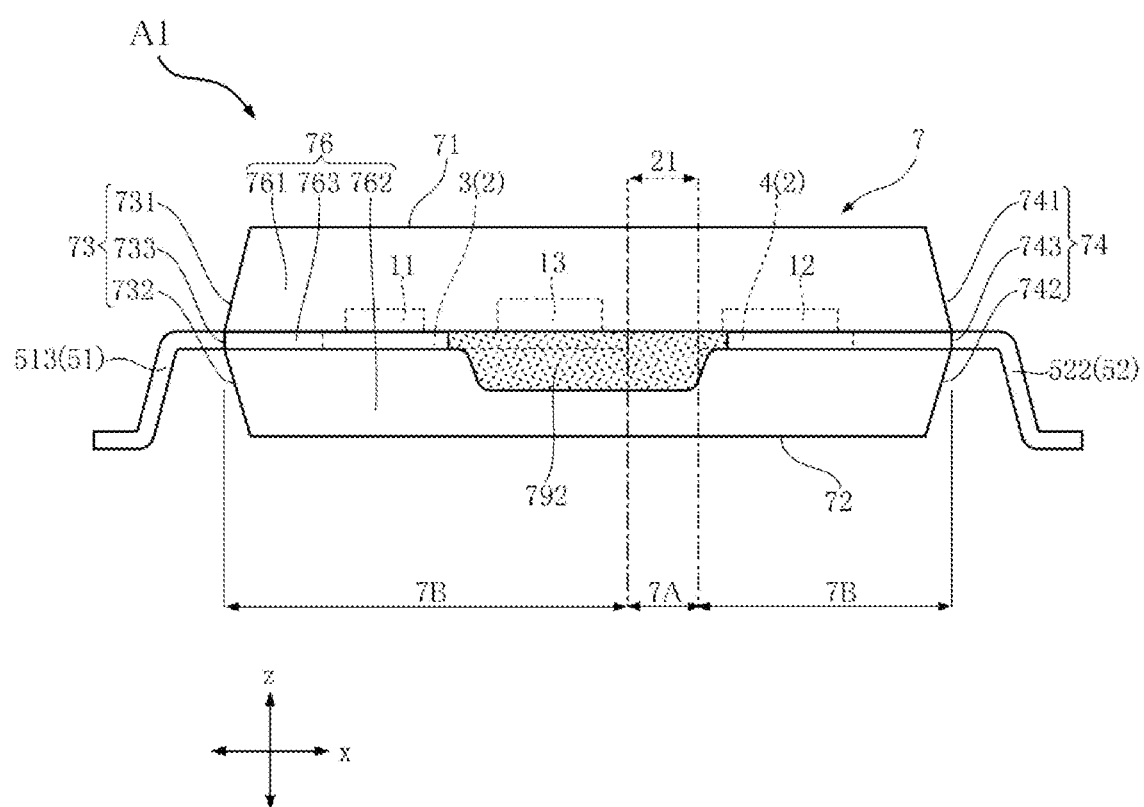
FIG. 6 is a front view of the semiconductor device shown in FIG. 1.
Figure 7:
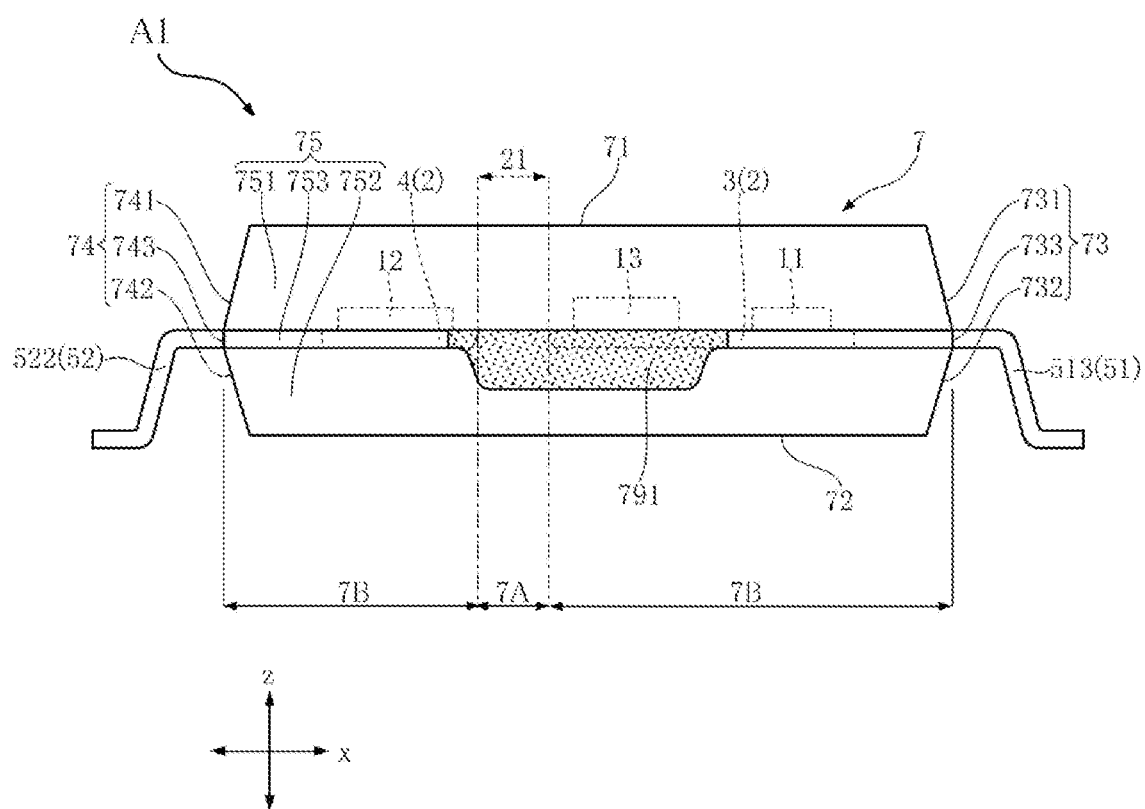
FIG. 7 is a rear view of the semiconductor device shown in FIG. 1.

The lead part 511A is an elongated rectangular portion extending along the x direction. The lead part 511A has a portion exposed from the sealing resin 7 and a portion covered with the sealing resin 7. As shown in FIGS. 6 and 7, the portion of the lead part 511A exposed from the sealing resin 7 is bent in a gull wing shape. Further, the portion of the lead part 511A exposed from the sealing resin 7 may be plated. A plating layer formed by plating is formed of an alloy containing Sn, such as solder, and covers the portion exposed from the sealing resin 7. When the semiconductor device A1 is surface-mounted on the wiring board of the inverter device by solder bonding, the plating layer prevents erosion of the exposed portion due to the solder bonding while improving adhesion of solder to the exposed portion.

The pad part 511B is a rectangular portion that is connected to the lead part 511A and is wider than the lead part 511A in the y direction. An upper surface (a surface facing the z direction) of the pad part 511B may be plated. A plating layer formed by plating is formed of, for example, a metal containing Ag, and covers the upper surface of the pad part 511B. The plating layer protects the lead frame 81 (which will be described later) from the impact of wire bonding of the first wires 61 (which will be described later) while increasing the bonding strength of the first wires 61. The pad part 511B is covered with the sealing resin 7 over the entire surface. The pad part 511B is substantially flat.

The paired first side terminals 512 are arranged on both sides of the plurality of first intermediate terminals 511 in the y direction. As shown in FIG. 2, each of the paired first side terminals 512 includes a lead part 512A and a pad part 512B.

The lead part 512A is an elongated rectangular portion extending along the x direction. The lead part 512A has a portion exposed from the sealing resin 7 and a portion covered with the sealing resin 7. As shown in FIGS. 6 and 7, the portion of the lead part 512A exposed from the sealing resin 7 is bent in a gull wing shape. Further, the portion of the lead part 512A exposed from the sealing resin 7 may be covered with a plating layer (for example, an alloy containing Sn such as solder), similarly to the lead part 511A.

The pad part 512B is a portion that is connected to the lead part 512A and is wider than the lead part 512A in the y direction. An upper surface (a surface facing the z direction) of the pad part 512B may be covered with a plating layer (for example, a metal containing Ag), similarly to the upper surface of the pad part 511B. The pad part 512B is covered with the sealing resin 7 over the entire surface. The pad part 512B is substantially flat.

As shown in FIGS. 2 and 8, the paired first support terminals 513 are arranged apart from each other in the y direction. The paired first support terminals 513 are connected to both ends of the first die pad 3 in the y direction and support the first die pad 3. As shown in FIGS. 2 and 8, the paired first support terminals 513 are arranged, for example, on both sides of the paired first side terminals 512 in the y direction. As shown in FIG. 2, each of the paired first support terminals 513 includes a lead part 513A and a pad part 513B.

The lead part 513A is an elongated rectangular portion extending along the x direction. The lead part 513A has a portion exposed from the sealing resin 7 and a portion covered with the sealing resin 7. As shown in FIGS. 6 and 7, the portion of the lead part 513A exposed from the sealing resin 7 is bent in a gull wing shape. Further, the portion of the lead part 513A exposed from the sealing resin 7 may be covered with a plating layer (for example, an alloy containing Sn such as solder), similarly to the lead part 511A. A length of the portion of the lead part 513A covered with the sealing resin 7 is longer than lengths of the portions of the lead parts 511A and 512A covered with the sealing resin 7.

The pad part 513B is a portion that is connected to the lead part 513A and extends in the y direction. As shown in FIG. 2, an end portion of the pad part 513B is connected to the first die pad 3. An upper surface (a surface facing the z direction) of the pad part 513B may be covered with a plating layer (for example, a metal containing Ag), similarly to the upper surface of the pad part 511B. The pad part 513B is covered with the sealing resin 7 over the entire surface. The pad part 513B is substantially flat.

Figure 9:
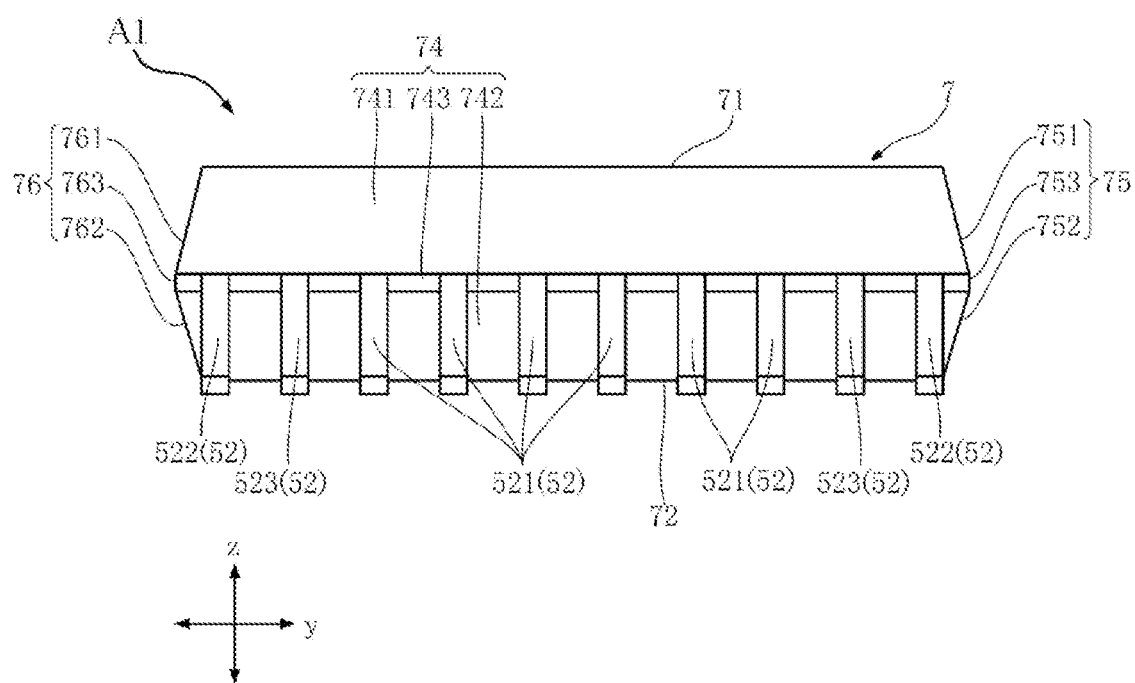
FIG. 9 is a right-hand side view of the semiconductor device shown in FIG. 1.

The plurality of second terminals 52 is a member that forms a conduction path between the semiconductor device A1 and the wiring board of the inverter device by being bonded to the wiring board, in the same manner as the plurality of first terminals 51. At least one of the plurality of second terminals 52 is conducting to the second semiconductor element 12. The plurality of second terminals is an element of the above-mentioned second circuit. As shown in FIGS. 1, 2, and 9, the plurality of second terminals 52 is arranged along the y direction while being separated from one another. The plurality of second terminals 52 extends in the x direction so as to be exposed from the sealing resin 7 (a second side surface 74 to be described later). Each of the plurality of second terminals 52 is located on the x direction side of the first die pad 3 in the x-direction. The plurality of second terminals 52 includes a plurality of second intermediate terminals 521, a pair of second side terminals 522, and a pair of second support terminals 523.

As shown in FIGS. 2 and 9, the plurality of second intermediate terminals 521 is arranged so as to be sandwiched between the paired second side terminals 522. As shown in FIG. 2, each of the plurality of second intermediate terminals 521 includes a lead part 521A and a pad part 521B.

The lead part 521A is an elongated rectangular portion extending along the x direction. The lead part 521A has a portion exposed from the sealing resin 7 and a portion covered with the sealing resin 7. As shown in FIGS. 6 and 7, the portion of the lead part 521A exposed from the sealing resin 7 is bent in a gull wing shape. Further, a plating layer (for example, an alloy containing Sn such as solder) may be formed on the portion of the lead part 521A exposed from the sealing resin 7, similarly to the lead part 511A.

The pad part 521B is a portion that is connected to the lead part 521A and is wider than the lead part 521A in the y direction. An upper surface (a surface facing the z direction) of the pad part 521B may be covered with a plating layer (for example, a metal containing Ag), similarly to the upper surface of the pad part 511B. The pad part 521B is covered with the sealing resin 7 over the entire surface. The pad part 521B is substantially flat.

The paired second side terminals 522 are arranged on both sides of the plurality of second intermediate terminals 521 in the y direction. As shown in FIG. 2, each of the paired second side terminals 522 includes a lead part 522A and a pad part 522B.

The lead part 522A is an elongated rectangular portion extending along the x direction. The lead part 522A has a portion exposed from the sealing resin 7 and a portion covered with the sealing resin 7. As shown in FIGS. 6 and 7, the portion of the lead part 522A exposed from the sealing resin 7 is bent in a gull wing shape. Further, the portion of the lead part 522A exposed from the sealing resin 7 may be covered with a plating layer (for example, an alloy containing Sn such as solder), similarly to the lead part 511A. A length of the portion of the lead part 522A covered with the sealing resin 7 is longer than the length of the portion of the lead part 521A covered with the sealing resin 7.

The pad part 522B is a portion that is connected to the lead part 522A and is wider than the lead part 522A in the y direction. An upper surface (s surface facing the z direction) of the pad part 522B may be covered with a plating layer (for example, a metal containing Ag), similarly to the upper surface of the pad part 511B. The pad part 522B is covered with the sealing resin 7 over the entire surface. The pad part 522B is substantially flat.

As shown in FIGS. 2 and 9, the paired second support terminals 523 are arranged apart from each other in the y direction. The paired second support terminal 523 are connected to both ends of the second die pad 4 in the y direction and support the second die pad 4. As shown in FIGS. 2 and 9, the plurality of second intermediate terminals 521 are arranged inward of the paired second support terminals 523 in the y direction. Further, the paired second side terminals 522 are arranged outward of the paired second support terminals 523, respectively, in the y direction. As shown in FIG. 2, each of the paired second support terminals 523 includes a lead part 523A, a pad part 523B, and a connecting part 523C.

The lead part 523A is an elongated rectangular portion extending along the x direction. The lead part 523A has a portion exposed from the sealing resin 7 and a portion covered with the sealing resin 7. As shown in FIGS. 6 and 7, the portion of the lead part 523A exposed from the sealing resin 7 is bent in a gull wing shape. Further, the portion of the lead part 523A exposed from the sealing resin 7 may be covered with a plating layer (for example, an alloy containing Sn such as solder), similarly to the lead part 511A.

The pad part 523B is a portion that is connected to the lead part 523A and is wider than the lead part 523A in the y direction. The pad part 523B extends in the x direction. An upper surface (a surface facing the z direction) of the pad part 523B may be covered with a plating layer (for example, a metal containing Ag), similarly to the upper surface of the pad part 511B. The pad part 523B is covered with the sealing resin 7 over the entire surface. The pad part 523B is substantially flat.

The connecting part 523C is a portion that is connected to the pad part 523B and extends in the y direction. As shown in FIG. 2, an end portion of the connecting part 523C is connected to the second die pad 4. An upper surface (a surface facing the z direction) of the connecting part 523C may be covered with a plating layer (for example, a metal containing Ag), similarly to the upper surface of the pad part 511B. The connecting part 523C is covered with the sealing resin 7 over the entire surface.

As shown in FIG. 2, in a plan view, the conductive support member 2 has a relationship in which the first die pad 3 and the second die pad 4 are closest to each other between a portion constituting the first circuit and a portion constituting the second circuit. That is, a separation distance of the closest portion between the first die pad 3 and the second die pad 4 is smaller than a separation distance of the closest portion between the plurality of first terminals 51 and the second die pad 4, and is smaller than a separation distance of the closest portion between the plurality of second terminals 52 and the first die pad 3. In the semiconductor device A1, the first near-end edge 363 and the second near-end edge 463 become the two closest portions between the first die pad 3 and the second die pad 4. Therefore, the electric field strength becomes strongest between the first near-end edge 363 and the second near-end edge 463.

As shown in FIG. 2, the plurality of first wires 61, the plurality of second wires 62, the plurality of third wires 63, and the plurality of fourth wires 64, together with the conductive support member 2, form conduction paths for performing predetermined functions of the first semiconductor element 11, the second semiconductor element 12, and the insulating element 13. The material of each of the plurality of first wires 61, the plurality of second wires 62, the plurality of third wires 63, and the plurality of fourth wires 64 is metal containing any of, for example, Au, Cu, and Al.

As shown in FIGS. 2 and 10, the plurality of first wires 61 form a conduction path between the first semiconductor element 11 and the plurality of first terminals 51. The first semiconductor element 11 conducts to at least one of the plurality of first terminals 51 by the plurality of first wires 61. The plurality of first wires 61 is an element of the above-mentioned first circuit. As shown in FIG. 2, each of the plurality of first wires 61 is bonded to one of the plurality of electrodes 11A of the first semiconductor element 11 and one of the pad part 511B of the plurality of first intermediate terminals 511, the pad part 512B of the paired first side terminals 512, and the pad part 513B of the paired first support terminals 513. Further, an angle formed by at least one of the plurality of first wires 61 with respect to the x direction is larger than an angle formed by the first wire 61 with respect to the y direction. As shown in FIG. 2, the plurality of first wires 61 includes a specific first wire 61A. The specific first wire 61A is located closest to a first gate mark 791 which will be described later. An angle formed by the specific first wire 61A with respect to the x direction is larger than an angle formed by the specific first wire 61A with respect to the y direction. Among lengths of the plurality of first wires 61, the length of the specific first wire 61A is the largest one.

In the semiconductor device A1, as shown in FIG. 2, two first wires 61 are bonded to the pad part 511B of one of the plurality of first intermediate terminals 511 and the pad part 513B of each of the paired first support terminals 513, respectively. The two first wires 61 are bonded to each of the pad part 511B and the pad part 513B in a state of being overlapped with each other. As a result, a bonding state of the two first wires 61 to each of the pad part 511B and the pad part 513B becomes stronger. This contributes to improvement of reliability of the semiconductor device A1.

As shown in FIGS. 2 and 10, the plurality of second wires 62 forms a conduction path between the second semiconductor element 12 and the plurality of second terminals 52. The second semiconductor element 12 conducts to at least one of the plurality of second terminals 52 by the plurality of second wires 62. The plurality of second wires 62 is an element of the above-mentioned second circuit. As shown in FIG. 2, each of the plurality of second wires 62 is bonded to one of the plurality of electrodes 12A of the second semiconductor element 12 and one of the pad part 521B of the plurality of second intermediate terminals 521, the pad part 522B of the paired second side terminals 522, and the pad part 523B of the paired second support terminals 523. Further, an angle formed by at least one of the plurality of second wires 62 with respect to the x direction is larger than an angle formed by the second wire 62 with respect to the y direction. As shown in FIG. 2, the plurality of second wires 62 include a specific second wire 62A. The specific second wire 62A is located closest to the first gate mark 791 which will be described later. An angle formed by the specific second wire 62A with respect to the x direction is larger than an angle formed by the specific second wire 62A with respect to the y direction. Among lengths of the plurality of second wires 62, the length of the specific second wire 62A is the largest one.

In the semiconductor device A1, as shown in FIG. 2, two second wires 62 are bonded to the pad part 521B of one of the plurality of second intermediate terminals 521, the pad part 522B of one of the paired second side terminals 522, and the pad part 523B of each of the paired second support terminals 523, respectively. The two second wires 62 are bonded to each of the pad part 521B, the pad part 522B, and the pad part 523B in a state of being overlapped with each other. As a result, a bonding state of the two second wires 62 to each of the pad part 521B, the pad part 522B, and the pad part 523B becomes stronger. This contributes to improvement of reliability of the semiconductor device A1.

As shown in FIGS. 2 and 10, the plurality of third wires 63 forms a conduction path between the first semiconductor element 11 and the insulating element 13. The first semiconductor element 11 and the insulating element 13 conduct with each other by the plurality of third wires 63. The plurality of third wires 63 is an element of the above-mentioned first circuit. Each of the plurality of third wires 63 is bonded to one of the electrodes 11A of the first semiconductor element 11 and one of the first electrodes 13A of the insulating element 13. The plurality of third wires 63 is arranged along the y direction.

As shown in FIGS. 2 and 10, the plurality of fourth wires 64 forms a conduction path between the second semiconductor element 12 and the insulating element 13. The second semiconductor element 12 and the insulating element 13 conduct with each other by the plurality of fourth wires 64. The plurality of fourth wires 64 is an element of the above-mentioned second circuit. Each of the plurality of fourth wires 64 is bonded to one of the electrodes 12A of the second semiconductor element 12 and one of the second electrodes 13B of the insulating element 13. The plurality of fourth wires 64 is arranged along the y direction. In the semiconductor device A1, the plurality of fourth wires 64 straddles the pad gap 21.

As shown in FIG. 1, the sealing resin 7 covers the first semiconductor element 11, the second semiconductor element 12, the insulating element 13, the first die pad 3, the second die pad 4, and a portion of each of the plurality of first terminals 51 and the plurality of second terminal 52. As shown in FIG. 10, the sealing resin 7 further covers the plurality of first wires 61, the plurality of second wires 62, the plurality of third wires 63, and the plurality of fourth wires 64. The sealing resin 7 has electrical insulation. The sealing resin 7 insulates the first die pad 3 and the second die pad 4 from each other. The sealing resin 7 is formed of a material containing, for example, a black epoxy resin. In a plan view, the sealing resin 7 has a rectangular shape.

As shown in FIGS. 1, 6, 7, and 10, the sealing resin 7 includes a first resin portion 7A and second resin portions 7B. The first resin portion 7A penetrates the pad gap 21 along the z direction and has the same dimensions in the x direction as the pad gap 21. The first resin portion 7A extends along the y direction. The second resin portions 7B are located on both sides of the first resin portion 7A in the x direction and are connected to the first resin portion 7A. The second resin portions 7B are located apart from each other in the x direction. An average void amount per unit volume of the first resin portion 7A is smaller than an average void amount per unit volume of the second resin portions 7B.

As shown in FIGS. 6 to 9, the sealing resin 7 has atop surface 71, a bottom surface 72, the first side surface 73, the second side surface 74, a third side surface 75, and a fourth side surface 76.

As shown in FIGS. 6 to 9, the top surface 71 and the bottom surface 72 are located apart from each other in the z direction. The top surface 71 and the bottom surface 72 face opposite to each other in the z direction. Each of the top surface 71 and the bottom surface 72 is substantially flat.

As shown in FIGS. 6 to 9, each of the first side surface 73, the second side surface 74, the third side surface 75, and the fourth side surface 76 is connected to the top surface 71 and the bottom surface 72, and is sandwiched between the top surface 71 and the bottom surface 72 in the z direction. As shown in FIGS. 1, 6, and 7, the first side surface 73 is located on one side in the x direction, the second side surface 74 is located on the other side in the x direction, and the third side surface 75 and the fourth side surface 76 are located apart from each other in the y direction and are connected to the first side surface 73 and the second side surface 74. A portion of each of the plurality of first terminals 51 protrudes from the first side surface 73. A portion of each of the plurality of second terminals 52 protrudes from the second side surface 74.

As shown in FIGS. 6 to 8, the first side surface 73 includes a first region 731, a second region 732, and a third region 733. One end of the first region 731 in the z direction is connected to the top surface 71, and the other end thereof in the z direction is connected to the third region 733. The first region 731 is inclined with respect to the top surface 71. One end of the second region 732 in the z direction is connected to the bottom surface 72, and the other end thereof in the z direction is connected to the third region 733. The second region 732 is inclined with respect to the bottom surface 72. One end of the third region 733 in the z direction is connected to the first region 731, and the other end thereof in the z direction is connected to the second region 732. The third region 733 extends along both the z direction and the y direction. In a plan view, the third region 733 is located outside the top surface 71 and the bottom surface 72. A portion of each of the plurality of first terminals 51 is exposed from the third region 733.

As shown in FIGS. 6, 7, and 9, the second side surface 74 includes a fourth region 741, a fifth region 742, and a sixth region 743. One end of the fourth region 741 in the z direction is connected to the top surface 71, and the other end thereof in the z direction is connected to the sixth region 743. The fourth region 741 is inclined with respect to the top surface 71. One end of the fifth region 742 in the z direction is connected to the bottom surface 72, and the other end thereof in the z direction is connected to the sixth region 743. The fifth region 742 is inclined with respect to the bottom surface 72. One end of the sixth region 743 in the z direction is connected to the fourth region 741, and the other end thereof in the z direction is connected to the fifth region 742. The sixth region 743 extends along both the z direction and the y direction. In a plan view, the sixth region 743 is located outside the top surface 71 and the bottom surface 72. A portion of each of the plurality of second terminals 52 is exposed from the sixth region 743.

As shown in FIGS. 7 to 9, the third side surface 75 includes a seventh region 751, an eighth region 752, and a ninth region 753. One end of the seventh region 751 in the z direction is connected to the top surface 71, and the other end thereof in the z direction is connected to the ninth region 753. The seventh region 751 is inclined with respect to the top surface 71. One end of the eighth region 752 in the z direction is connected to the bottom surface 72, and the other end thereof in the z direction is connected to the ninth region 753. The eighth region 752 is inclined with respect to the bottom surface 72. One end of the ninth region 753 in the z direction is connected to the seventh region 751, and the other end thereof in the z direction is connected to the eighth region 752. The ninth region 753 extends along both the z direction and the y direction. In a plan view, the ninth region 753 is located outside the top surface 71 and the bottom surface 72.

As shown in FIG. 7, the first gate mark 791 is formed on the third side surface 75. A surface roughness of the first gate mark 791 is larger than that of other regions of the third side surface 75 excluding the first gate mark 791. The first gate mark 791 appears by cutting the sealing resin 7 at a first gate 891 in a process of forming the sealing resin 7 in the manufacturing process of the semiconductor device A1, which will be described later. When viewed along the y direction, the first gate mark 791 overlaps the pad gap 21. Further, when viewed along the y direction, the first gate mark 791 includes a region located on the side opposite to the first semiconductor element 11 with respect to the first die pad 3 in the z direction. In the semiconductor device A1, the first gate mark 791 includes a region located in the eighth region 752 and a region located in the ninth region 753. The first gate mark 791 is located at the center of the third side surface 75 in the x direction.

As shown in FIGS. 6, 8, and 9, the fourth side surface 76 includes a tenth region 761, an eleventh region 762, and a twelfth region 763. One end of the tenth region 761 in the z direction is connected to the top surface 71, and the other end thereof in the z direction is connected to the twelfth region 763. The tenth region 761 is inclined with respect to the top surface 71. One end of the eleventh region 762 in the z direction is connected to the bottom surface 72, and the other end thereof in the z direction is connected to the twelfth region 763. The eleventh region 762 is inclined with respect to the bottom surface 72. One end of the twelfth region 763 in the z direction is connected to the tenth region 761, and the other end thereof in the z direction is connected to the eleventh region 762. The twelfth region 763 extends along both the z direction and the y direction. In a plan view, the twelfth region 763 is located outside the top surface 71 and the bottom surface 72.

As shown in FIG. 6, a second gate mark 792 is formed on the fourth side surface 76. A surface roughness of the second gate mark 792 is larger than that of other regions of the fourth side surface 76 excluding the second gate mark 792. The second gate mark 792 appears by cutting the sealing resin 7 at a second gate 892 in the process of forming the sealing resin 7 in the manufacturing process of the semiconductor device A1, which will be described later. When viewed along the y direction, the second gate 892 overlaps the pad gap 21. Further, when viewed along the y direction, the second gate 892 includes a region located on the side opposite to the first semiconductor element 11 with respect to the first die pad 3 in the z direction. In the semiconductor device A1, the second gate mark 792 includes a region located in the eleventh region 762 and a region located in the twelfth region 763. The second gate mark 792 is located at the center of the fourth side surface 76 in the x direction.

Next, a circuit configuration of the semiconductor device A1 will be described with reference to FIGS. 15 and 16.

Figure 15:
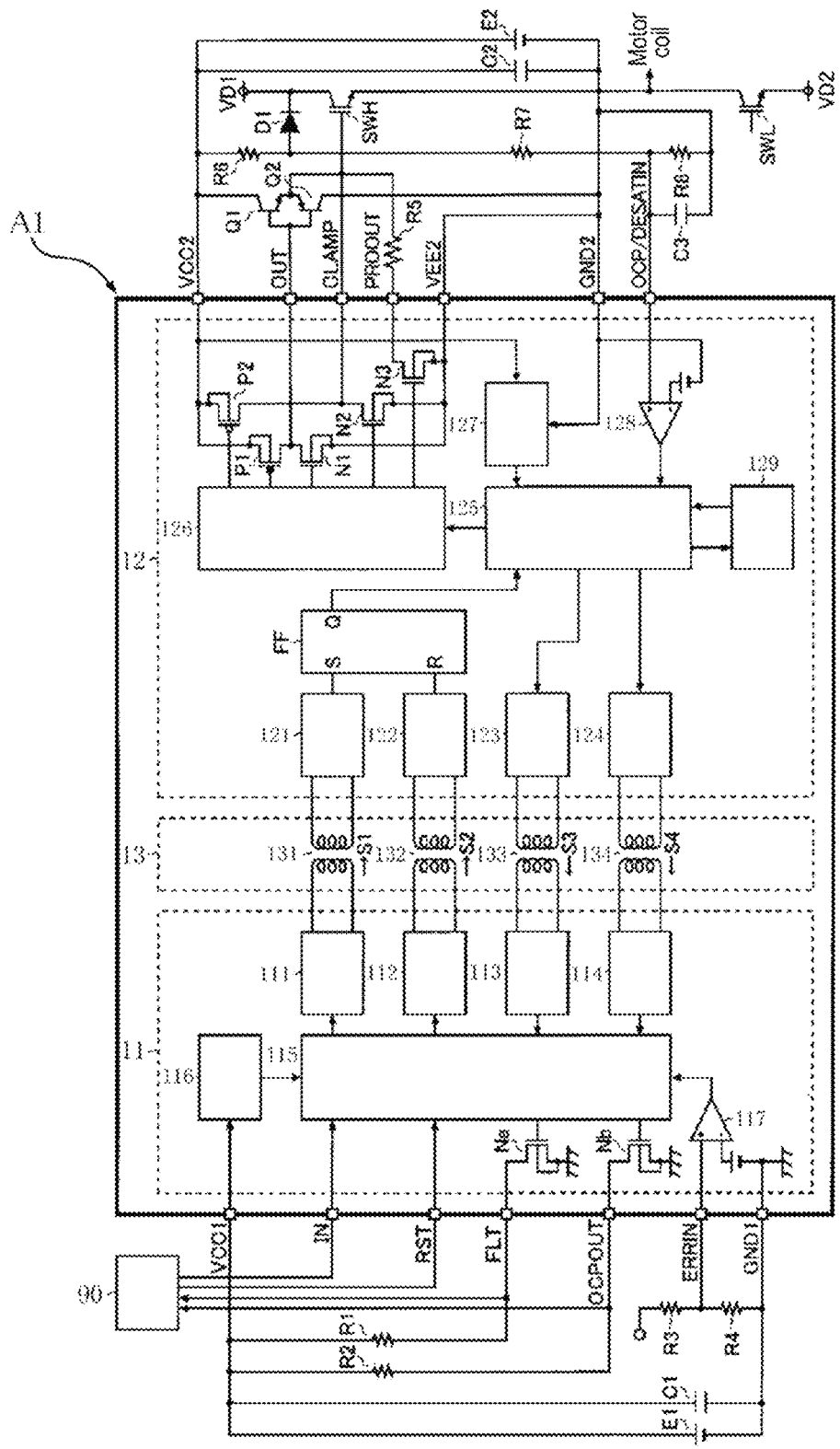
FIG. 15 is a block diagram showing a configuration example of a motor drive device using the semiconductor device shown in FIG. 1.

As shown in FIG. 15, a circuit configured in the first semiconductor element 11 includes a first transmitting part 111, a second transmitting part 112, a third receiving part 113, a fourth receiving part 114, a logic part 115, a first low voltage lockout part 116, an external error detecting part 117, and transistors Na and Nb. Each of the transistors Na and Nb is an n-channel MOSFET.

As shown in FIG. 15, a circuit configured in the second semiconductor element 12 includes a first receiving part 121, a second receiving part 122, a third transmitting part 123, a fourth transmitting part 124, a logic part 125, a driver part 126, a second low voltage lockout part 27, an overcurrent detecting part 28, an OCP (Over Current Protection) timer 29, transistors P1 and P2, transistors N1, N2, and N3, and an SR flip-flop FF. Each of the transistors P1 and P2 is a p-channel MOSFET. Each of the transistors N1, N2, and N3 is an n-channel MOSFET.

As shown in FIG. 15, a circuit configured in the insulating element 13 includes a first transformer 131, a second transformer 132, a third transformer 133, and a fourth transformer 134.

The first transmitting part 111 is a means for transmitting a switch control signal S1, which is input from the logic part 115, to the first receiving part 121 via the first transformer 131. The second transmitting part 112 is a means for transmitting a switch control signal S2, which is input from the logic part 115, to the second receiving part 122 via the second transformer 132. The third receiving part 113 is a means for receiving a watchdog signal S3, which is input from the third transmitting part 123 via the third transformer 133, and transmitting the watchdog signal S3 to the logic part 115. The fourth receiving part 114 is a means for receiving a driver abnormality signal S4, which is input from the fourth transmitting part 124 via the fourth transformer 134, and transmitting the driver abnormality signal S4 to the logic part 115.

The logic part 115 is a means for exchanging various signals (IN, RST, FLT, OCPOUT, and the like) with an ECU 90, and also exchanging various signals (S1 to S4) with the second semiconductor element 12 by using the first transmitting part 111, the second transmitting part 112, the third receiving part 113, and the fourth receiving part 114.

The logic part 115 generates the switch control signals S1 and S2 so that an output signal OUT is at a high level when an input signal IN is at a high level, and conversely, generates the switch control signals S1 and S2 so that the output signal OUT is at a low level when the input signal IN is at a low level. More specifically, the logic part 115 detects a positive edge of the input signal IN (a rising edge from the low level to the high level) and makes a pulse in the switch control signal S1, while detecting a negative edge of the input signal IN (a falling edge from the high level to the low level) and making a pulse in the switch control signal S2.

The logic part 115 generates the switch control signals S1 and S2 so as to disable an operation of generating the output signal OUT, that is, to fix the output signal OUT at a low level when a reset signal RST is at a low level, and conversely, generates the switch control signals S1 and S2 so as to enable the operation of generating the output signal OUT, that is, to set the output signal OUT to a logic level corresponding to the input signal IN when the reset signal RST is at a high level. When the reset signal RST is maintained at the low level for a predetermined time (for example, 500 ns), the logic part 115 generates the switch control signals S1 and S2 so as to restore a protection operation by the overcurrent detecting part 128.

The logic part 115 turns the transistor Na off to set a first state signal FLT to open (a pull-up state by a resistor R1) when the semiconductor device A1 is normal, and turns the transistor Na on to set the first state signal FLT to a low level when the semiconductor device A1 is abnormal (when a low voltage abnormality on a side of the first semiconductor element 11, a transformer transmission abnormality of the switch control signals S1 and S2, or an ERRIN signal abnormality is detected). With such a configuration, the ECU 90 can recognize a state of the semiconductor device A1 by monitoring the first state signal FLT. In addition, the low voltage abnormality on the side of the first semiconductor element 11 may be determined based on a detection result of the first low voltage lockout part 116, and the transformer transmission abnormality of the switch control signals S1 and S2 may be determined based on a comparison result between the input signal IN (the switch control signals S1 and S2) and the watchdog signal S3. Further, the ERRIN signal abnormality may be determined based on an output result of the external error detecting part 117.

The logic part 115 turns the transistor Nb off to set a second state signal OCPOUT to open (a pull-up state by a resistor R2) when the semiconductor device A1 is normal, and turns the transistor Nb on to set the second state signal OCPOUT to a low level when the semiconductor device A1 is abnormal (when a low voltage abnormality on a side of the second semiconductor element 12 or an overcurrent of a motor drive current flowing through a high side switch SWH is detected). With such a configuration, the ECU 90 can recognize the state of the semiconductor device A1 by monitoring the second state signal OCPOUT. The low voltage abnormality on the side of the second semiconductor element 12 and the overcurrent of the motor drive current flowing through the high side switch SWH may be determined based on the driver abnormality signal S4.

The first low voltage lockout part 116 is a means for monitoring whether or not a first power supply voltage VCC1 is in a low voltage state and transmitting the monitoring result to the logic part 115.

The external error detecting part 117 is a means for comparing a voltage input to an ERRIN terminal from a connection node between a resistor R3 and a resistor R4 (a division voltage obtained by dividing a monitored analog voltage by resistors) with a predetermined threshold voltage, and transmitting the comparison result to the logic part 115.

The first receiving part 121 is a means for receiving the switch control signal S1, which is input from the first transmitting part 111 via the first transformer 131, and transmitting the switch control signal S1 to a set input terminal S of the SR flip-flop FF. The second receiving part 122 is a means for receiving the switch control signal S2, which is input from the second transmitting part 112 via the second transformer 132, and transmitting the switch control signal S2 to a reset input terminal R of the SR flip-flop FF. The third transmitting part 123 is a means for transmitting the watchdog signal S3, which is input from the logic part 125, to the third receiving part 113 via the third transformer 133. The fourth transmitting part 124 is a means for transmitting the driver abnormality signal S4, which is input from the logic part 125, to the second receiving part 114 via the fourth transformer 134.

The SR flip-flop FF sets an output signal to a high level by using a pulse edge of the switch control signal S1, which is input to the set input terminal S, as a trigger and resets the output signal to a low level by using a pulse edge of the switch control signal S2, which is input to the reset input terminal R, as a trigger. That is, the output signal is the same signal as the input signal IN input from the ECU 90 to the logic part 115. In addition, the output signal is transmitted from an output terminal Q of the SR flip-flop FF to the logic part 125.

The logic part 125 generates a drive signal for the driver part 126 based on the output signal of the SR flip-flop FF (the same signal as the input signal IN).

When determining that a low voltage abnormality or an overcurrent has occurred based on detection results of the second low voltage lockout part 127 and the overcurrent detecting part 128, the logic part 125 transmits an abnormality detection signal indicative of the determination to the driver part 126 and also transmits the driver abnormality signal S4 to the logic part 115. With such a configuration, even when an abnormality occurs in the second semiconductor element 12, the driver part 126 can quickly perform a protection operation, and the logic part 115 can perform an abnormality notification operation (low level transition of the second state signal OCPOUT) to the ECU 90. In addition, the logic part 125 has a function of automatically recovering from the overcurrent protection operation when a predetermined time elapses after the overcurrent protection operation.

The logic part 125 outputs an output signal of the SR flip-flop FF as the watchdog signal S3, as it is, to the third transmitting part 123. With such a configuration in which the watchdog signal S3 is returned from the second semiconductor element 12 to the first semiconductor element 11, it is possible for the logic part 115 to determine the presence or absence of the transformer transmission abnormality by comparing the input signal IN input to the first semiconductor element 11 with the watchdog signal S3 returned from the second semiconductor element 12.

The driver part 126 is a means for controlling on/off of the transistor P1 and the transistor N1 based on the drive signal input from the logic part 125, and outputting the output signal OUT from a connection node between the transistor P1 and the transistor N1. The output signal OUT is input to the high side switch SWH via a drive circuit composed of transistors Q1 and Q2. The drive circuit is a means for adjusting a rising and falling time (a slew rate) of the output signal OUT so that the output signal OUT has capability of driving the high side switch SWH. When the output signal OUT is at a high level, the high side switch SWH is turned on, and conversely, when the output signal OUT is at a low level, the high side switch SWH is turned off.

The driver part 126 has a function (an active mirror clamp function) of turning the transistor N2 on so as to draw electric charges (a mirror current) from a gate of the high side switch SWH via a CLAMP terminal, when a voltage level (using GND2 as a reference) of the output signal OUT becomes a low level. With such a configuration, when the high side switch SWH is turned off, it is possible to quickly reduce the gate potential of the high side switch SWH to a low level via the transistor N2 without depending on the slew rate set in the drive circuit.

The driver part 126 has a function (a short-circuit clamp function) of turning the transistor P2 on so as to clamp the gate of the high side switch SWH to a second power supply voltage VCC2 via the CLAMP terminal, when the voltage level (using GND2 as a reference) of the output signal OUT becomes a high level. With such a configuration, when the high side switch SWH is turned on, the gate potential of the high side switch SWH does not rise to a potential higher than the second power supply voltage VCC2.

The driver part 126 has a function (a slow-off function) of turning all of the transistors P1 and P2 and the transistors N1 and N2 off while turning the transistor N3 on, when determining that it is necessary to perform the protection operation based on the abnormality detection signal input from the logic part 125. With such switch control, electric charges can be extracted from the gate of the high side switch SWH via a resistor R5 more slowly in the protection operation than in the normal operation. With such a configuration, since a motor current can be avoided from being interrupted momentarily during the protection operation, it is possible to suppress a surge caused by a counter electromotive force of a motor coil. In addition, by appropriately selecting a resistance value of the resistor R5, the falling time during the protection operation can be arbitrarily adjusted.

The second low voltage lockout part 127 is a means for monitoring whether or not the second power supply voltage VCC2 is in a low voltage state and transmitting the monitoring result to the logic part 125.

The overcurrent detecting part 128 is a means for comparing a voltage (a division voltage obtained by dividing an anode voltage of a diode D1 by resistors) input to an OCP/DESATIN terminal from a connection node between a resistor R7 and a resistor R8 with a predetermined threshold voltage, and transmitting the comparison result to the logic part 125. As the motor drive current flowing through the high side switch SWH increases, a collector-emitter voltage of an insulated gate bipolar transistor used as the high side switch SWH increases. Thus, as the motor drive current flowing through the high side switch SWH increases, the anode voltage of the diode D1 rises, and further, the voltage input to the OCP/DESATIN terminal rises. Therefore, when the voltage (using GND2 as a reference) input to the OCP/DESATIN terminal reaches the predetermined threshold value (for example, 0.5 V), the overcurrent detecting part 128 determines that the motor drive current flowing through the high side switch SWH is in an overcurrent state.

In this configuration example, a configuration (voltage detection method) in which the motor drive current is detected by detecting the collector-emitter voltage of the insulated gate bipolar transistor used as the high side switch SWH is employed. However, the method of detecting the motor drive current is not limited to the voltage detection method described above. For example, a method (current detection method) in which the motor drive current (or a mirror current showing the same behavior as this) flowing through the high side switch SWH is passed through a sense resistor to generate a voltage signal and the generated voltage signal is input to the OCP/DESATIN terminal may be employed.

The OCP timer 129 is a means for counting an elapsed time after the overcurrent protection operation.

The first transformer 131 is a DC insulating element for transmitting the switch control signal S1 from the first semiconductor element 11 to the second semiconductor element 12. The second transformer 132 is a DC insulating element for transmitting the switch control signal S2 from the first semiconductor element 11 to the second semiconductor element 12. The third transformer 133 is a DC insulating element for transmitting the watchdog signal S3 from the second semiconductor element 12 to the first semiconductor element 11. The fourth transformer 134 is a DC insulating element for transmitting the driver abnormality signal S4 from the second semiconductor element 12 to the first semiconductor element 11.

With such a configuration in which not only the switch control signals S1 and S2 but also the watchdog signal S3 and the driver abnormality signal S4 are exchanged between the first semiconductor element 11 and the second semiconductor element 12, it is possible to appropriately implement not only the on/off control the high side switch SWH but also various protection functions.

Figure 16:
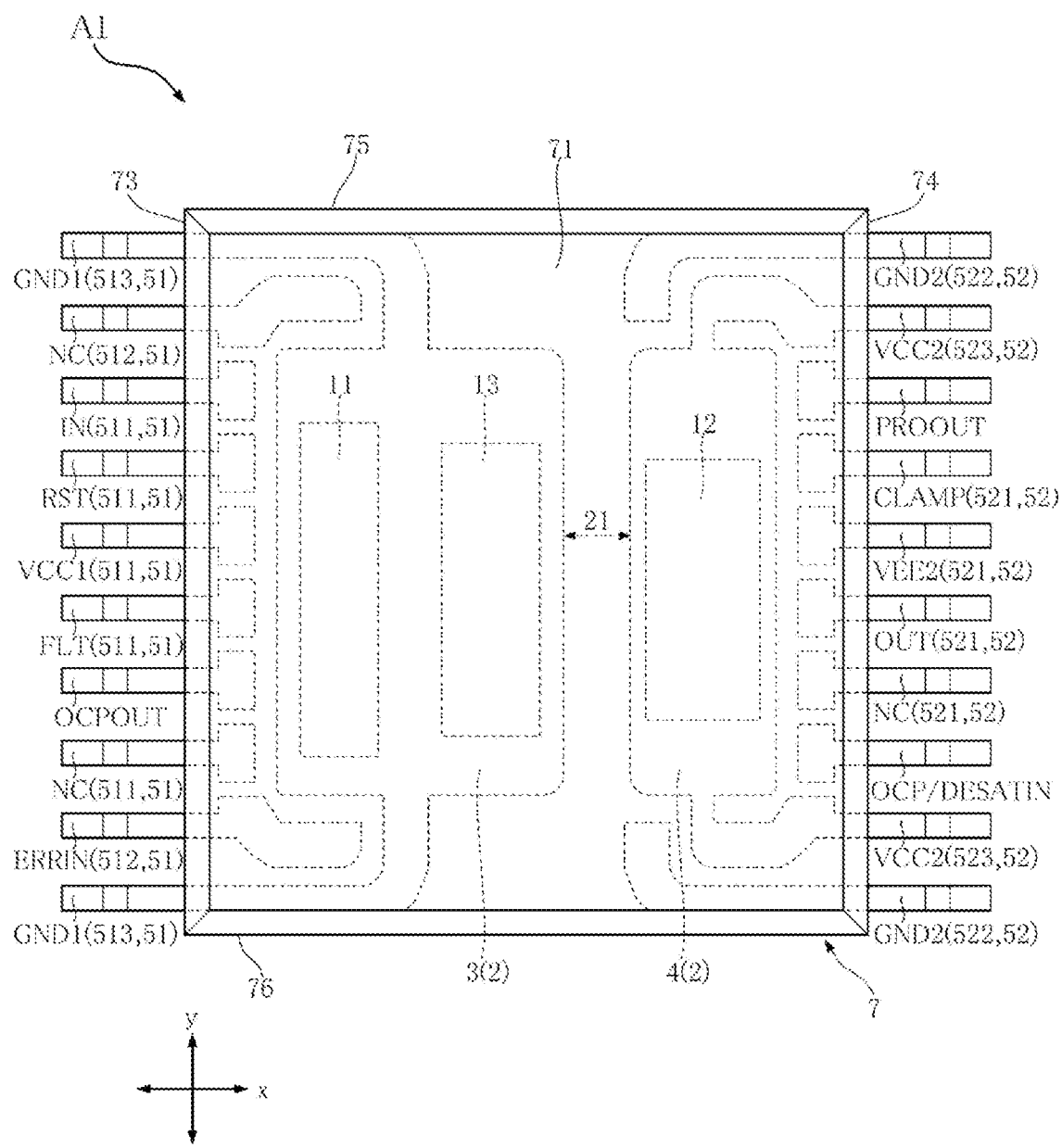
FIG. 16 is a plan view for explaining a terminal type of each of a plurality of first terminals 51 and a plurality of second terminals 52, which are related to the semiconductor device shown in FIG. 1.

As shown in FIG. 16, terminal types of the plurality of first terminals 51 are composed of GND1, VCC1, IN, RST, FLT, OCPOUT, ERRIN, and NC. The terminal GND1 is a GND terminal. In the semiconductor device A1, each of the paired first support terminals 513 of the plurality of first terminals 51 is the terminal GND1. Therefore, the terminal GND1 is conducting to both the first semiconductor element 11 and the first die pad 3. The terminal VCC1 is a power supply terminal (for example, 5 V). The terminal IN is a control input terminal. The terminal RST is a reset input terminal. The terminal FLT is an output terminal of the first state signal (the abnormal state detection signal in the first semiconductor element 11). The terminal OCPOUT is an output terminal of the second state signal (the abnormal state detection signal in the second semiconductor element 12). The terminal ERRIN is an error detection terminal. The terminal NC is a non-connection terminal and is a so-called dummy terminal. The terminal NC does not conduct to the first semiconductor element 11.

As shown in FIG. 16, the terminal types of the plurality of second terminals 52 are composed of GND2, VCC2, VEE2, OUT, PROOUT, CLAMP, OCP/DESATIN, and NC. The terminal GND2 is a GND terminal. As shown in FIG. 15, the terminal GND2 is connected to an emitter of an insulated gate bipolar transistor Tr1 outside the semiconductor device A1. The terminal VCC2 is a positive power supply terminal. In the semiconductor device A1, each of the paired second support terminals 523 of the plurality of second terminals 52 is the terminal VCC2. Therefore, the terminal VCC2 is conducting to both the second semiconductor element 12 and the second die pad 4. The terminal VEE2 is a negative power supply terminal. The terminal OUT is an output terminal. The terminal PROOUT is a slow OFF output terminal. The terminal CLAMP is a clamp terminal. The terminal OCP/DESATIN is an overcurrent detection terminal. The terminal NC is a non-connection terminal and is a so-called dummy terminal. The terminal NC does not conduct to the second semiconductor element 12.

In the semiconductor device A1, a first power supply is connected to two or more of the plurality of first terminals 51, and a second power supply is connected to two or more of the plurality of second terminals 52. A power supply voltage output by the second power supply is higher than a power supply voltage output by the first power supply. Therefore, the power supply voltage supplied to the second circuit (the second semiconductor element 12, the second die pad 4, the plurality of second terminals 52, and the plurality of second wires 62) is larger than the power supply voltage supplied to the first circuit (the first semiconductor element 11, the first die pad 3, the plurality of first terminals 51, and the plurality of first wires 61). For example, as described above, since the power supply voltage required for the first semiconductor element 11 is about 5 V, the power supply voltage supplied from the first power supply to the first circuit is about 5 V. Further, since the power supply voltage required for the second semiconductor element 12 is 600 V or more, the power supply voltage supplied from the second power supply to the second circuit is 600 V or more. In this configuration, when a low potential side terminal (for example, the GND terminal) of the first power supply is connected to the first terminal 51 that conducts to the first die pad 3 among the plurality of first terminals 51 and a high potential side terminal of the second power supply is connected to the second terminal 52 that conducts to the second die pad 4 among the plurality of second terminals 52, a potential difference between the first die pad 3 and the second die pad 4 is maximized. In one example, in a state where the power supply voltages are supplied to the first circuit and a power supply voltage, respectively, the potential of the first die pad 3 is 0 V (GND potential), and the potential of the second die pad 4 is 600 V or more. For example, an insulation voltage between the first die pad 3 and the second die pad 4 may be 2,500 Vrms or more.

Figure 19:
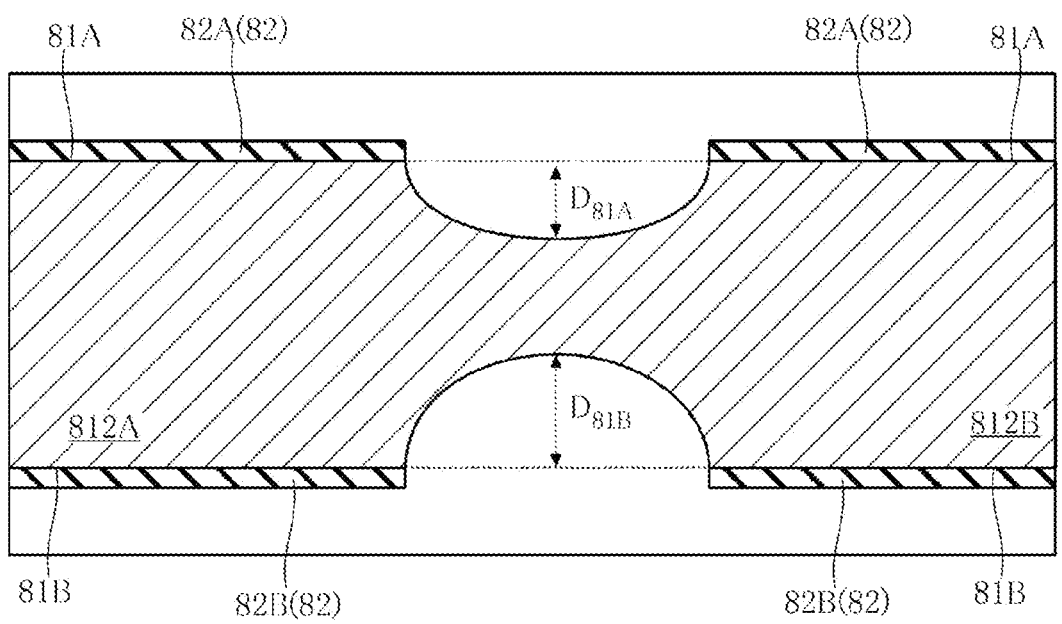
FIG. 19 is a cross-sectional view for explaining a process of manufacturing the semiconductor device shown in FIG. 1.
Figure 20:
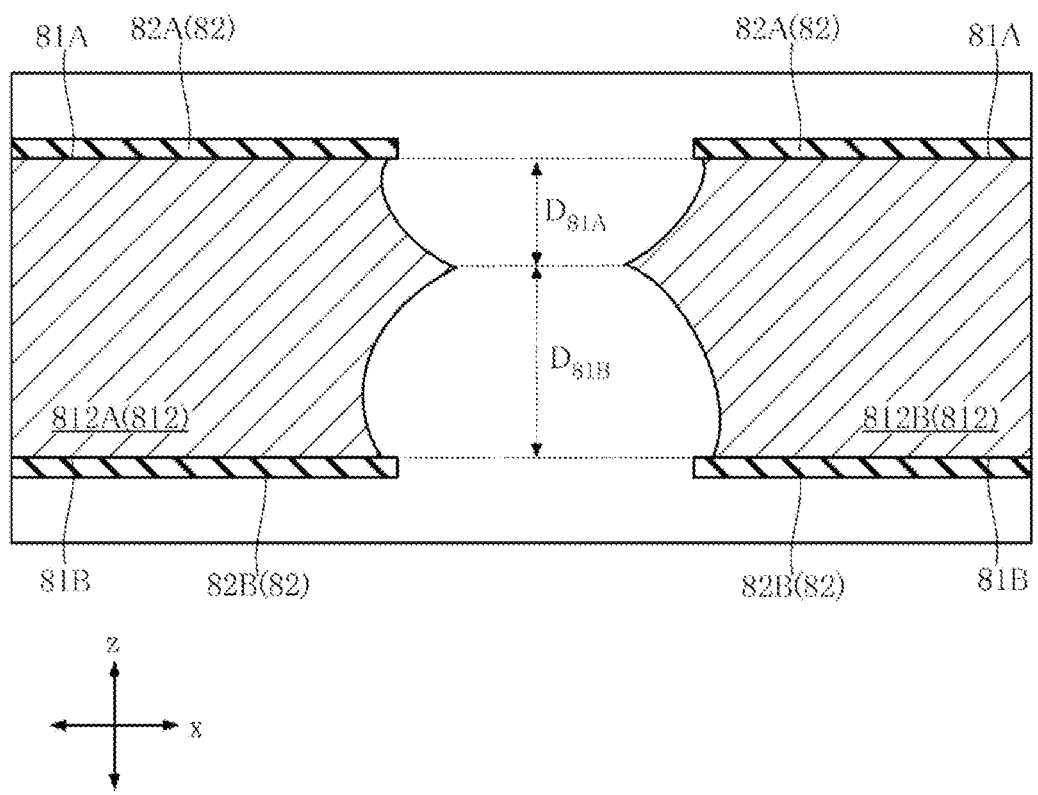
FIG. 20 is a cross-sectional view for explaining a process of manufacturing the semiconductor device shown in FIG. 1.
Figure 21:
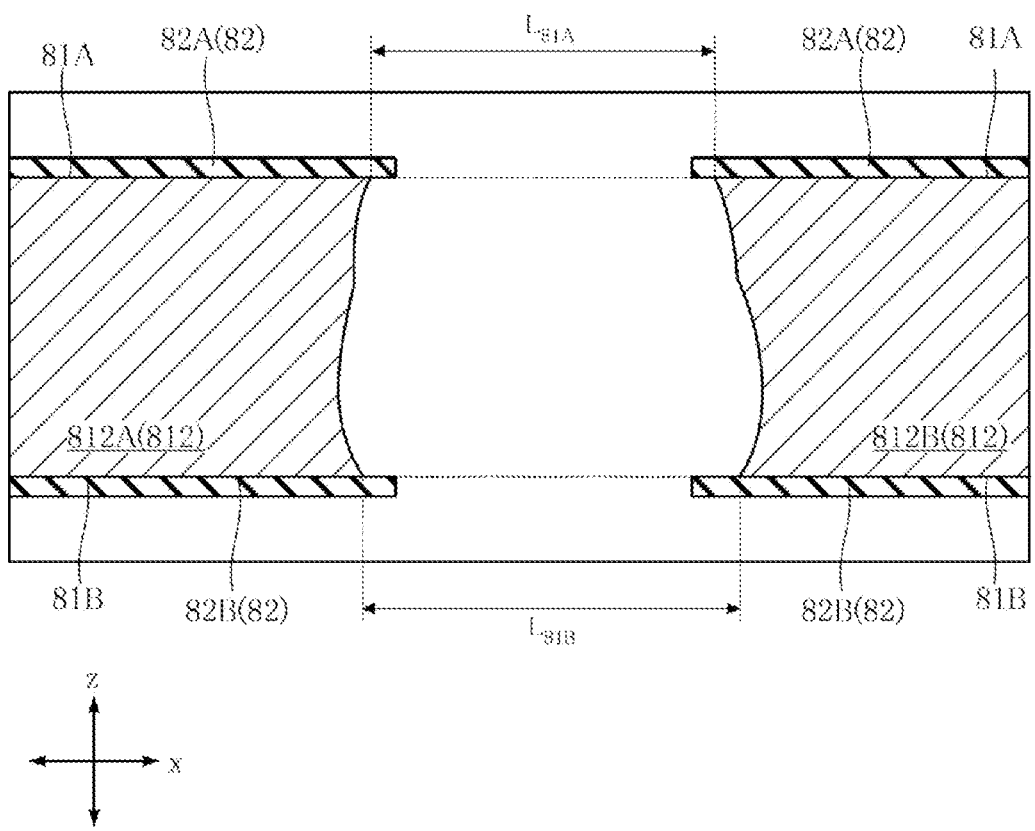
FIG. 21 is a cross-sectional view for explaining a process of manufacturing the semiconductor device shown in FIG. 1.
Figure 22:
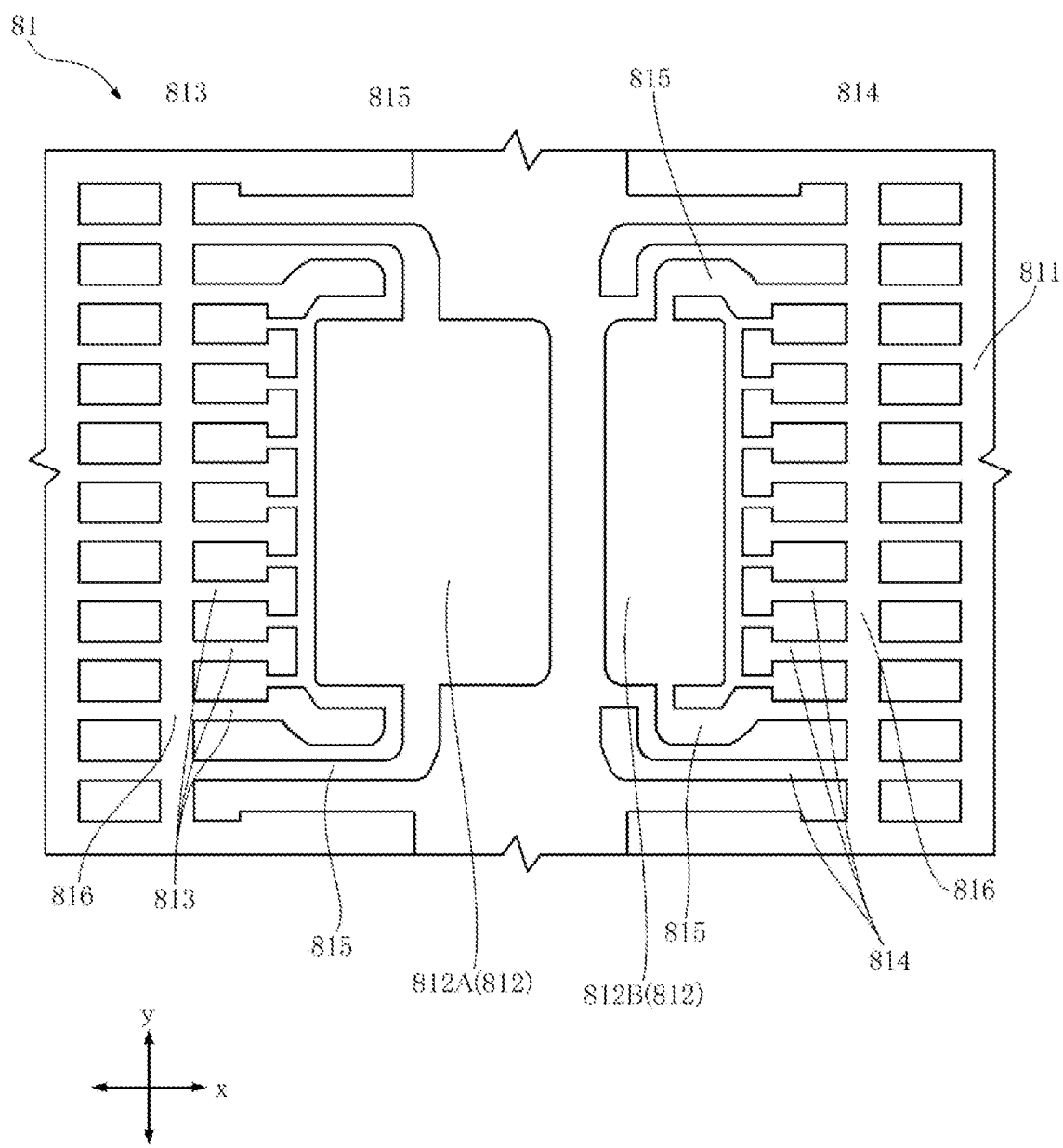
FIG. 22 is a plan view for explaining a process of manufacturing the semiconductor device shown in FIG. 1.

Next, an example of a method of manufacturing the semiconductor device A1 will be described with reference to FIGS. 17 to 24. Here, the cross-sectional position of each of FIGS. 19 to 21 is the same as the cross-sectional position of FIG. 18.

Figure 17:
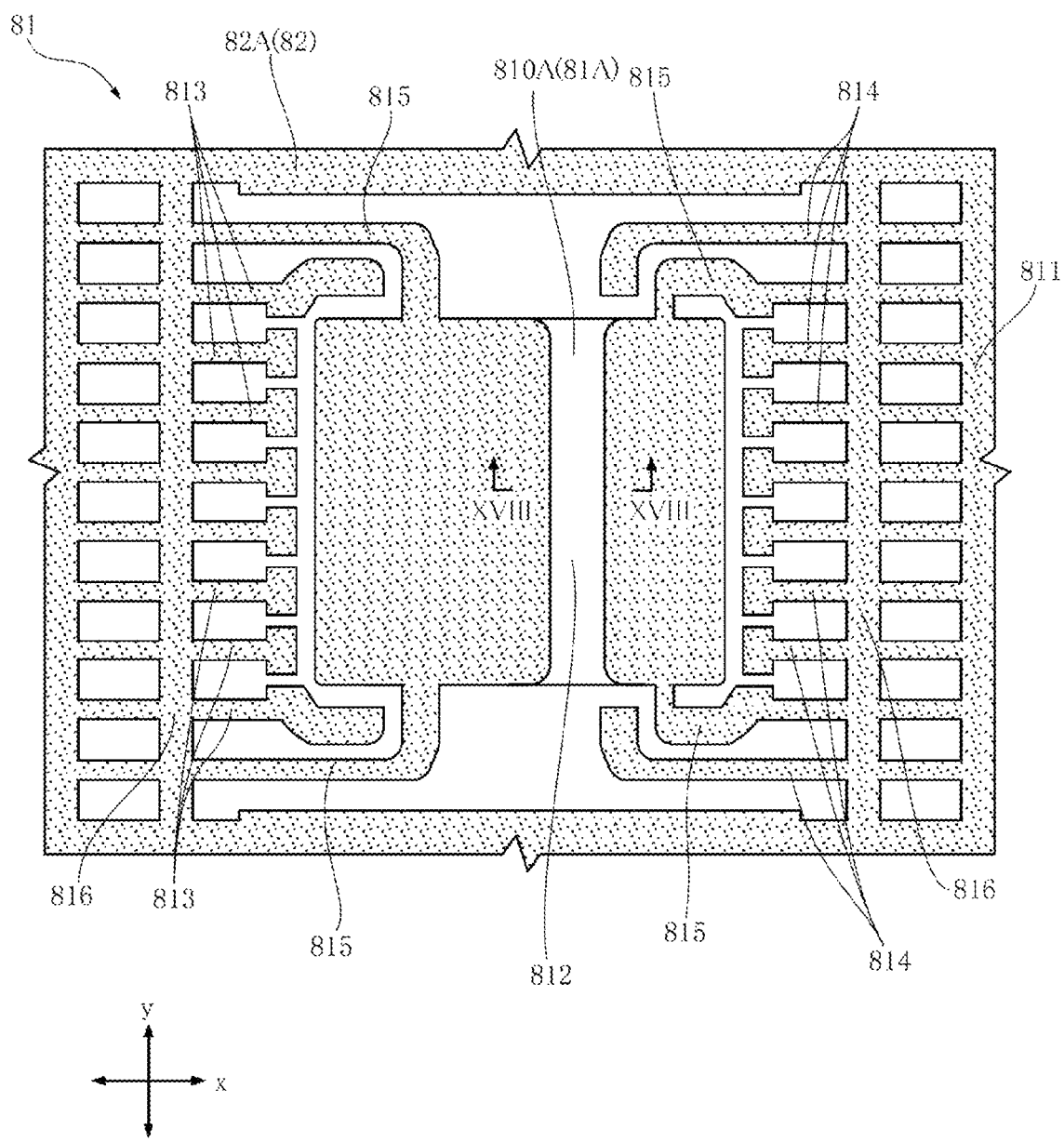
FIG. 17 is a plan view for explaining a process of manufacturing the semiconductor device shown in FIG. 1.
Figure 18:
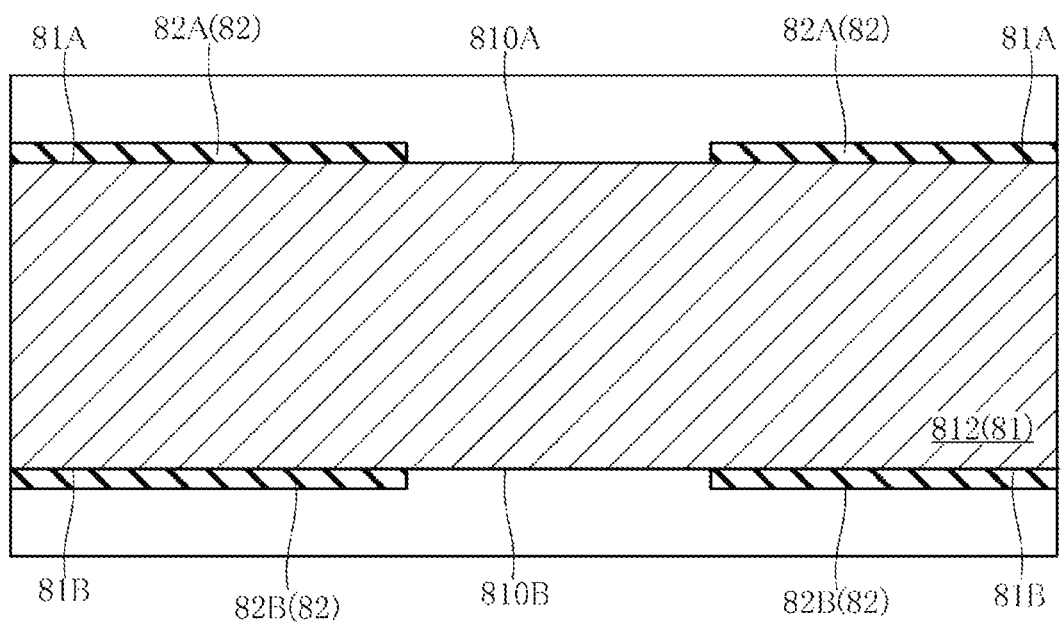
FIG. 18 is a cross-sectional view taken along line XVIII-XVIII of FIG. 17.
Figure 18:
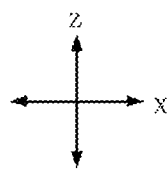

First, as shown in FIGS. 17 and 18, a lead frame 81 having a main surface 81A and a back surface 81B, which are separated from each other in the z direction, is prepared, and then a resist 82 is formed on each of the main surface 81A and the back surface 81B.

In a process of preparing the lead frame 81, for example, a copper plate having a rectangular shape in a plan view is punched to form the lead frame 81 including an outer frame 811, an island portion 812, a plurality of first leads 813, a plurality of second leads 814, a plurality of support leads 815, and a dam bar 816, as shown in FIG. 17. Among these, the outer frame 811 and the dam bar 816 do not constitute the semiconductor device A1. The plurality of first leads 813 is a portion that later becomes the plurality of first intermediate terminals 511 and the paired first side terminals 512. The plurality of second leads 814 is a portion that later becomes the plurality of second intermediate terminals 521 and the paired second side terminals 522. The plurality of support leads 815 is a portion that later becomes the paired first support terminals 513 and the paired second support terminals 523.

In a process of forming the resist 82, the resist 82 is formed on a portion of each of the main surface 81A and the back surface 81B of the lead frame 81. For convenience of understanding, dots are drawn on the resist 82 in FIG. 17. The resist 82 includes a first coating portion 82A and a second coating portion 82B, as shown in FIGS. 17 and 18. The first coating portion 82A covers a portion of the main surface 81A. As shown in FIGS. 17 and 18, a portion of the main surface 81A is exposed from the first coating portion 82A, and the main surface 81A includes a first exposed region 810A exposed from the first coating portion 82A. The second coating portion 82B covers a portion of the back surface 81B. As shown in FIG. 18, a portion of the back surface 81B is exposed from the second coating portion 82B, and the back surface 81B includes a second exposed region 810B exposed from the second coating portion 82B. Each of the first exposed region 810A and the second exposed region 810B is arranged in the island portion 812, as shown in FIG. 17. Further, the first exposed region 810A and the second exposed region 810B overlap in a plan view, as shown in FIG. 18.

Subsequently, as shown in FIGS. 19 to 21, the lead frame 81 is etched. In a process of etching the lead frame 81, the etching is performed from both sides of the main surface 81A and the back surface 81B of the lead frame 81. FIGS. 19 to 21 show state transitions in this etching process, and the etching proceeds in the order shown in FIGS. 19, 20, and 21. As shown in FIG. 19, the etching proceeds from the first exposed region 810A, while the etching proceeds from the second exposed region 810B. Thereafter, as shown in FIGS. 20 and 21, the island portion 812 is separated into two portions (a first die pad 812A and a second die pad 812B) by the etching from the first exposed region 810A and the etching from the second exposed region 810B. The first die pad 812A corresponds to the first die pad 3. The second die pad 812B corresponds to the second die pad 4.

By simultaneously etching from both sides of the main surface 81A and the back surface 81B of the lead frame 81 as described above, the first facing surface 33 of the first die pad 3 and the second facing surface 43 of the second die pad 4 are formed. Further, the first main surface side recess 331, the first back surface side recess 332, the first main surface side protrusion 333, the first back surface side protrusion 334, and the first intermediate protrusion 335 are formed in the first facing surface 33 (the first die pad 3). The second main surface side recess 431, the second back surface side recess 432, the second main surface side protrusion 433, the second back surface side protrusion 434, and the second intermediate protrusion 435 are formed in the second facing surface 43 (the second die pad 4).

As shown in FIGS. 19 to 21, a progress rate of the etching from the second exposed region 810B is higher than a progress rate of the etching from the first exposed region 810A. The reason is that by performing the etching process so that one side in the z direction faces upward in the vertical direction and the other side in the z direction faces downward in the vertical direction, for example, in the state shown in FIG. 19, an etching solution stays on the side of the main surface 81A to suppress the progress of etching. The etching solution does not remain on the side of the back surface 81B. Therefore, an etching depth D81B advancing from the second exposed region 810B is larger than an etching depth D81A advancing from the first exposed region 810A. Further, as for a separation distance along the x direction of the two island portions 812 (the first die pad 812A and the second die pad 812B) separated by the etching, a separation distance L81B on the side of the back surface 81B is larger than a separation distance L81A on the side of the main surface 81A. In the manufacture of the semiconductor device A1, an etching condition is set so that the separation distance L81A on the side of the main surface 81A is 250 µm or more and 500 µm or less. Under such an etching condition, the angles α1, α2, β1, β2, γ1, and γ2 are set in the semiconductor device A1. Thereafter, the resist 82 is removed to form the lead frame 81 shown in FIG. 22.

Figure 23:
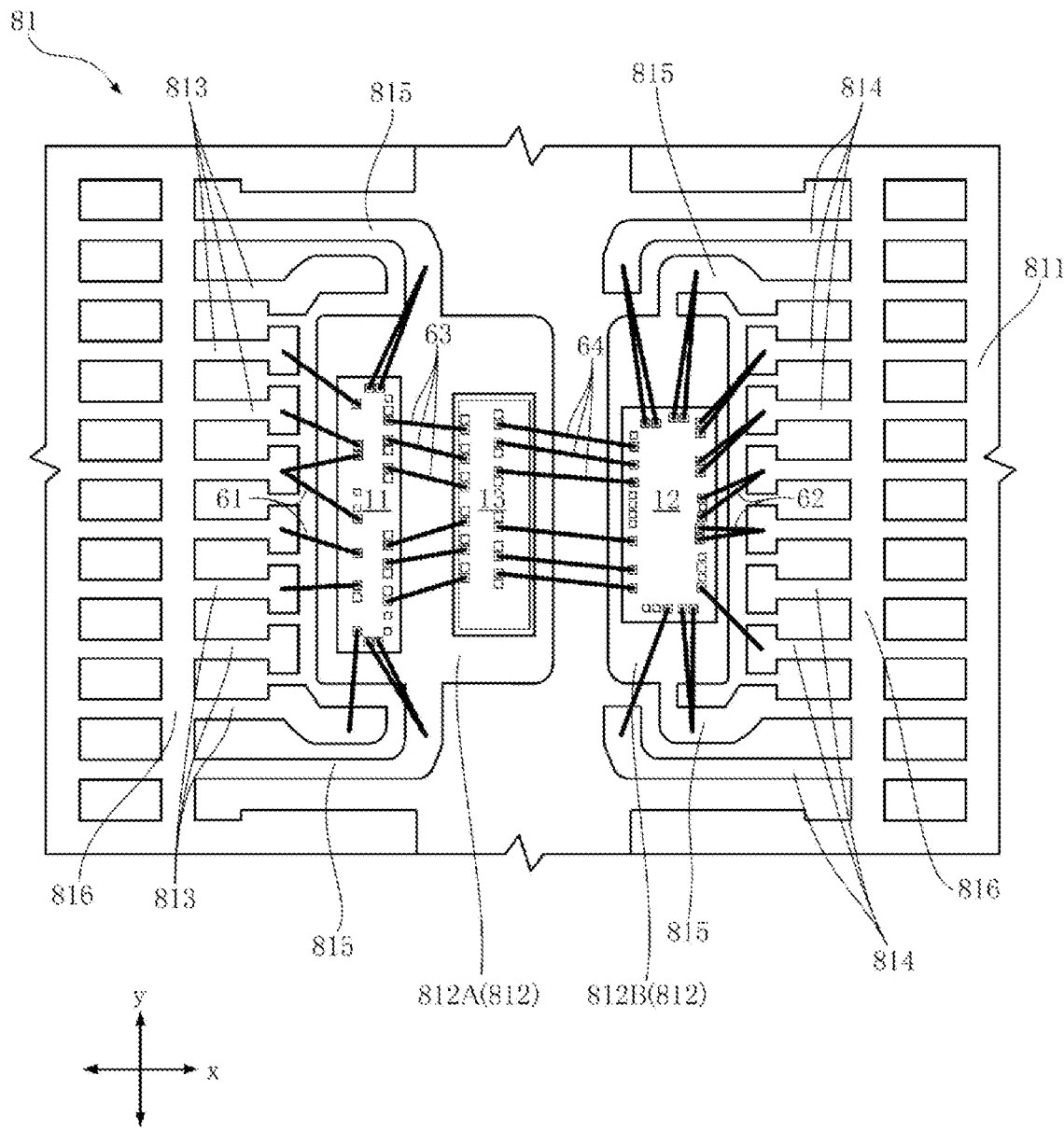
FIG. 23 is a plan view for explaining a process of manufacturing the semiconductor device shown in FIG. 1.

Subsequently, as shown in FIG. 23, the first semiconductor element 11 and the insulating element 13 are bonded to the first die pad 812A by die bonding. In addition, the second semiconductor element 12 is bonded to the second die pad 812B by die bonding. After undergoing these processes, each of the plurality of first wires 61, the plurality of second wires 62, the plurality of third wires 63, and the plurality of fourth wires 64 is formed by wire bonding.

Figure 24:
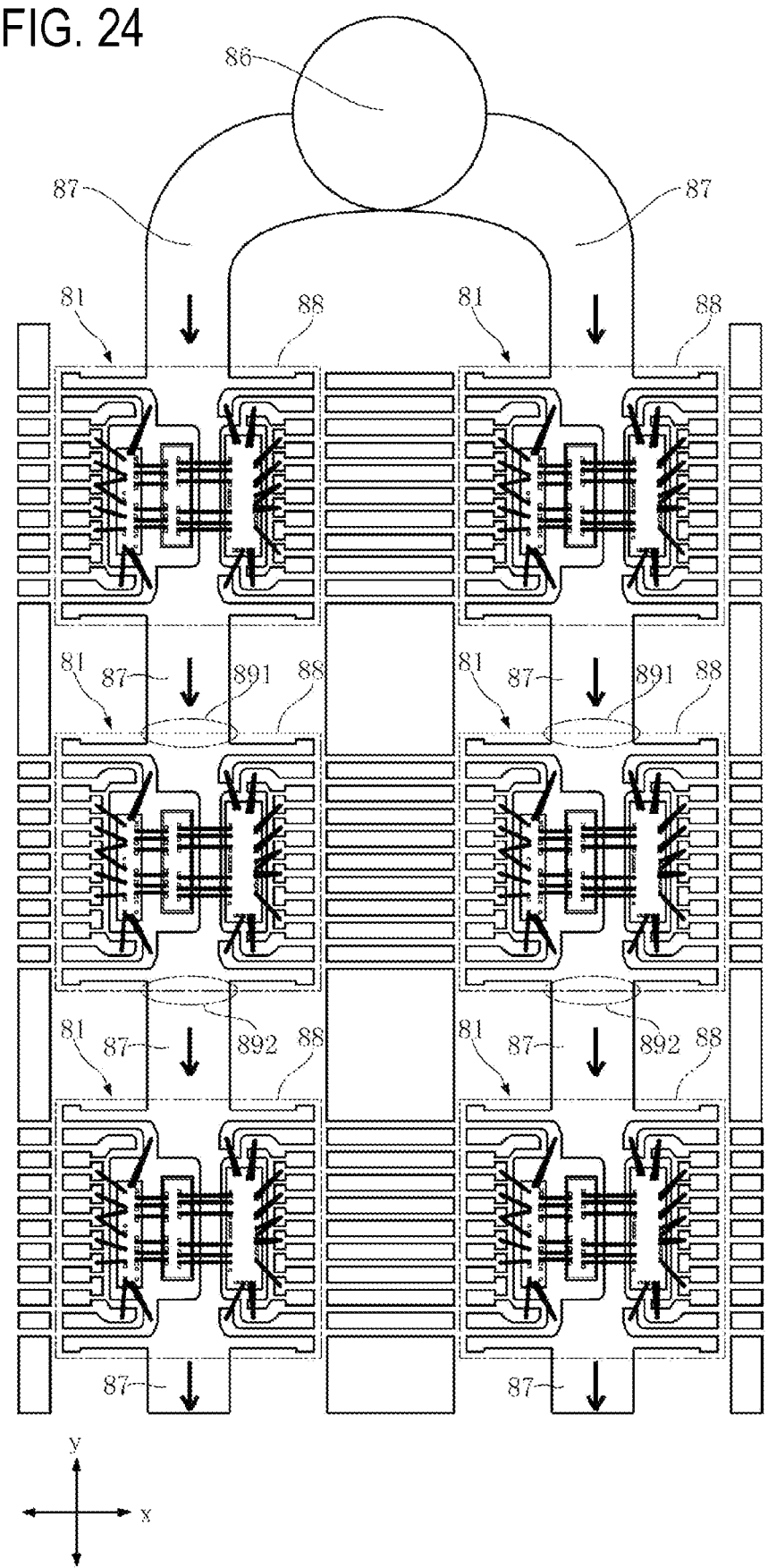
FIG. 24 is a plan view for explaining a process of manufacturing the semiconductor device shown in FIG. 1.

Subsequently, as shown in FIG. 24, the sealing resin 7 is formed. The sealing resin 7 is formed by transfer molding. In this process, the lead frame 81 is housed in a mold having a plurality of cavities 88. At this time, in the lead frame 81, a portion of the conductive support member 2 covered with the sealing resin 7 in the semiconductor device A1 is accommodated in any of the plurality of cavities 88. Thereafter, a fluidized resin flows from a pot 86 into each of the plurality of cavities 88 via a runner 87. A plunger (not shown) is connected to the pot 86. When the plunger is activated, the resin fluidized in the pot 86 flows out toward the runner 87. The lead frame 81 is provided with the first gate 891 and the second gate 892. In each of the plurality of cavities 88, the first gate 891 is an inflow port for the fluidized resin. In each of the plurality of cavities 88, the second gate 892 is an outflow port for the fluidized resin. The first gate 891 is located in the center of each of the plurality of cavities 88 in the x direction. The second gate 892 is located in the center of each of the plurality of cavities 88 in the x direction. As a result, when viewed along the y direction, each of the first gate 891 and the second gate 892 overlaps a gap provided between the first die pad 812A and the second die pad 812B in the x direction, that is, the pad gap 21. After the sealing resin 7 fluidized in the plurality of cavities 88 is solidified, resin burrs located outside of each of the plurality of cavities 88 are removed with high-pressure water or the like. At this time, when resin burrs located at the first gate 891 are removed, the first gate mark 791 is formed on the sealing resin 7. Similarly, when resin burrs located at the second gate 892 are removed, the second gate mark 792 is formed on the sealing resin 7. With the above, the formation of the sealing resin 7 is completed.

Thereafter, the island portions 812 (the first die pad 812$a$ and the second die pad 812$b$), the plurality of first leads 813, the plurality of second leads 814, and the plurality of support leads 815, all of which are connected to one another by the outer frame 811 and the dam bar 816, are appropriately separated by dicing and individualizing.

The semiconductor device A1 is manufactured by undergoing the processes described above. In the above-described manufacturing method, as an example, the lead frame 81 including the island portion 812 is prepared in the preparation process, and the island portion 812 is separated into two portions, that is, the first die pad 812$a$ and the second die pad 812$b$, in the etching process. However, the present disclosure is not limited thereto. For example, the lead frame 81 having a rectangular shape in a plan view may be prepared in the preparation process, and the outer frame 811, the first die pad 812$a$, the second die pad 812$b$, the plurality of first leads 813, the plurality of second leads 814, the plurality of support leads 815, and the dam bar 816 may be collectively formed in the lead frame 81 by the resist forming process and the etching process.

Next, operative effects of the semiconductor device A1 will be described.

The semiconductor device A1 includes the insulating element 13 that insulates the first circuit and the second circuit from each other. The first circuit includes the first semiconductor element 11. The second circuit includes the second semiconductor element 12. As a result, when there is a difference between a power supply voltage supplied to the first semiconductor element 11 and a power supply voltage supplied to the second semiconductor element 12, an insulation withstand voltage between the first circuit and the second circuit can be improved. Therefore, according to the semiconductor device A1, it is possible to improve the insulation withstand voltage.

The semiconductor device A1 includes the conductive support member 2 including the first die pad 3 and the second die pad 4. The peripheral edge 36 of the first die pad 3 in a plan view has the first near-angle portion 362 including the first end portion 362A in the y direction, and the first near-angle portion 362 is separated from the second die pad 4 in the x direction toward the first end portion 362A in the y direction. As a result, the electric field strength between the first near-angle portion 362 and the second die pad 4 can be reduced as compared with a case where the first near-angle portion 362 is formed at a right angle in a plan view. That is, the semiconductor device A1 can further improve the insulation withstand voltage. Further, the peripheral edge 46 of the second die pad 4 in a plan view has the second near-angle portion 462 including the second end portion 462A in the y direction, and the second near-angle portion 462 is separated from the first die pad 3 in the x direction toward the second end portion 462A in the y direction. As a result, the electric field strength between the second near-angle portion 462 and the first die pad 3 can be reduced as compared with a case where the second near-angle portion 462 is formed at a right angle in a plan view. Therefore, according to the semiconductor device A1, the insulation withstand voltage can be further improved.

The semiconductor device A1 includes the conductive support member 2 including the first die pad 3 and the second die pad 4. The first die pad 3 has the first main surface 31 that faces the z direction and mounts the first semiconductor element 11, and the first back surface 32 that faces the opposite side of the first main surface 31 in the z direction. The second die pad 4 has the second main surface 41 that faces the z direction and mounts the second semiconductor element 12, and the second back surface 42 that faces the opposite side of the second main surface 41 in the z direction. When viewed along the y direction, the separation distance d2 (see FIG. 11) between the first back surface 32 and the second back surface 42 is larger than the separation distance d1 (see FIG. 11) between the first main surface 31 and the second main surface 41. As a result, when viewed along the y direction, the electric field strength at the ends of the first die pad 3 and the second die pad 4 on the side where the first main surface 31 and the second main surface 41 are located in the z direction is stronger than the electric field strength at the ends thereof on the side where the first back surface 32 and the second back surface 42 are located in the z direction. Therefore, the semiconductor device A1 can improve the dielectric strength of the semiconductor device A1 by adjusting the separation distance between the first main surface 31 and the second main surface 41. Further, in the process of forming the sealing resin 7 (see FIG. 24) in the manufacturing process of the semiconductor device A1, depending on the position of each of the first gate 891 into which the fluidized resin flows and the second gate 892 from which the fluidized resin flows out, the fluidized resin may not be sufficiently filled in the pad gap 21 on the sides of the first back surface 32 and second back surface 42 rather than on the sides of the first main surface 31 and second main surface 41. In this case, the insulation withstand voltage may decrease on the sides of the first back surface 32 and second back surface 42. Therefore, by setting the separation distance d2 to be larger than the separation distance d1, it is possible to promote the outflow of the resin on the sides of the first back surface 32 and second back surface 42 and sufficiently fill the resin on the sides of the first back surface 32 and second back surface 42. Therefore, according to the semiconductor device A1, the insulation withstand voltage can be further improved.

In the semiconductor device A1, the separation distance d1 (see FIG. 11) between the first main surface 31 and the second main surface 41 in the x direction is 250 μm or more and 500 μm or less. On the other hand, when the separation distance d1 is larger than 500 μm, the etching in the above-described etching process becomes over-etching. When viewed along the y direction, in an over-etched state, the angle of each of the first main surface side protrusion 333, the first back surface side protrusion 334, the second main surface side protrusion 433, and the second back surface side protrusion 434 is reduced. As a result, the electric field strength between the first main surface side protrusion 333 and the second main surface side protrusion 433 and the electric field strength between the first back surface side protrusion 334 and the second back surface side protrusion 434 become stronger, which causes a decrease in the insulation withstand voltage of the semiconductor device A1. On the other hand, when the separation distance d1 is smaller than 250 μm, the etching in the above-described etching process becomes under-etching. In an under-etched state, the separation distance d1 is reduced. As a result, the electric field strength between the first main surface 31 and the second main surface 41 becomes stronger, which causes a decrease in the insulation withstand voltage of the semiconductor device A1. Therefore, in the semiconductor device A1, by setting the separation distance d1 to 250 μm or more and 500 μm or less, it is possible to suppress a decrease in the insulation withstand voltage of the semiconductor device A1.

In the semiconductor device A1, the separation distance of the closest portion between the first die pad 3 and the second die pad 4 is smaller than the separation distance of the closest portion between the plurality of first terminals 51 and the first die pad 3 in a plan view and the separation distance of the closest portion between the plurality of second terminals 52 and the first die pad 3 in a plan view. According to this configuration, the conductive support member 2 has the relationship in which the first die pad 3 and the second die pad 4 are closest to each other between a portion constituting the first circuit and a portion constituting the second circuit. Therefore, by improving the insulation withstand voltage between the first die pad 3 and the second die pad 4, the insulation withstand voltage of the semiconductor device A1 can be improved.

In the semiconductor device A1, the power supply voltage supplied to the second circuit including the second semiconductor element 12 and the second die pad 4 is larger than the power supply voltage supplied to the first circuit including the first semiconductor element 11 and the first die pad 3. For example, the power supply voltage supplied to the first circuit is about 5 V, whereas the power supply voltage supplied to the second circuit is 600 V or more. When there is a significant potential difference in the supplied power supply voltage as described above, in addition to mounting the insulating element 13, further improving the insulation withstand voltage of the semiconductor device A1 is desirable in improving the reliability of the semiconductor device A1.

In the semiconductor device A1, the plurality of first terminals 51 is exposed from the first side surface 73. The plurality of second terminals 52 is exposed from the second side surface 74. Here, the first die pad 3, the second die pad 4, the plurality of first terminals 51, and the plurality of second terminals 52 are all constituent members of the conductive support member 2. In this case, the conductive support member 2 such as an island support is not exposed from each of the third side surface 75 and the fourth side surface 76. With this configuration, a metal portion of the conductive support member 2 exposed from the sealing resin 7 does not exist in the vicinity of the plurality of second terminals 52 to which a higher voltage is applied than the plurality of first terminals 51. Therefore, according to the semiconductor device A1, the insulation withstand voltage can be further improved.

In the method of manufacturing the semiconductor device A1, the first die pad 812*a* and the second die pad 812*b* are formed by the above-described etching process. That is, the gap between the first die pad 3 and the second die pad 4 is formed by etching. According to this configuration, the separation distance d1 (see FIG. 11) can be set more accurately than when the gap is formed by punching. Therefore, it is easy to set the separation distance d1 to 250 μm or more and 500 μm or less. In particular, in the method of manufacturing the semiconductor device A1, the outer frame 811, the island portion 812, the plurality of first leads 813, the plurality of second leads 814, the plurality of support leads 815, the dam bar 816, and the like are formed in the lead frame 81 by a punching process. The punching process is faster and cheaper than the etching process. Therefore, by performing the etching process only in the gap between the first die pad 3 and the second die pad 4, which requires processing accuracy, the manufacturing efficiency of the semiconductor device A1 can be improved and the manufacturing costs of the semiconductor device A1 can be reduced.

Figure 25:
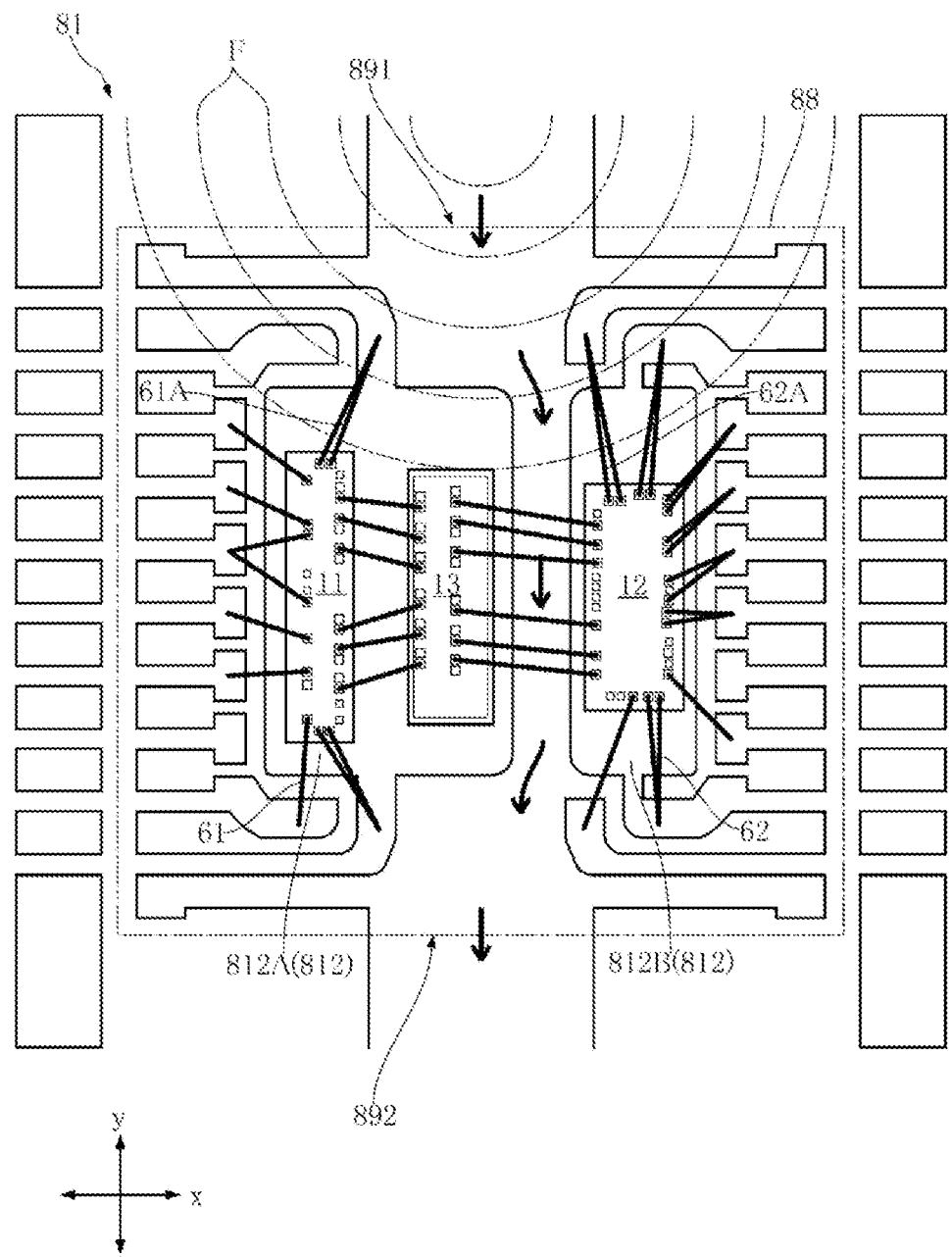
FIG. 25 is a plan view for explaining the operation and effects of the semiconductor device shown in FIG. 1.

In the semiconductor device A1, the first side surface 73 of the sealing resin 7 is formed with the first gate mark 791 having a surface roughness larger than that of the other regions of the first side surface 73. The first gate mark 791 is a trace derived from the first gate 891 in which the fluidized resin flows into each of the plurality of cavities 88 in the process of forming the sealing resin 7 (see FIG. 24) in the manufacturing process of the semiconductor device A1. When viewed along the y direction, the first gate mark 791 overlaps the pad gap 21 provided between the first die pad 3 and the second die pad 4 in the x direction. As a result, as shown in FIG. 25, the resin that has flowed into each of the plurality of cavities 88 from the first gate 891 flows toward the pad gap 21 at a shorter distance. Therefore, since the flow rate of the resin flowing through the pad gap 21 increases, an average density of the first resin portion 7A of the sealing resin 7 penetrating the pad gap 21 along the z direction becomes higher. Therefore, according to the semiconductor device A1, the insulation withstand voltage can be further improved.

In the semiconductor device A1, the second side surface 74 of the sealing resin 7 is formed with the second gate mark 792 having a surface roughness larger than that of the other regions of the second side surface 74. The second gate mark 792 is a trace derived from the second gate 892 in which the fluidized resin flows out of each of the plurality of cavities 88 in the process of forming the sealing resin 7 (see FIG. 24) in the manufacturing process of the semiconductor device A1. When viewed along the y direction, the second gate mark 792 overlaps the pad gap 21 in the x direction. As a result, a main flow of the resin in each of the plurality of cavities 88 flows along arrows shown in FIG. 25. Therefore, since the flow rate of the resin flowing through the pad gap 21 is further increased, the average density of the first resin portion 7A of the sealing resin 7 is further increased. Therefore, according to the semiconductor device A1, the insulation withstand voltage can be further improved. As a result, in the sealing resin 7, the average void amount per unit volume of the first resin portion 7A is smaller than the average void amount per unit volume of the second resin portion 7B.

The semiconductor device A1 further includes the first semiconductor element 11 and the plurality of first wires 61 bonded to one of the plurality of first terminals 51. At least one of the plurality of first wires 61 has an angle formed by the first wire 61 with respect to the x direction, which is larger than an angle formed by the first wire 61 with respect to the y direction. Here, as shown in FIG. 25, when the fluidized resin flows from the first gate 891 into each of the plurality of cavities 88, the resin spreads along a flow F in each of the plurality of cavities 88. Thus, by adopting this configuration, it is possible to suppress a displacement of the first wire 61 in the x direction due to the flow of the resin. Therefore, it is possible to avoid the first wire 61 from being located extremely close to the second circuit. This operative effect is particularly beneficial to the specific first wire 61A which is located closest to the first gate mark 791 and has the longest length among the plurality of first wires 61.

The semiconductor device A1 further includes the second semiconductor element 12 and the plurality of second wires 62 bonded to one of the plurality of second terminals 52. At least one of the plurality of second wires 62 has an angle formed by the second wire 62 with respect to the x direction, which is larger than an angle formed by the second wire 62 with respect to the y direction. As a result, for the same reason as described above, it is possible to suppress a displacement of the second wire 62 in the x direction due to the flow of the fluidized resin. Therefore, it is possible to avoid the second wire 62 from being located extremely close to the first circuit. This operative effect is particularly beneficial for the specific second wire 62A which is located closest to the first gate mark 791 and has the longest length among the plurality of second wires 62.

Second Embodiment

Figure 26:
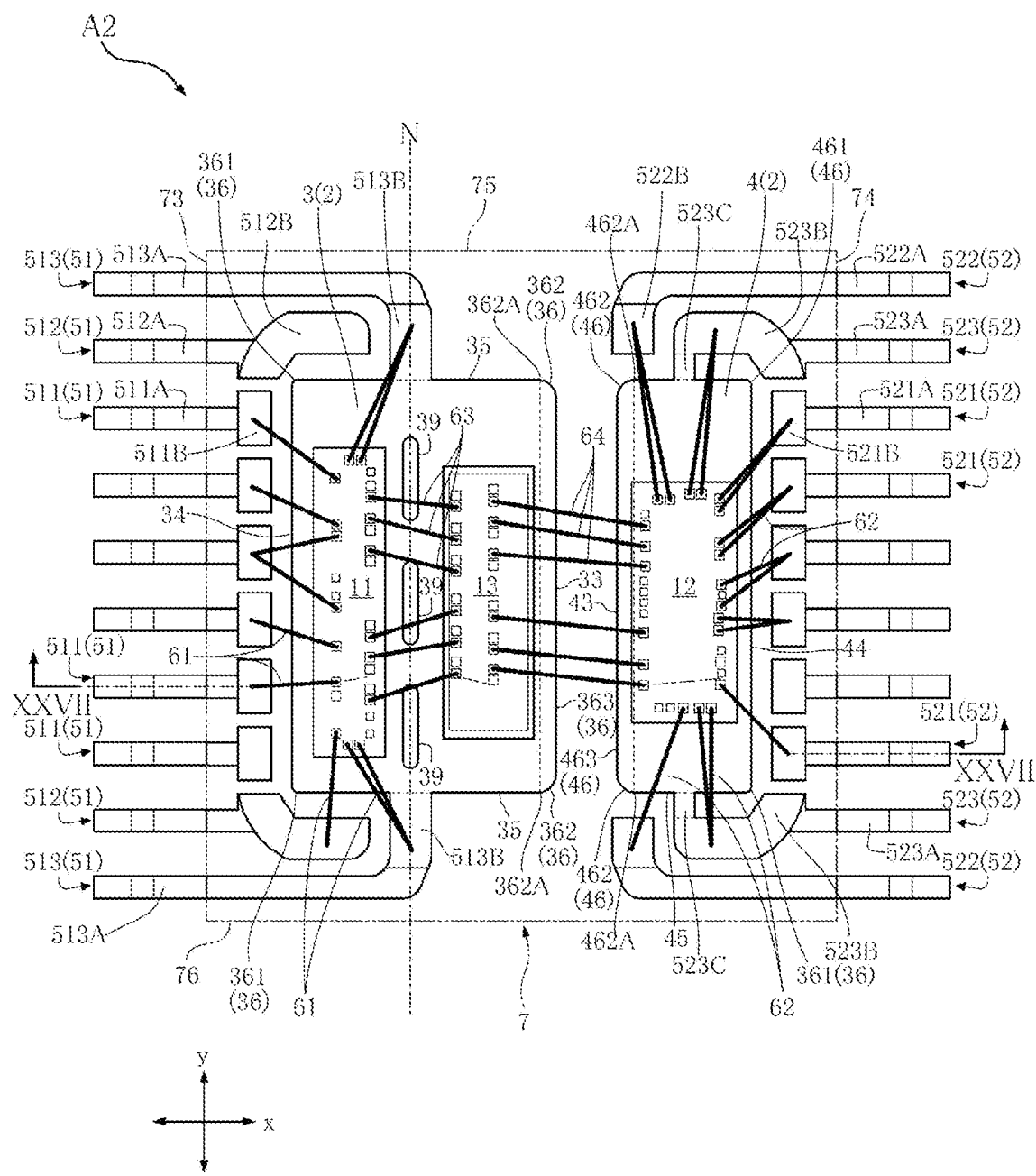
FIG. 26 is a plan view of a semiconductor device according to a second embodiment of the present disclosure that is transparent to a sealing resin.

A semiconductor device A2 according to a second embodiment of the present disclosure will be described with reference to FIGS. 26 and 27. In these figures, elements that are the same as or similar to those of the above-described semiconductor device A1 are denoted by the same reference numerals, and redundant explanation thereof will be omitted. Here, for convenience of understanding, FIG. 26 is transparent to the sealing resin 7. In FIG. 26, the sealing resin 7 to which FIG. 26 is transparent is shown by an imaginary line.

In the semiconductor device A2, a configuration of the first die pad 3 is different from the configuration thereof in the above-described semiconductor device A1.

Figure 27:
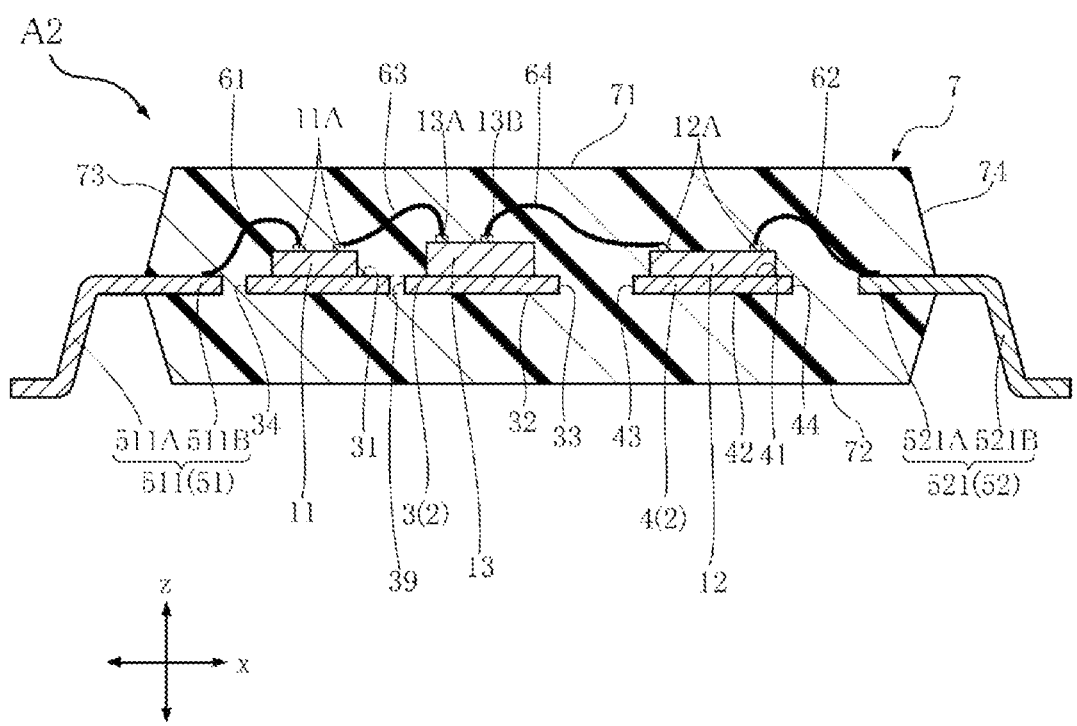
FIG. 27 is a cross-sectional view taken along line XXVII-XXVII of FIG. 26.

As shown in FIGS. 26 and 27, a plurality of holes 39 are formed in the first die pad 3. Each of the plurality of holes 39 is formed in a region of the first die pad 3 located between the first semiconductor element 11 and the insulating element 13 in the x direction. The number of holes 39 is not particularly limited, but in the semiconductor device A2, three holes 39 are formed. Each hole 39 is an elongated hole extending in the y direction. A shape of each hole 39 in a plan view can be freely set. As shown in FIG. 26, in the first die pad 3, the pair of first support terminals 513 and the plurality of holes 39 are arranged on a straight line N (dashed line) along the y direction.

Next, operative effects of the semiconductor device A2 will be described.

The semiconductor device A2 includes the insulating element 13 that insulates the first circuit and the second circuit from each other. The first circuit includes the first semiconductor element 11. The second circuit includes the second semiconductor element 12. Therefore, the semiconductor device A2 can also improve the insulation withstand voltage. Further, the semiconductor device A2 has the same effects as the semiconductor device A1 by adopting the same configuration as the semiconductor device A1.

In the semiconductor device A2, the holes 39 are formed in the first die pad 3. Since an area of the first die pad 3 in a plan view is wider than an area of the second die pad 4 in a plan view, voids are likely to be generated in a portion of the sealing resin 7 located in the vicinity of the first die pad 3. Therefore, by forming the holes 39 in the first die pad 3, molten resin injected into the mold in forming the sealing resin 7 can be sufficiently filled. That is, the semiconductor device A2 can suppress generation of voids in the sealing resin 7 as compared with a case where the first die pad 3 is not provided with the holes 39.

Third Embodiment

Figure 28:
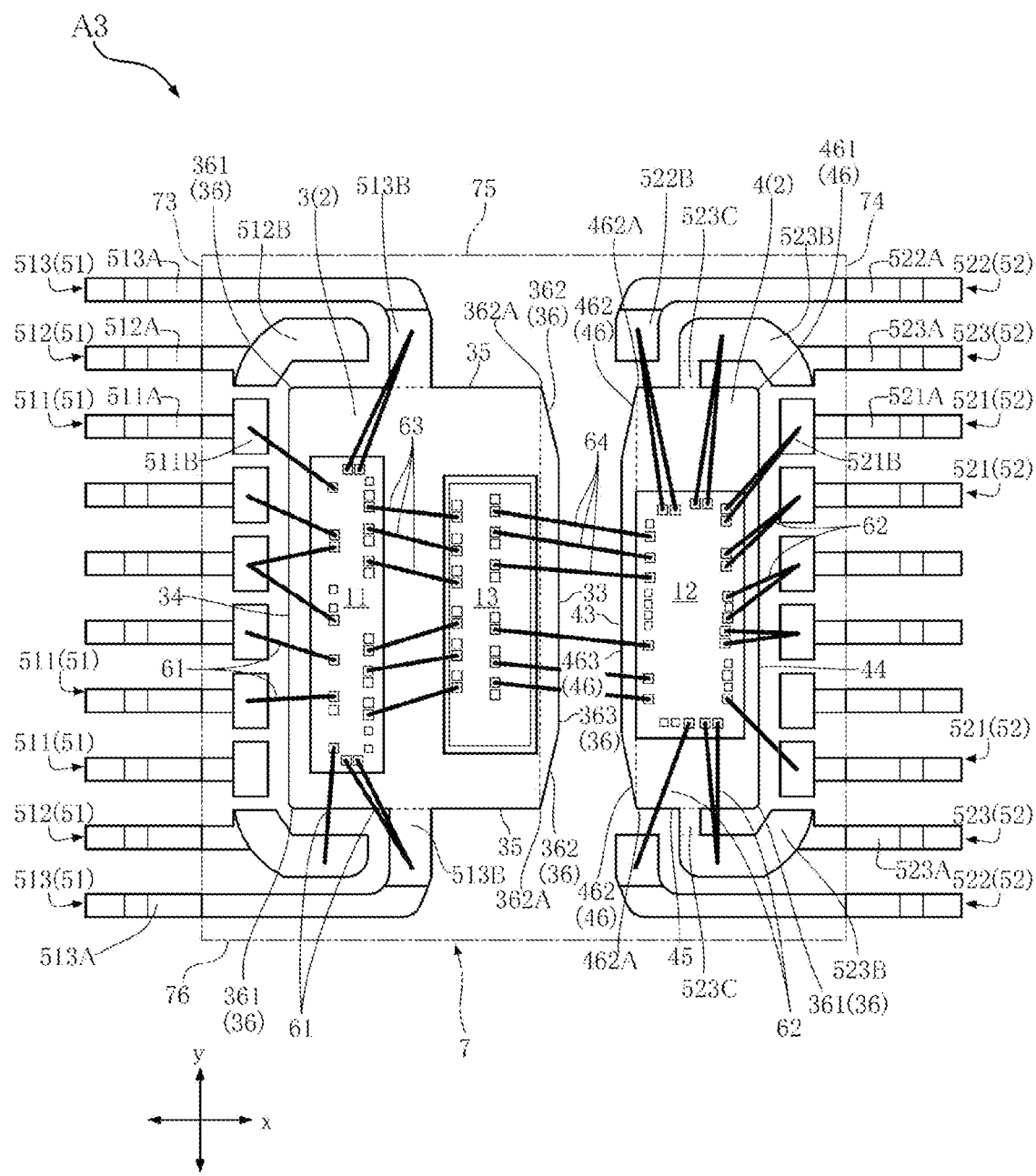
FIG. 28 is a plan view of a semiconductor device according to a third embodiment of the present disclosure that is transparent to a sealing resin.

A semiconductor device A3 according to a third embodiment of the present disclosure will be described with reference to FIG. 28. In this figure, elements that are the same as or similar to those of the above-described semiconductor device A1 are denoted by the same reference numerals, and redundant explanation thereof will be omitted. Here, for convenience of understanding, FIG. 28 is transparent to the sealing resin 7. In FIG. 28, the sealing resin 7 to which FIG. 28 is transparent is shown by an imaginary line.

In the semiconductor device A3, a configuration of each of the first die pad 3 and the second die pad 4 is different from the configuration thereof in the above-described semiconductor device A1.

As shown in FIG. 28, each of the paired first near-angle portions 362 and the paired second near-angle portions 462 is formed linearly in a plan view. Each of the paired first near-angle portions 362 is inclined with respect to the y direction. In the semiconductor device A3, each of the first near-angle portions 362 is inclined so as to be separated from the second die pad 4 in the x direction toward the first end portion 362A in the y direction. Each of the paired second near-angle portions 462 is inclined with respect to the y direction. In the semiconductor device A3, each of the second near-angle portions 462 is inclined so as to be separated from the first die pad 3 in the x direction toward the second end portion 462A in the y direction. With such a configuration, a gap in the x direction between the paired first near-angle portions 362 and the paired second near-angle portions 462 is formed in a tapered shape.

In the semiconductor device A3, a line segment connecting the paired first end portions 362A in a plan view may be located closer to the second die pad 4 than the insulating element 13 in the x direction, or may overlap the insulating element 13 in the x direction. However, when the line segment is located closer to the second die pad 4 than the insulating element 13 in the x direction, it is easier to make an angle formed by each of the first near-angle portion 362 and the first near-end edge 363 in a plan view larger. Further, in a plan view, a line segment connecting the paired second end portions 462A may overlap the second semiconductor element 12 in the x direction, or may be located closer to the first die pad 3 than the second semiconductor element 12. However, when the line segment is located closer to the first die pad 3 than the second semiconductor element 12, it is easy to make an angle formed by each of the second near-angle portion 462 and the second near-end edge 463 in a plan view larger.

Next, operative effects of the semiconductor device A3 will be described.

The semiconductor device A3 includes the insulating element 13 that insulates the first circuit and the second circuit from each other. The first circuit includes the first semiconductor element 11. The second circuit includes the second semiconductor element 12. Therefore, the semiconductor device A3 can also improve the insulation withstand voltage. Further, the semiconductor device A3 has the same effects as the semiconductor device A1 by adopting the same configuration as the semiconductor device A1.

Fourth Embodiment

A semiconductor device A4 according to a fourth embodiment of the present disclosure will be described with reference to FIGS. 29 and 30. In these figures, elements that are the same as or similar to those of the above-described semiconductor device A1 are denoted by the same reference numerals, and redundant explanation thereof will be omitted.

In the semiconductor device A4, a configuration of the sealing resin 7 is different from the configuration thereof in the above-described semiconductor device A1.

Figure 29:
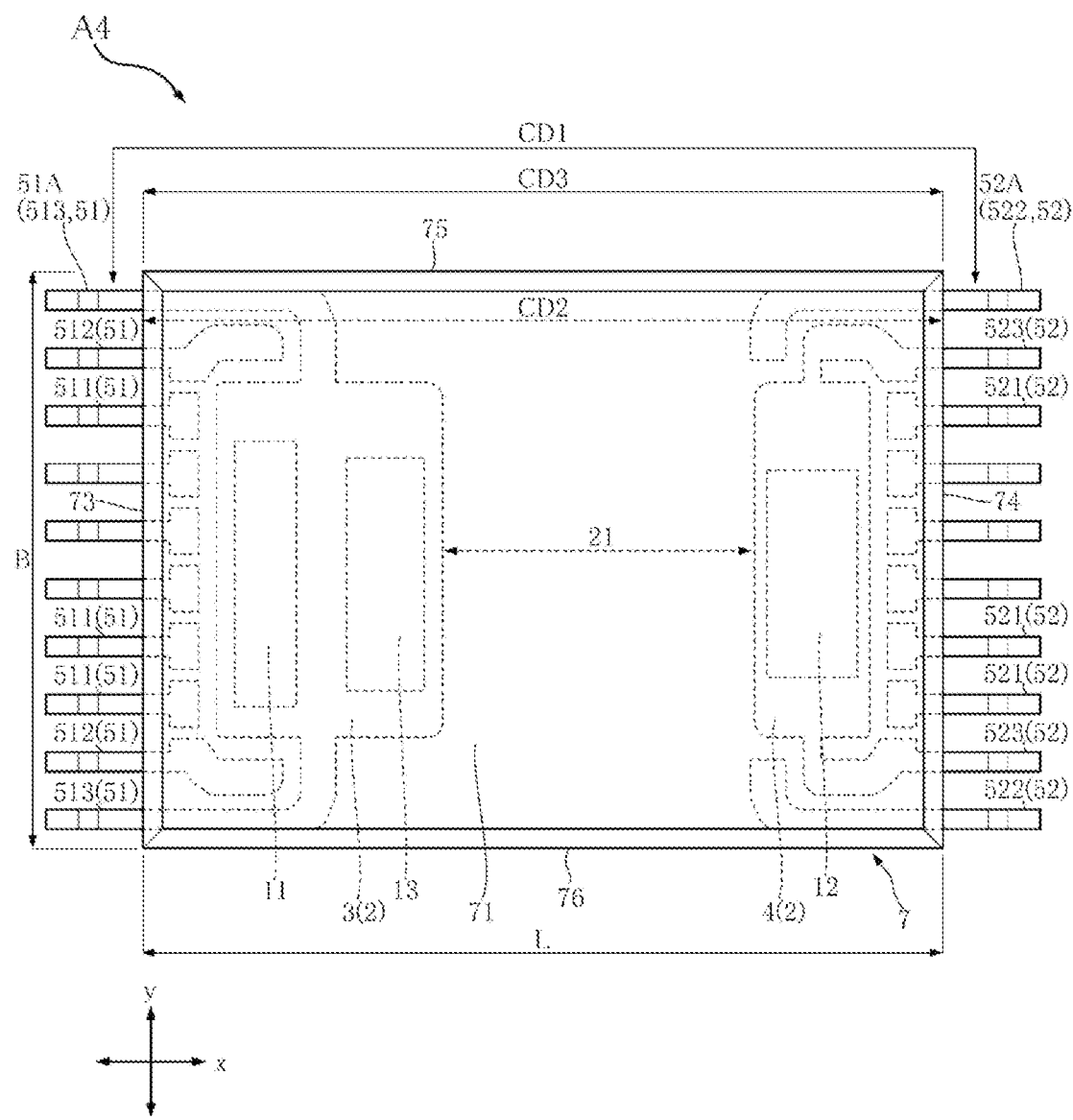
FIG. 29 is a plan view of a semiconductor device according to a fourth embodiment of the present disclosure.

As shown in FIG. 29, the plurality of first terminals 51 includes a first edge terminal 51A. The first edge terminal 51A is exposed from the first side surface 73 of the sealing resin 7 and is located closest to the third side surface 75 of the sealing resin 7. In the semiconductor device A4, the first edge terminal 51A corresponds to one of the paired first support terminals 513. The plurality of second terminals 52 includes a second edge terminal 52A. The second edge terminal 52A is exposed from the second side surface 74 of the sealing resin 7 and is located closest to the third side surface 75. In the semiconductor device A4, the second edge terminal 52A corresponds to one of the paired second side terminals 522.

Figure 30:
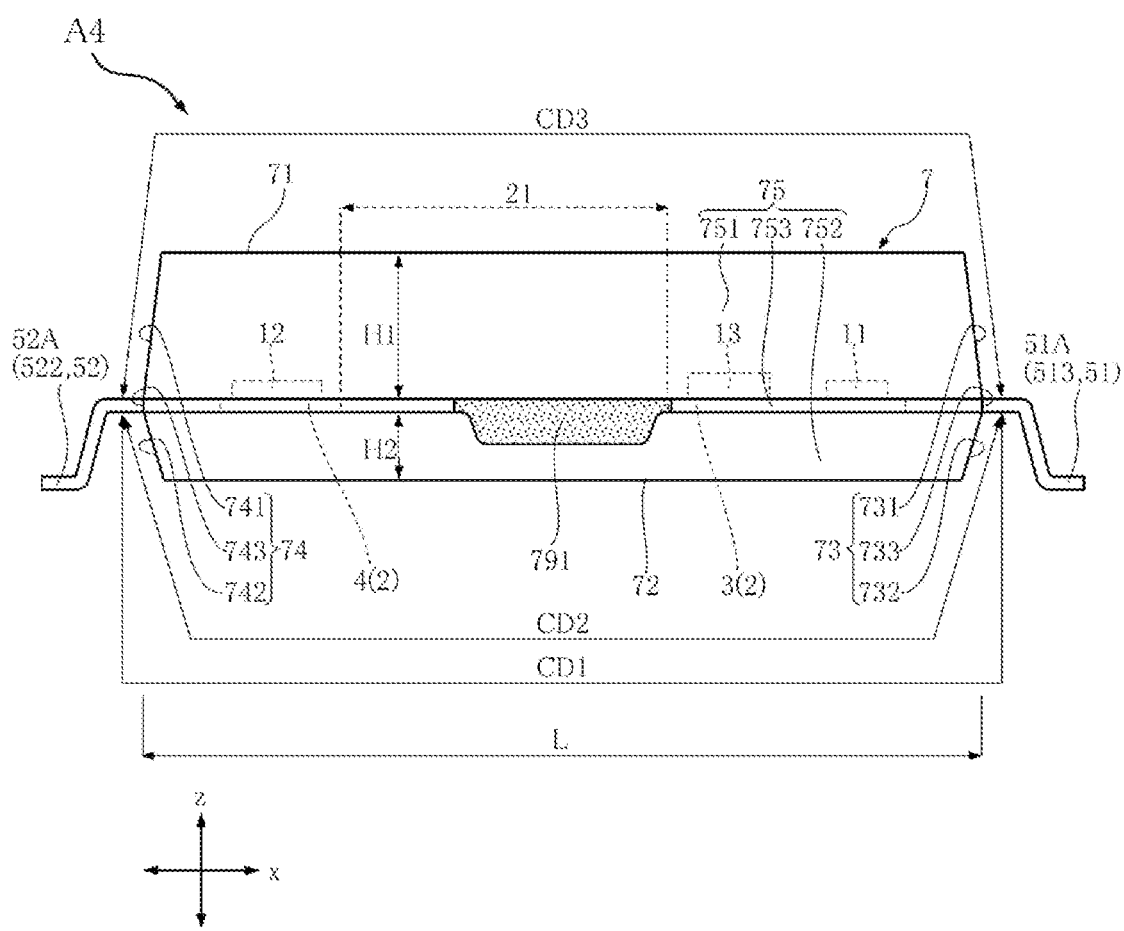
FIG. 30 is a rear view of the semiconductor device shown in FIG. 29.

In FIGS. 29 and 30, a first creepage distance CD1, a second creepage distance CD2, and a third creepage distance CD3 are shown. The first creepage distance CD1 is the shortest distance from the first edge terminal 51A to the second edge terminal 52A along the first side surface 73 of the sealing resin 7, the third side surface 75 of the sealing resin 7, and the second side surface 74 of the sealing resin 7. The second creepage distance CD2 is the shortest distance from the first edge terminal 51A to the second edge terminal 52A along the first side surface 73, the bottom surface 72 of the sealing resin 7, and the second side surface 74. The third creepage distance CD3 is the shortest distance from the first edge terminal 51A to the second edge terminal 52A along the first side surface 73, the top surface 71 of the sealing resin 7, and the second side surface 74. The first creepage distance CD1 is shorter than the second creepage distance CD2. The third creepage distance CD3 is longer than the second creepage distance CD2. Therefore, a length relationship among the first creepage distance CD1, the second creepage distance CD2, and the third creepage distance CD3 is such that the first creepage distance CD1<the second creepage distance CD2<the third creepage distance CD3.

As shown in FIG. 29, in a plan view, a dimension of the peripheral edge L of the sealing resin 7 along the x direction is larger than a dimension of the peripheral edge B of the sealing resin 7 along the y direction. The dimension of the peripheral edge L may be 0.75 times or more and 3 times or less than the dimension of the peripheral edge B.

As shown in FIG. 30, in the z direction, a shortest distance H1 from the first die pad 3 to the top surface 71 of the sealing resin 7 is larger than a shortest distance H2 from the first die pad 3 to the bottom surface 72 of the sealing resin 7. This is the main reason why the third creepage distance CD3 is longer than the second creepage distance CD2.

Next, operative effects of the semiconductor device A4 will be described.

The semiconductor device A4 includes the insulating element 13 that insulates the first circuit and the second circuit from each other. The first circuit includes the first semiconductor element 11. The second circuit includes the second semiconductor element 12. Therefore, the semiconductor device A4 can also improve the insulation withstand voltage. Further, the semiconductor device A4 has the same effects as the semiconductor device A1 by adopting the same configuration as the semiconductor device A1.

In the semiconductor device A4, the first creepage distance CD1 is shorter than the second creepage distance CD2. In this case, by increasing the dimension of the peripheral edge L shown in FIG. 29, the first creepage distance CD1 becomes longer. As a result, the insulation withstand voltage of the semiconductor device A4 can be further improved.

In the semiconductor device A4, in the z direction, the shortest distance H1 from the first die pad 3 to the top surface 71 of the sealing resin 7 is longer than the shortest distance H2 from the first die pad 3 to the bottom surface 72 of the sealing resin 7. As a result, a coating thickness of the sealing resin 7 for each of the first semiconductor element 11, the second semiconductor element 12, the insulating element 13, the first die pad 3, the second die pad 4, the plurality of first wires 61, the plurality of second wires 62, the plurality of third wires 63, and the plurality of fourth wires 64 can be made larger. Therefore, the insulation withstand voltage of the semiconductor device A4 can be further improved.

Fifth Embodiment

A semiconductor device A5 according to a fifth embodiment of the present disclosure will be described with reference to FIGS. 31 to 34. In these figures, elements that are the same as or similar to those of the above-described semiconductor device A1 are denoted by the same reference numerals, and redundant explanation thereof will be omitted.

In the semiconductor device A5, a configuration of the sealing resin 7 is different from the configuration thereof in the above-described semiconductor device A1.

Figure 32:
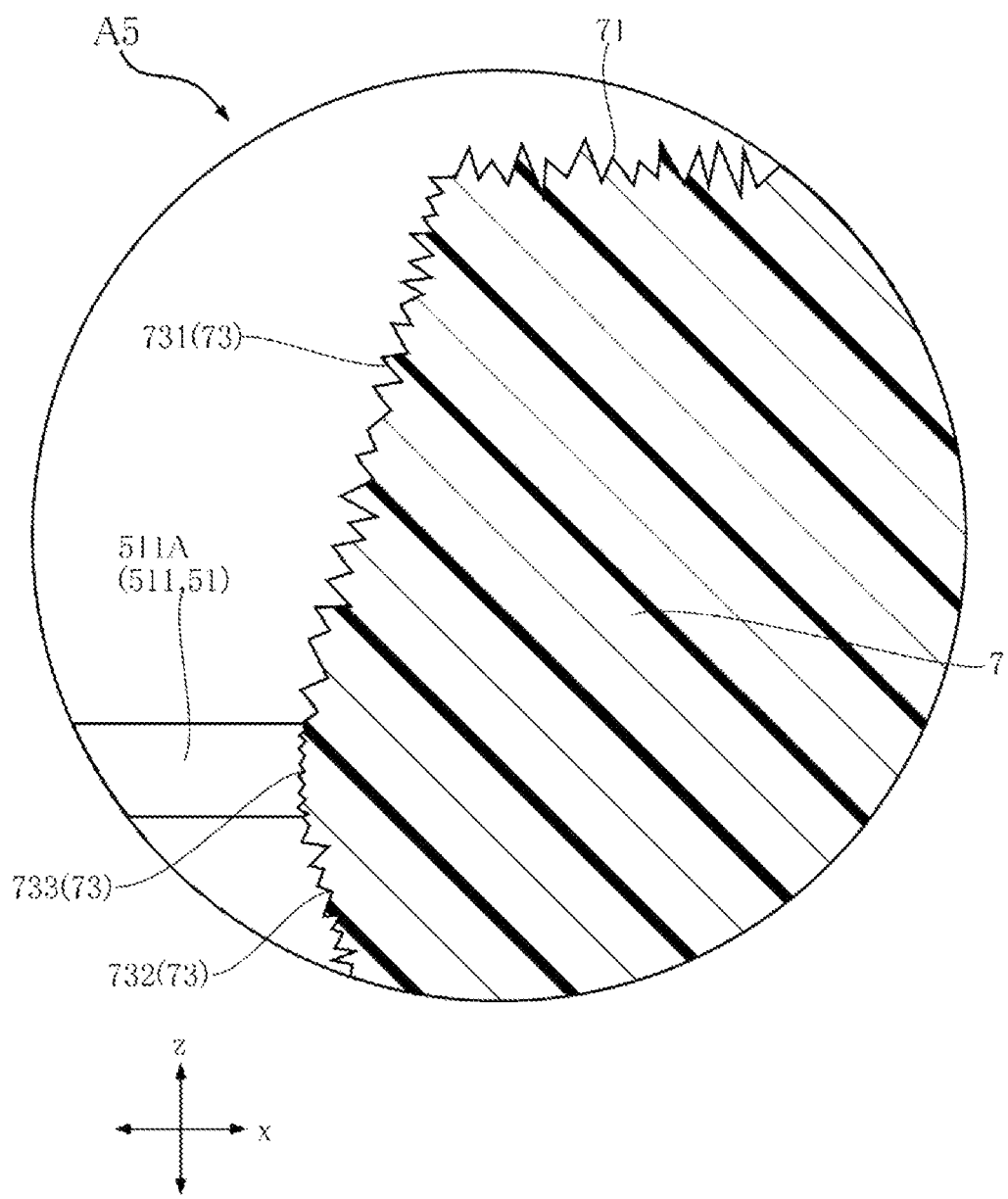
FIG. 32 is a cross-sectional view taken along line XXXII-XXXII of FIG. 31.
Figure 33:
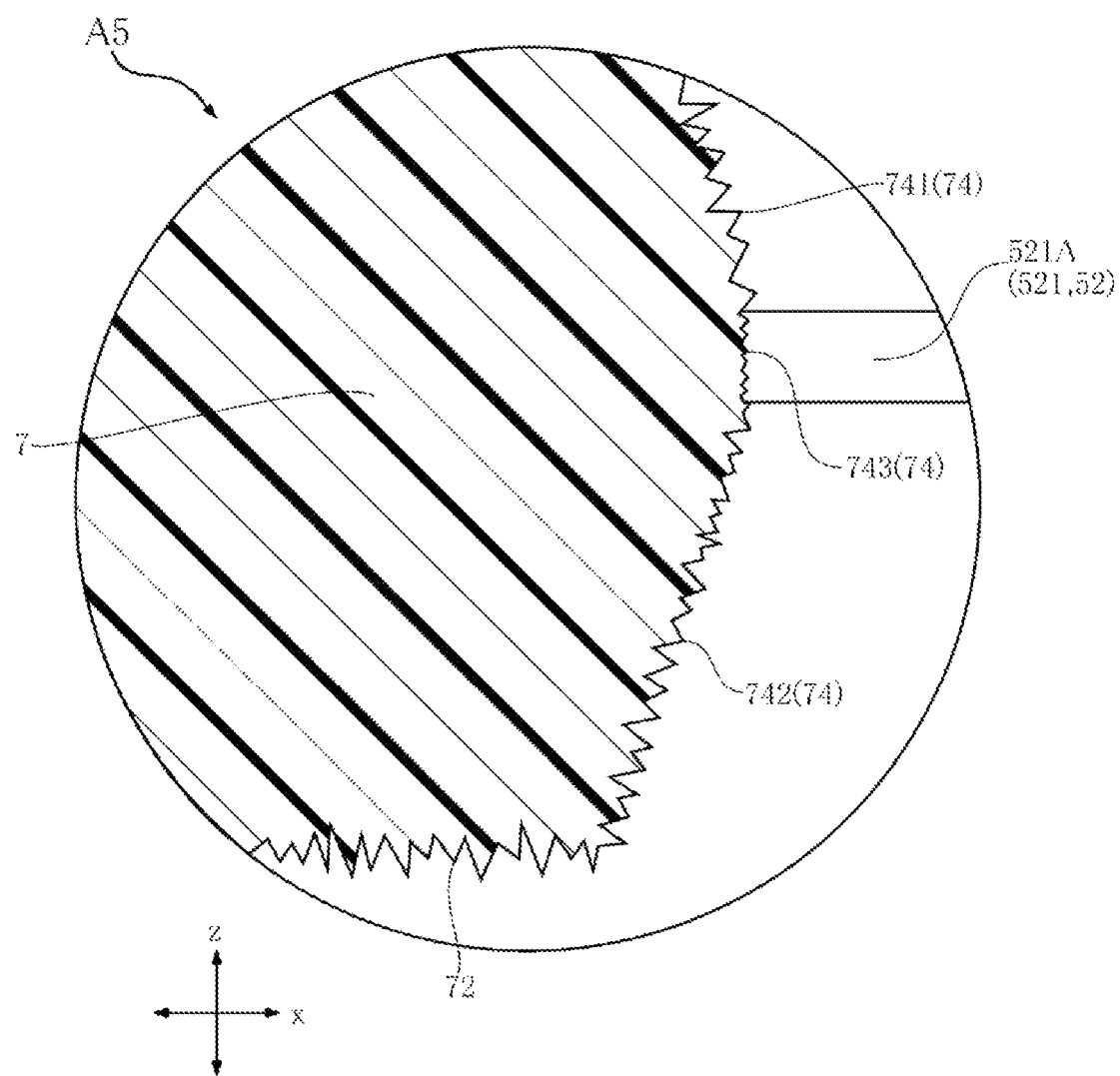
FIG. 33 is a cross-sectional view taken along line XXXIII-XXXIII of FIG. 31.

As shown in FIGS. 32 and 33, a surface roughness of each of the top surface 71, the bottom surface 72, the first side surface 73, and the second side surface 74 of the sealing resin 7 is larger than that in the case of the semiconductor device A1. Therefore, a surface area of the sealing resin 7 is larger than the surface area of the sealing resin 7 of the semiconductor device A1. The surface roughness of each of the top surface 71, the bottom surface 72, the first region 731 of the first side surface 73, and the second region 732 of the first side surface 73 is larger than the surface roughness of the third region 733 of the first side surface 73. Further, the surface roughness of each of the top surface 71, the bottom surface 72, the fourth region 741 of the second side surface 74, and the fifth region 742 of the second side surface 74 is also larger than the surface roughness of the sixth region 743 of the second side surface 74. The surface roughness of each of the top surface 71 and the bottom surface 72 may be 5 μmRz or more and 20 μmRz or less.

Figure 31:
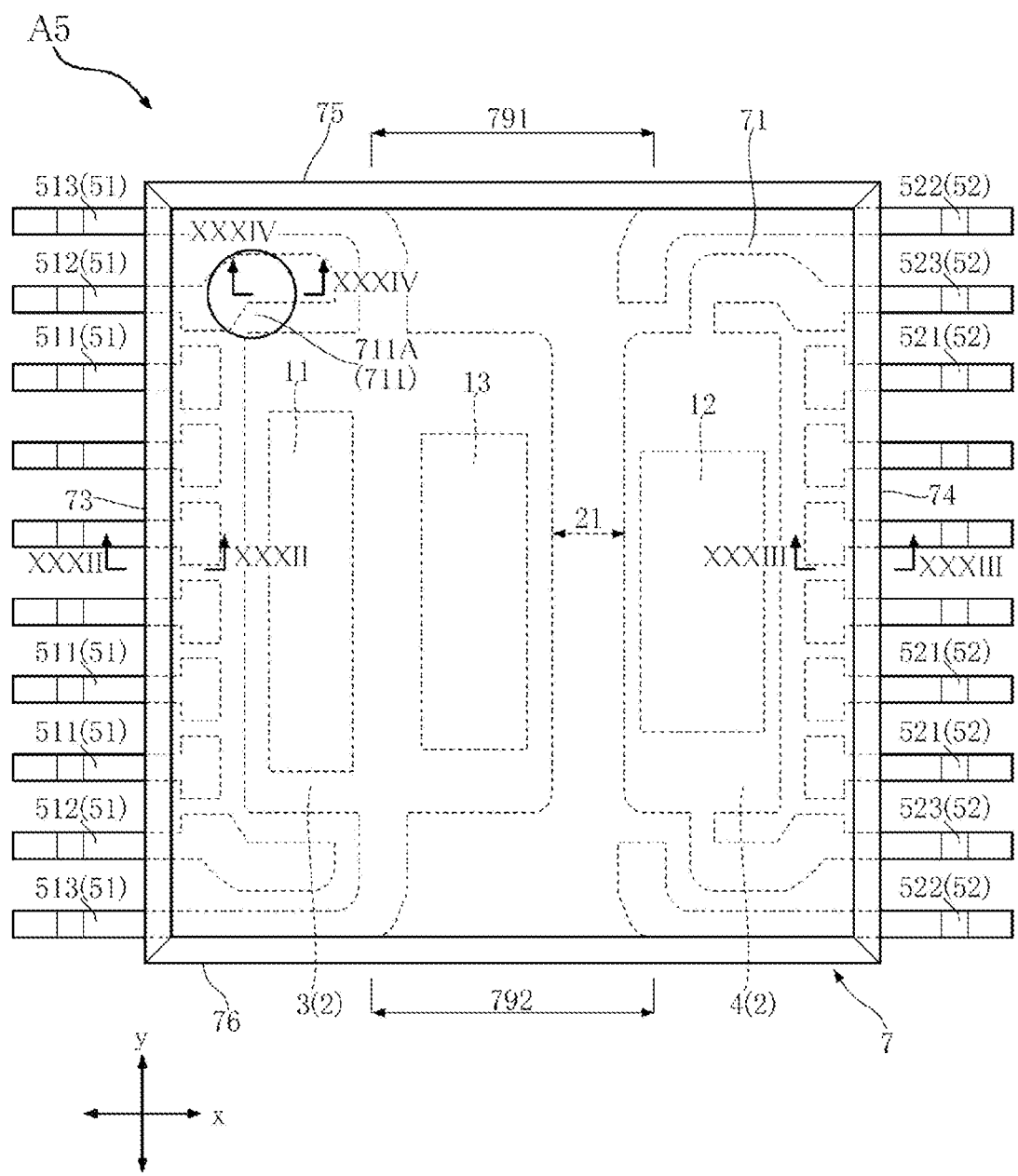
FIG. 31 is a plan view of a semiconductor device according to a fifth embodiment of the present disclosure.
Figure 34:
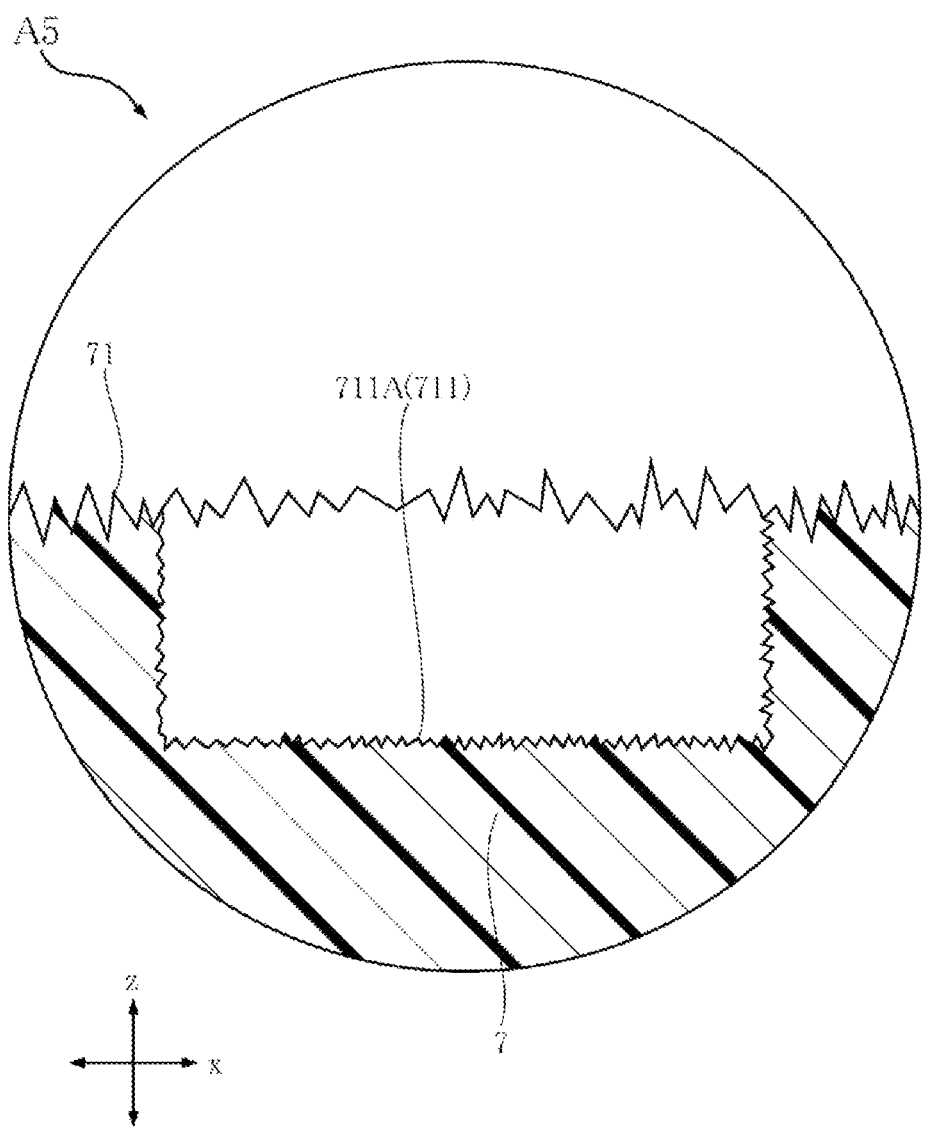
FIG. 34 is a cross-sectional view taken along line XXXIV-XXXIV of FIG. 31.

As shown in FIGS. 31 and 34, the sealing resin 7 is formed with a recess 711 recessed in the z direction from the top surface 71. As a result, the sealing resin 7 has a penetration surface 711A that faces the same side as the top surface 71 in the z direction and defines the recess 711. A surface roughness of the penetration surface 711A is smaller than the surface roughness of the top surface 71. When the semiconductor device A5 is mounted on a wiring board, the recess 711 serves as a mark for distinguishing the plurality of first terminals 51 from the plurality of second terminals 52.

Next, operative effects of the semiconductor device A5 will be described.

The semiconductor device A5 includes the insulating element 13 that insulates the first circuit and the second circuit from each other. The first circuit includes the first semiconductor element 11. The second circuit includes the second semiconductor element 12. Therefore, the semiconductor device A5 can also improve the insulation withstand voltage. Further, the semiconductor device A5 has the same effects as the semiconductor device A1 by adopting the same configuration as the semiconductor device A1.

In the semiconductor device A5, the surface roughness of each of the top surface 71, the bottom surface 72, the first region 731 of the first side surface 73, and the second region 732 of the first side surface 73 is larger than the surface roughness of the third region 733 of the first side surface 73. Further, the surface roughness of each of the top surface 71, the bottom surface 72, the fourth region 741 of the second side surface 74, and the fifth region 742 of the second side surface 74 is also larger than the surface roughness of the sixth region 743 of the second side surface 74. As a result, the length of each of the second creepage distance CD2 and the third creepage distance CD3 shown in FIGS. 29 and 30 can be made longer. Therefore, the insulation withstand voltage of the semiconductor device A5 can be further improved.

Sixth Embodiment

Figure 35:
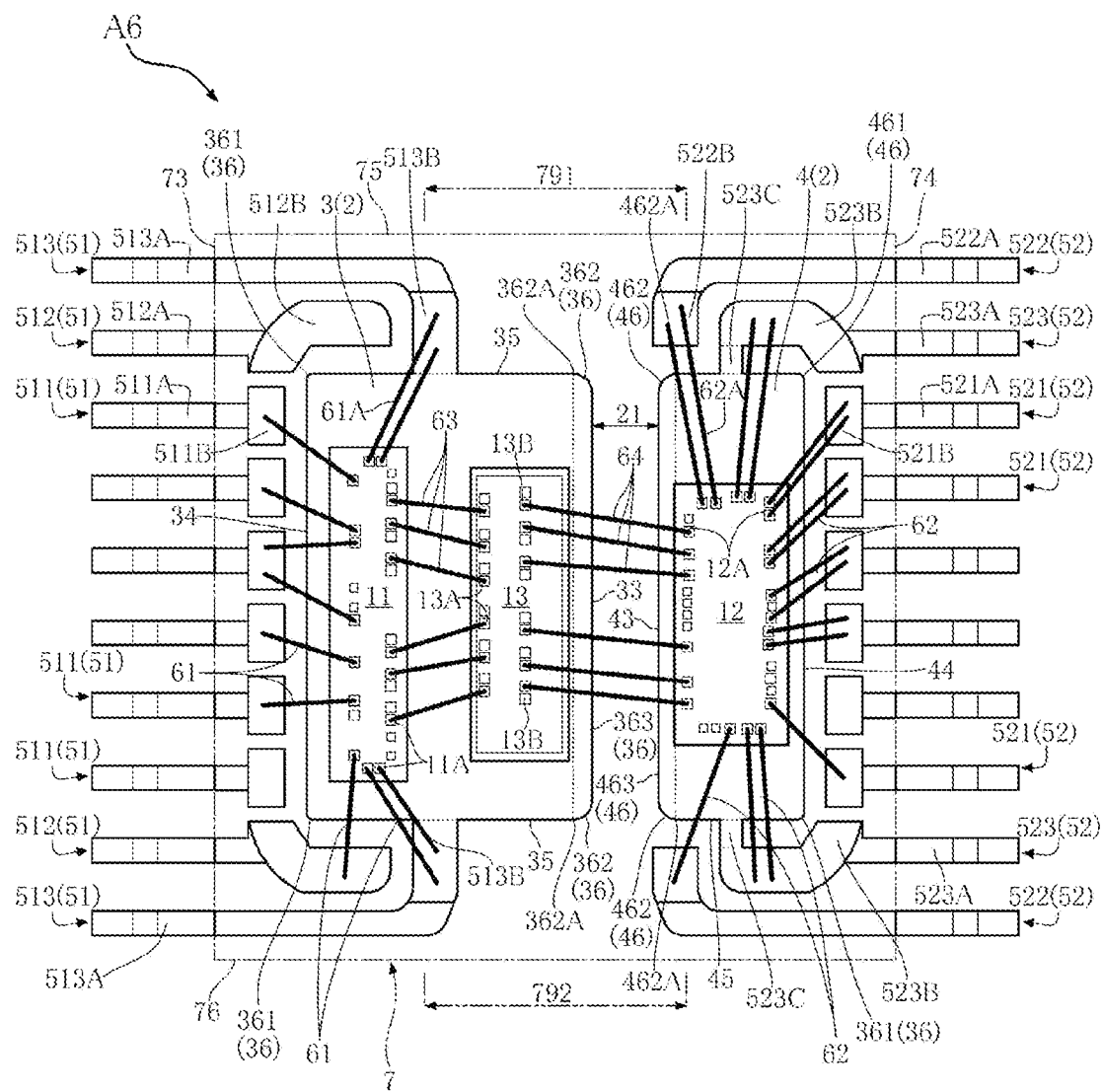
FIG. 35 is a plan view of a semiconductor device according to a sixth embodiment of the present disclosure that is transparent to a sealing resin.

A semiconductor device A6 according to a sixth embodiment of the present disclosure will be described with reference to FIG. 35. In this figure, elements that are the same as or similar to those of the above-described semiconductor device A1 are denoted by the same reference numerals, and redundant explanation thereof will be omitted. Here, for convenience of understanding, FIG. 35 is transparent to the sealing resin 7. In FIG. 35, the sealing resin 7 to which FIG. 35 is transparent is shown by an imaginary line.

In the semiconductor device A6, an arrangement configuration of the plurality of first wires 61 and the plurality of second wires 62 is different from the arrangement configuration thereof in the above-described semiconductor device A1.

As shown in FIG. 35, two first wires 61 are bonded to the pad part 511B of one of the plurality of first intermediate terminals 511 and the pad part 513B of each of the paired first support terminals 513, respectively. In the semiconductor device A6, the two first wires 61 are bonded to each of the pad part 511B and the pad part 513B in a state of being separated from each other.

As shown in FIG. 35, two second wires 62 are bonded to the pad part 521B of one of the plurality of second intermediate terminals 521, the pad part 522B of one of the paired second side terminals 522, and the pad part 523B of each of the paired second support terminals 523, respectively. In the semiconductor device A6, the two second wires 62 are bonded to each of the pad part 521B, the pad part 522B, and the pad part 523B in a state of being separated from each other.

Next, operative effects of the semiconductor device A6 will be described.

The semiconductor device A6 includes the insulating element 13 that insulates the first circuit and the second circuit from each other. The first circuit includes the first semiconductor element 11. The second circuit includes the second semiconductor element 12. Therefore, the semiconductor device A6 can also improve the insulation withstand voltage. Further, the semiconductor device A6 has the same effects as the semiconductor device A1 by adopting the same configuration as the semiconductor device A1.

Seventh Embodiment

Figure 36:
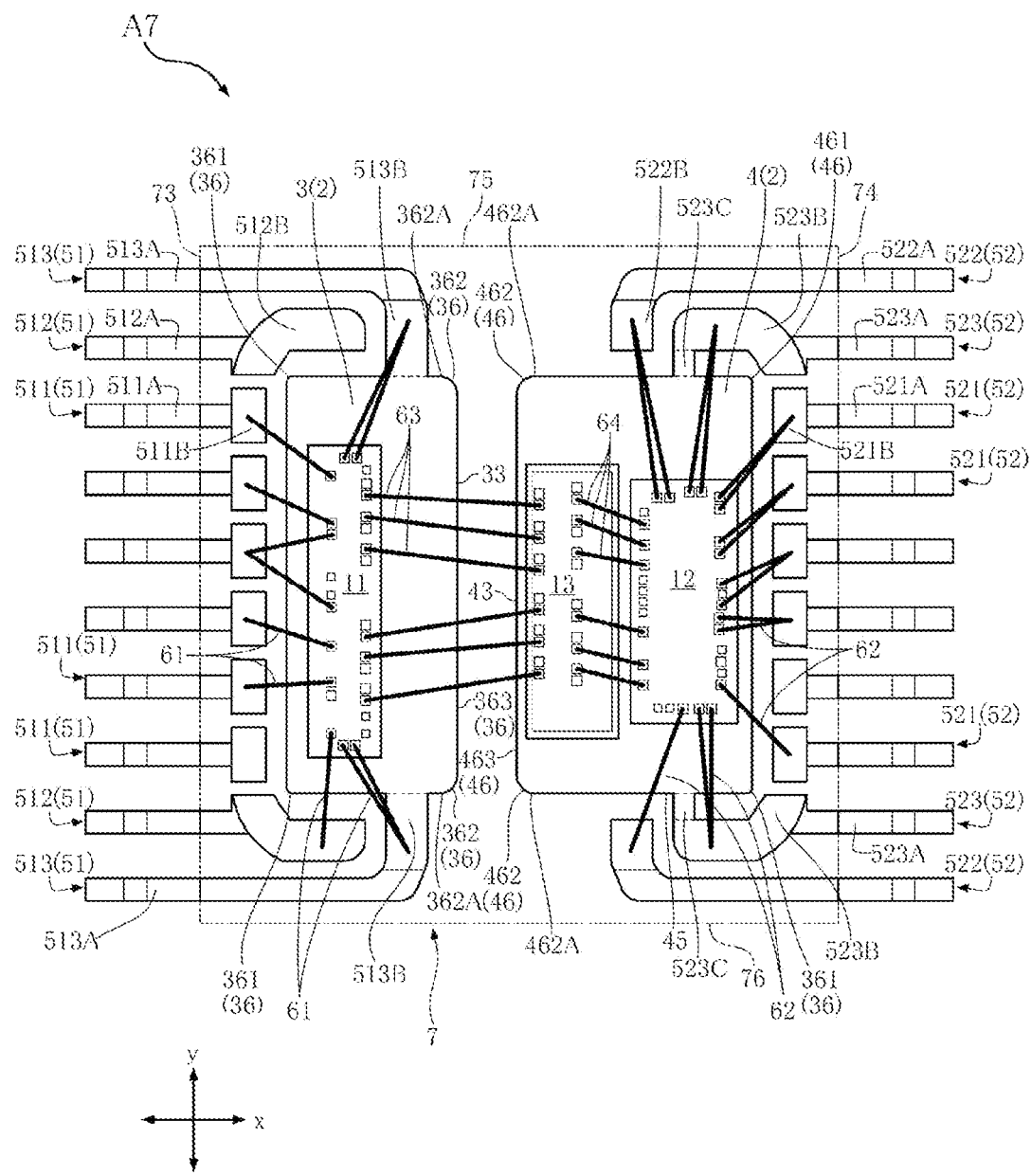
FIG. 36 is a plan view of a semiconductor device according to a seventh embodiment of the present disclosure that is transparent to a sealing resin.

A semiconductor device A7 according to a seventh embodiment of the present disclosure will be described with reference to FIG. 36. In this figure, elements that are the same as or similar to those of the above-described semiconductor device A1 are denoted by the same reference numerals, and redundant explanation thereof will be omitted. Here, for convenience of understanding, FIG. 36 is transparent to the sealing resin 7. In FIG. 36, the sealing resin 7 to which FIG. 36 is transparent is shown by an imaginary line.

In the semiconductor device A7, an arrangement configuration of the insulating element 13 is different from the arrangement configuration thereof in the above-described semiconductor device A1.

As shown in FIG. 36, the insulating element 13 is mounted on the second main surface 41 of the second die pad 4. In the semiconductor device A7, the plurality of third wires 63 straddles the pad gap 21.

Next, operative effects of the semiconductor device A7 will be described.

The semiconductor device A7 includes the insulating element 13 that insulates the first circuit and the second circuit from each other. The first circuit includes the first semiconductor element 11. The second circuit includes the second semiconductor element 12. Therefore, the semiconductor device A7 can also improve the insulation withstand voltage. Further, the semiconductor device A7 has the same effects as the semiconductor device A1 by adopting the same configuration as the semiconductor device A1.

Eighth Embodiment

Figure 37:
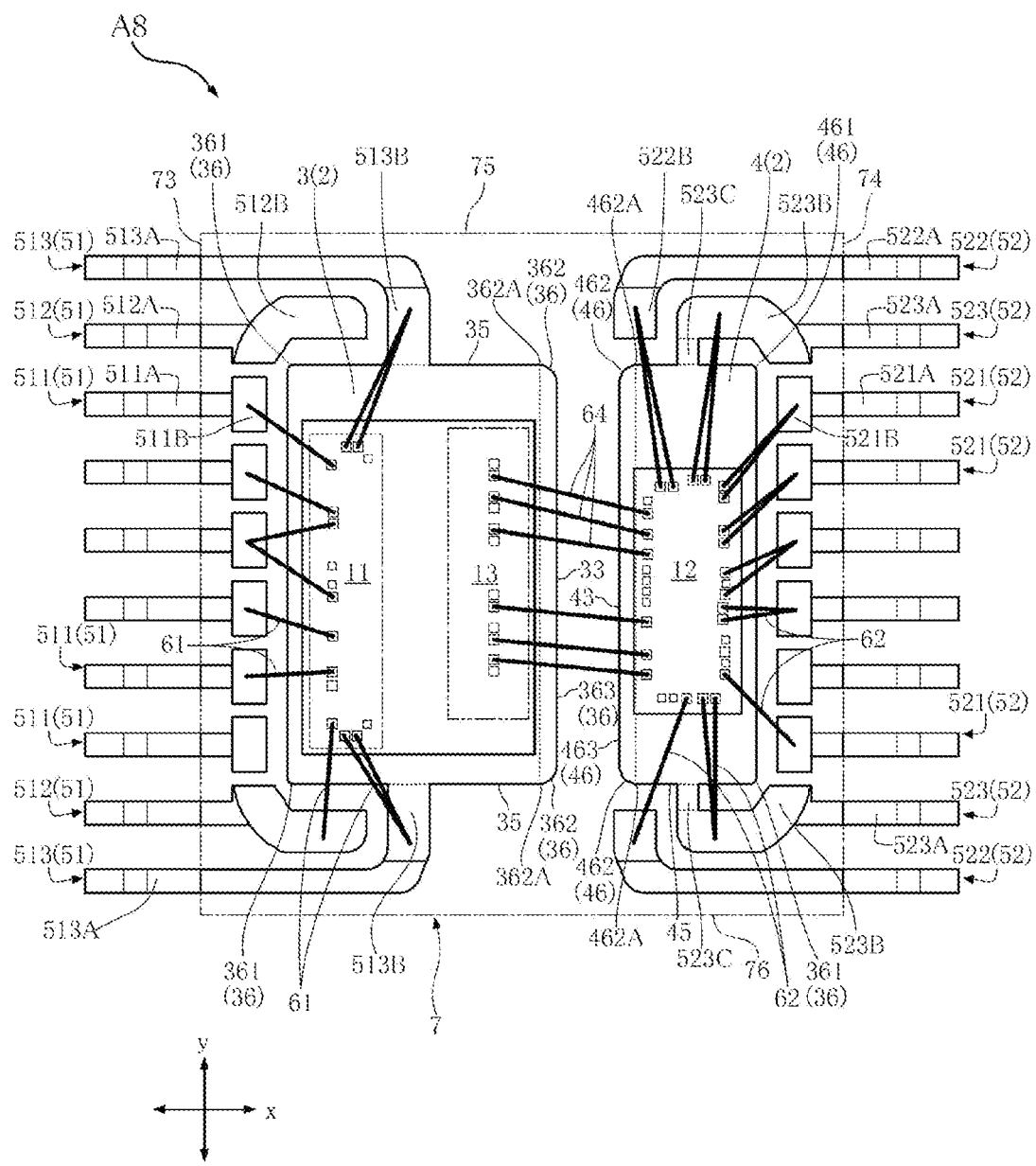
FIG. 37 is a plan view of a semiconductor device according to an eighth embodiment of the present disclosure that is transparent to a sealing resin.

A semiconductor device A8 according to an eighth embodiment of the present disclosure will be described with reference to FIG. 37. In this figure, elements that are the same as or similar to those of the above-described semiconductor device A1 are denoted by the same reference numerals, and redundant explanation thereof will be omitted. Here, for convenience of understanding, FIG. 37 is transparent to the sealing resin 7. In FIG. 37, the sealing resin 7 to which FIG. 37 is transparent is shown by an imaginary line.

In the semiconductor device A8, configurations of the first semiconductor element 11 and the insulating element 13 are different from the configurations thereof in the above-described semiconductor device A1.

As shown in FIG. 37, the first semiconductor element 11 and the insulating element 13 are a single element in which they are integrated. Conduction between the first semiconductor element 11 and the insulating element 13 is made in a circuit composed of the single element. This eliminates a need to arrange the plurality of third wires 63.

Next, operative effects of the semiconductor device A8 will be described.

The semiconductor device A8 includes the insulating element 13 that insulates the first circuit and the second circuit from each other. The first circuit includes the first semiconductor element 11. The second circuit includes the second semiconductor element 12. Therefore, the semiconductor device A8 can also improve the insulation withstand voltage. Further, the semiconductor device A8 has the same effects as the semiconductor device A1 by adopting the same configuration as the semiconductor device A1.

Ninth Embodiment

Figure 38:
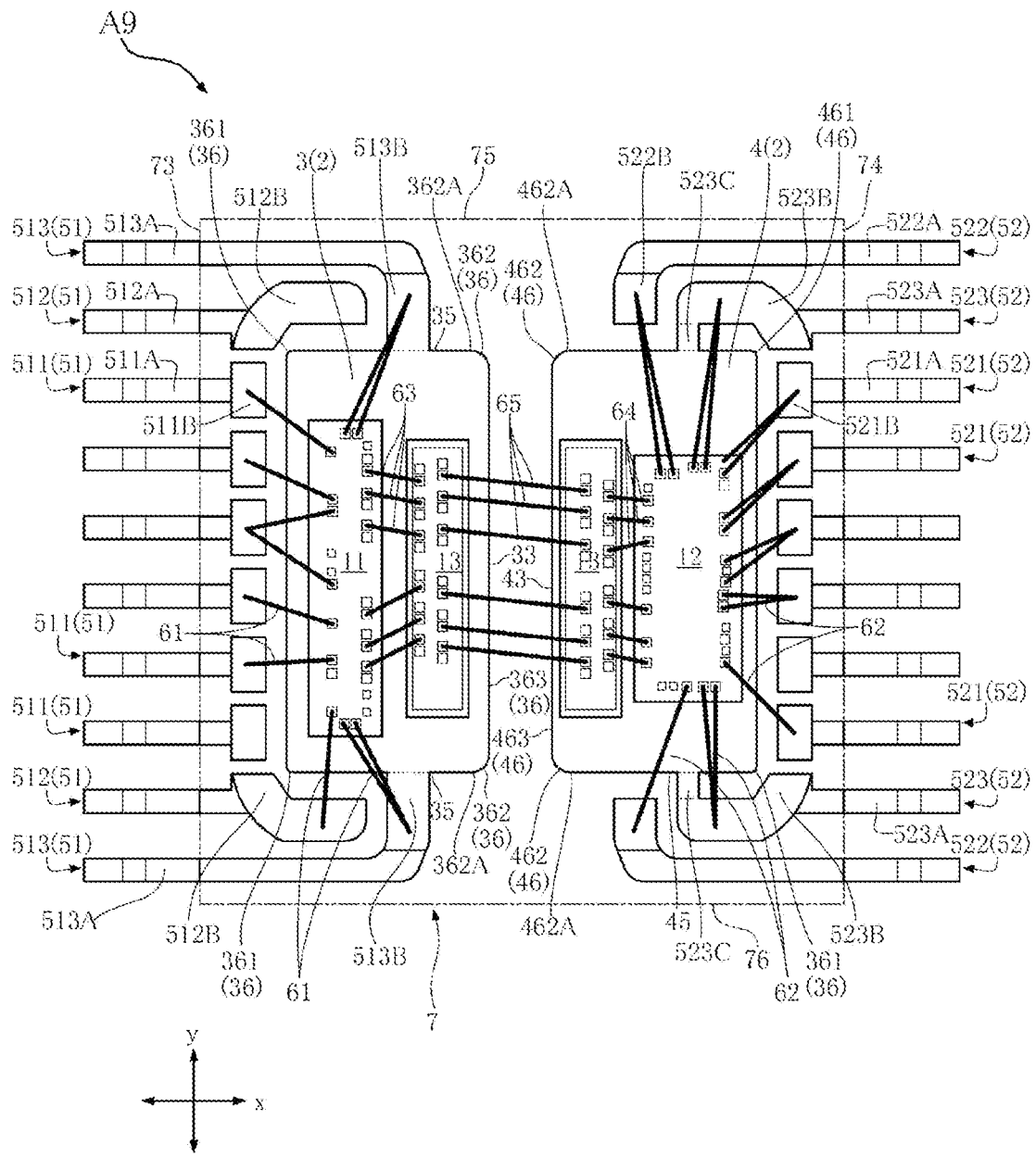
FIG. 38 is a plan view of a semiconductor device according to a ninth embodiment of the present disclosure that is transparent to a sealing resin.

A semiconductor device A9 according to a ninth embodiment of the present disclosure will be described with reference to FIG. 38. In this figure, elements that are the same as or similar to those of the above-described semiconductor device A1 are denoted by the same reference numerals, and redundant explanation thereof will be omitted. Here, for convenience of understanding, FIG. 38 is transparent to the sealing resin 7. In FIG. 38, the sealing resin 7 to which FIG. 38 is transparent is shown by an imaginary line.

In the semiconductor device A9, a configuration of the insulating element 13 is different from the configuration thereof in the above-described semiconductor device A1.

As shown in FIG. 38, the insulating element 13 is composed of a pair of elements. One of the paired elements is mounted on the first main surface 31 of the first die pad 3. The other of the paired elements is mounted on the second main surface 41 of the second die pad 4. Mutual conduction of the paired elements is made by a plurality of fifth wires 65.

Next, operative effects of the semiconductor device A9 will be described.

The semiconductor device A9 includes the insulating element 13 that insulates the first circuit and the second circuit from each other. The first circuit includes the first semiconductor element 11. The second circuit includes the second semiconductor element 12. Therefore, the semiconductor device A9 can also improve the insulation withstand voltage. Further, the semiconductor device A9 has the same effects as the semiconductor device A1 by adopting the same configuration as the semiconductor device A1.

Tenth Embodiment

Figure 39:
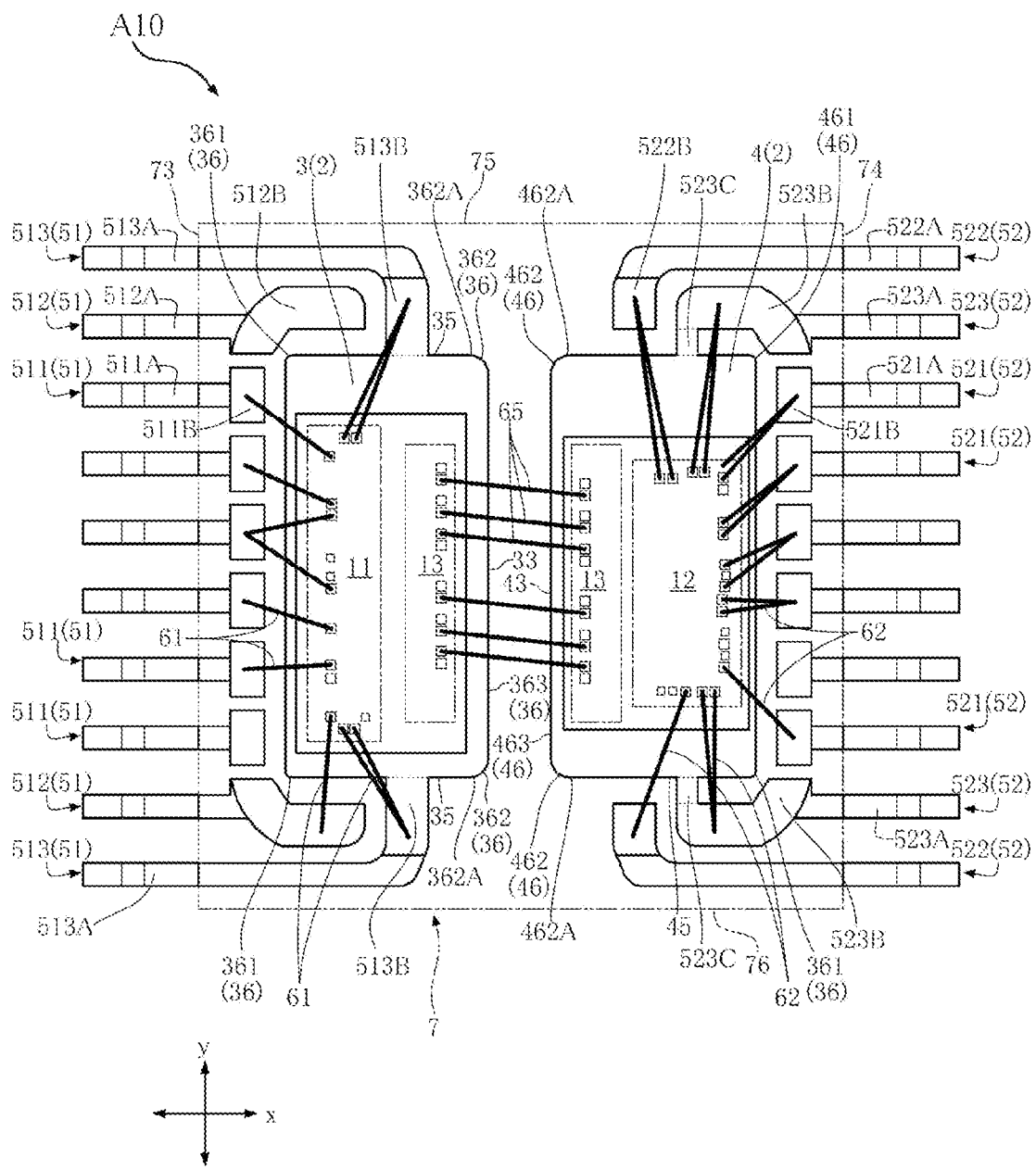
FIG. 39 is a plan view of a semiconductor device according to a tenth embodiment of the present disclosure that is transparent to a sealing resin.

A semiconductor device A10 according to a tenth embodiment of the present disclosure will be described with reference to FIG. 39. In this figure, elements that are the same as or similar to those of the above-described semiconductor device A1 are denoted by the same reference numerals, and redundant explanation thereof will be omitted. Here, for convenience of understanding, FIG. 39 is transparent to the sealing resin 7. In FIG. 39, the sealing resin 7 to which FIG. 39 is transparent is shown by an imaginary line.

In the semiconductor device A10, configurations of the first semiconductor element 11, the second semiconductor element 12, and the insulating element 13 are different from the configurations thereof in the above-described semiconductor device A1.

As shown in FIG. 39, the insulating element 13 is composed of a pair of elements. One of the paired elements is a single element integrated with the first semiconductor element 11. The other of the paired elements is a single element integrated with the second semiconductor element 12. Mutual conduction of these single elements is made by a plurality of fifth wires 65. This eliminates a need to arrange the plurality of third wires 63 and the plurality of fourth wires 64 as compared with the semiconductor device A9.

Next, operative effects of the semiconductor device A10 will be described.

The semiconductor device A10 includes the insulating element 13 that insulates the first circuit and the second circuit from each other. The first circuit includes the first semiconductor element 11. The second circuit includes the second semiconductor element 12. Therefore, the semiconductor device A10 can also improve the insulation withstand voltage. Further, the semiconductor device A10 has the same effects as the semiconductor device A1 by adopting the same configuration as the semiconductor device A1.

The present disclosure is not limited to the above-described embodiments. The specific configuration of each part of the present disclosure can be freely changed in design in various ways.

The technical configuration of the semiconductor device provided by the present disclosure will be additionally described as supplementary notes.

[Supplementary Note 1A]
A semiconductor device including:
a conductive support member including a first die pad and a second die pad, which are separated from each other in a first direction orthogonal to a thickness direction and have relatively different potentials from each other;
a first semiconductor element that is mounted on the first die pad and forms a first circuit together with the first die pad;
a second semiconductor element that is mounted on the second die pad and forms a second circuit together with the second die pad;
an insulating element that conducts to the first semiconductor element and the second semiconductor element and insulates the first circuit and the second circuit from each other; and
a sealing resin that covers the first die pad, the second die pad, the first semiconductor element, the second semiconductor element, and the insulating element and insulates the first die pad and the second die pad from each other,
wherein the first die pad and the second die pad overlap each other when viewed along the first direction,
wherein when viewed along the thickness direction, a peripheral edge of the first die pad has a first near-angle portion including a first end portion in a second direction orthogonal to both the thickness direction and the first direction, and
wherein the first near-angle portion is separated from the second die pad in the first direction toward the first end portion in the second direction.

[Supplementary Note 2A]
The semiconductor device of Supplementary Note 1A, wherein when viewed along the thickness direction, a peripheral edge of the second die pad has a second near-angle portion including a second end portion in the second direction, and
wherein the second near-angle portion is separated from the first die pad in the first direction toward the second end portion in the second direction.

[Supplementary Note 3A]
The semiconductor device of Supplementary Note 2A, wherein the first near-angle portion has an arc shape when viewed along the thickness direction.

[Supplementary Note 4A]
The semiconductor device of Supplementary Note 3A, wherein the peripheral edge of the first die pad has a first far-angle portion located on an opposite side to the second die pad from the first end portion in the first direction,
wherein the first far-angle portion has an arc shape when viewed in the thickness direction, and
wherein when viewed along the thickness direction, a radius of curvature of the first near-angle portion is larger than a radius of curvature of the first far-angle portion.

[Supplementary Note 5A]
The semiconductor device of Supplementary Note 3A or 4A, wherein when viewed along the thickness direction, a radius of curvature of the first near-angle portion is 60 µm or more and 240 µm or less.

[Supplementary Note 6A]
The semiconductor device of any one of Supplementary Notes 2A to 5A, wherein the second near-angle portion has an arc shape when viewed along the thickness direction.

[Supplementary Note 7A]
The semiconductor device of Supplementary Note 6A, wherein the peripheral edge of the second die pad has a second far-angle portion located on an opposite side of the second die pad from the second end portion in the first direction,
wherein the second far-angle portion has an arc shape when viewed along the thickness direction, and
wherein when viewed in the thickness direction, a radius of curvature of the second near-angle portion is larger than a radius of curvature of the second far-angle portion.

[Supplementary Note 8A]
The semiconductor device of Supplementary Note 6A or 7A, wherein when viewed along the thickness direction, a radius of curvature of the second near-angle portion is 60 µm or more and 240 µm or less.

[Supplementary Note 9A]
The semiconductor device of any one of Supplementary Notes 2A to 8A, wherein when viewed along the thickness direction, the peripheral edge of the first die pad has a first near-end edge that extends along the second direction from an end portion of the first near-angle portion opposite to the first end portion and faces the second die pad in the first direction, and
wherein when viewed along the thickness direction, the peripheral edge of the second die pad has a second near-end edge that extends along the second direction from an end portion of the second near-angle portion opposite to the second end portion and faces the first die pad in the first direction.

[Supplementary Note 10A]
The semiconductor device of Supplementary Note 9A, wherein a distance in the first direction between the first near-end edge and the second near-end edge is 250 µm or more and 500 µm or less.

[Supplementary Note 11A]
The semiconductor device of any one of Supplementary Notes 1A to 10A, wherein the insulating element is mounted on the first die pad and is arranged between the first semiconductor element and the second semiconductor element in the first direction.

[Supplementary Note 12A]
The semiconductor device of any one of Supplementary Notes 1A to 11A, wherein the insulating element is of an inductive type.

[Supplementary Note 13A]
The semiconductor device of any one of Supplementary Notes 1A to 12A, wherein each of the first semiconductor element, the second semiconductor element, and the insulating element is composed of individual elements.

[Supplementary Note 14A]
The semiconductor device of any one of Supplementary Notes 1A to 13A, wherein in a state where a power supply voltage is supplied to the first circuit and a power supply voltage is supplied to the second circuit, the power supply voltage supplied to the second circuit is larger than the power supply voltage supplied to the first circuit.

[Supplementary Note 15A]

The semiconductor device of any one of Supplementary Notes 1A to 14A, wherein the conductive support member includes a plurality of first terminals that are arranged along the second direction, at least one of the plurality of first terminals conducting to the first circuit, and a plurality of second terminals that are arranged along the second direction, at least one of the plurality of second terminals conducting to the second circuit, wherein a portion of each of the plurality of first terminals is exposed from a first side surface of the sealing resin facing one side in the first direction, and wherein a portion of each of the plurality of second terminals is exposed from a second side surface of the sealing resin facing the other side in the first direction.

[Supplementary Note 16A]

The semiconductor device of Supplementary Note 15A, wherein when viewed along the thickness direction, a minimum distance between the first die pad and the second die pad is smaller than a minimum distance between each of the plurality of first terminals and the second die pad and a minimum distance between each of the plurality of second terminals and the first die pad.

[Supplementary Note 1B]

A semiconductor device including:

a conductive support member including a first die pad and a second die pad, which are separated from each other in a first direction orthogonal to a thickness direction and have relatively different potentials from each other;

a first semiconductor element that is mounted on the first die pad and forms a first circuit together with the first die pad;

a second semiconductor element that is mounted on the second die pad and forms a second circuit together with the second die pad;

an insulating element that conducts to the first semiconductor element and the second semiconductor element and insulates the first circuit and the second circuit from each other; and a sealing resin that covers the first die pad, the second die pad, the first semiconductor element, the second semiconductor element, and the insulating element and insulates the first die pad and the second die pad from each other, wherein the first die pad and the second die pad overlap each other when viewed along the first direction, wherein the first die pad has a first main surface, which faces the thickness direction and on which the first semiconductor element is mounted, and a first back surface facing an opposite side to the first main surface in the thickness direction, wherein the second die pad has a second main surface, which faces the thickness direction and on which the second semiconductor element is mounted, and a second back surface facing an opposite side to the second main surface in the thickness direction, and wherein when viewed along a second direction orthogonal to both the thickness direction and the first direction, a distance in the first direction between the first back surface and the second back surface is larger than a distance in the first direction between the first main surface and the second main surface.

[Supplementary Note 2B]

The semiconductor device of Supplementary Note 1B, wherein the first die pad has a first facing surface connected to the first main surface and the first back surface and facing the second die pad, wherein the first facing surface includes a first main surface side recess connected to the first main surface and a first back surface side recess connected to the first back surface, and wherein when viewed along the second direction, the first main surface side recess and the first back surface side recess are recessed inward of the first die pad.

[Supplementary Note 3B]

The semiconductor device of Supplementary Note 2B, wherein the first facing surface includes a first main surface side protrusion formed by the first main surface and the first main surface side recess, a first back surface side protrusion formed by the first back surface and the first back surface side recess, and a first intermediate protrusion formed by the first main surface side recess and the first back surface side recess.

[Supplementary Note 4B]

The semiconductor device of Supplementary Note 3B, wherein when viewed along the second direction, an angle of the first back surface side protrusion is smaller than an angle of the first main surface side protrusion.

[Supplementary Note 5B]

The semiconductor device of Supplementary Note 3B or 4B, wherein when viewed along the second direction, an angle of the first intermediate protrusion is larger than a sum of an angle of the first main surface side protrusion and an angle of the first back surface side protrusion.

[Supplementary Note 6B]

The semiconductor device of any one of Supplementary Notes 3B to 5B, wherein when viewed along the second direction, the first intermediate protrusion is located inward of the first die pad with respect to the first main surface side protrusion and the first back surface side protrusion.

[Supplementary Note 7B]

The semiconductor device of any one of Supplementary Notes 2B to 6B, wherein a dimension of the first back surface side recess in the thickness direction is larger than a dimension of the first main surface side recess in the thickness direction.

[Supplementary Note 8B]

The semiconductor device of any one of Supplementary Notes 2B to 7B, wherein the second die pad has a second facing surface connected to the second main surface and the second back surface and facing the first die pad, wherein the second facing surface includes a second main surface side recess connected to the second main surface and a second back surface side recess connected to the second back surface, and wherein when viewed along the second direction, the second main surface side recess and the second back surface side recess are recessed inward of the second die pad.

[Supplementary Note 9B]

The semiconductor device of Supplementary Note 8B, wherein the second facing surface includes a second main surface side protrusion formed by the second main surface and the second main surface side recess, a second back surface side protrusion formed by the second back surface and the second back surface side recess, and a second intermediate protrusion formed by the second main surface side recess and the second back surface side recess.

[Supplementary Note 10B]
The semiconductor device of Supplementary Note 9B, wherein when viewed along the second direction, an angle of the second back surface side protrusion is smaller than an angle of the second main surface side protrusion.

[Supplementary Note 11B]
The semiconductor device of Supplementary Note 9B or 10B, wherein when viewed in the second direction, an angle of the second intermediate protrusion is larger than a sum of an angle of the second main surface side protrusion and an angle of the second back surface side protrusion.

[Supplementary Note 12B]
The semiconductor device of any one of Supplementary Notes 9B to 11B, wherein when viewed along the second direction, the second intermediate protrusion is located inward of the second die pad with respect to the second main surface side protrusion and the second back surface side protrusion.

[Supplementary Note 13B]
The semiconductor device of any one of Supplementary Notes 8B to 12B, wherein a dimension of the second back surface side recess in the thickness direction is larger than a dimension of the second main surface side recess in the thickness direction.

[Supplementary Note 14B]
The semiconductor device of any one of Supplementary Notes 1B to 13B, wherein each of a dimension of the first die pad in the thickness direction and a dimension of the second die pad in the thickness direction is 0.2 times or more and 1.2 times or less than the distance in the first direction between the first main surface and the second main surface.

[Supplementary Note 15B]
The semiconductor device of any one of Supplementary Notes 1B to 14B, wherein the distance in the first direction between the first main surface and the second main surface is 250 µm or more and 500 µm or less.

[Supplementary Note 16B]
The semiconductor device of any one of Supplementary Notes 1B to 15B, wherein the insulating element is mounted on the first die pad and is arranged between the first semiconductor element and the second semiconductor element in the first direction.

[Supplementary Note 17B]
The semiconductor device of any one of Supplementary Notes 1B to 16B, wherein the insulating element is of an inductive type.

[Supplementary Note 18B]
The semiconductor device of any one of Supplementary Notes 1B to 17B, wherein in a state where a power supply voltage is supplied to the first circuit and a power supply voltage is supplied to the second circuit, the power supply voltage supplied to the second circuit is larger than the power supply voltage supplied to the first circuit.

[Supplementary Note 19B]
The semiconductor device of any one of Supplementary Notes 1B to 18B, wherein the conductive support member includes a plurality of first terminals that are arranged along the second direction, at least one of the plurality of first terminals conducting to the first circuit, and a plurality of second terminals that are arranged along the second direction, at least one of the plurality of second terminals conducting to the second circuit,
wherein a portion of each of the plurality of first terminals is exposed from a first side surface of the sealing resin facing one side in the first direction, and
wherein a portion of each of the plurality of second terminals is exposed from a second side surface of the sealing resin facing the other side in the first direction.

[Supplementary Note 20B]
The semiconductor device of Supplementary Note 19B, wherein when viewed along the thickness direction, a minimum distance between the first die pad and the second die pad is smaller than a minimum distance between each of the plurality of first terminals and the second die pad and a minimum distance between each of the plurality of second terminals and the first die pad.

[Supplementary Note 1C]
A semiconductor device including:
a first die pad that is arranged on one side of a first direction orthogonal to a thickness direction;
a second die pad that is arranged on the other side of the first direction with respect to the first die pad, is located away from the first die pad in the first direction, and has a potential that is relatively different from a potential of the first die pad;
a first semiconductor element that is mounted on the first die pad and forms a first circuit together with the first die pad;
a second semiconductor element that is mounted on the second die pad and forms a second circuit together with the second die pad;
an insulating element that is mounted on one of the first die pad and the second die pad, relays transmission and reception of signals between the first circuit and the second circuit, and insulates the first circuit and the second circuit from each other;
a plurality of first terminals that includes a portion located on the one side of the first direction with respect to the first die pad and is arranged along a second direction orthogonal to both the thickness direction and the first direction, at least one of the plurality of first terminals conducting to the first circuit;
a plurality of second terminals that includes a portion located on the other side of the first direction with respect to the second die pad and is arranged along the second direction, at least one of the plurality of second terminals conducting to the second circuit; and
a sealing resin that covers the first die pad, the second die pad, the first semiconductor element, the second semiconductor element, the insulating element, and a portion of each of the plurality of first terminals and the plurality of second terminals, and insulates the first die pad and the second die pad from each other,
wherein the sealing resin has a first side surface located on the one side of the first direction, a second side surface located on the other side of the first direction, and a third side surface and a fourth side surface that are separated from each other in the second direction and are connected to the first side surface and the second side surface,
wherein a first gate mark having a surface roughness larger than that in the other regions of the third side surface is formed on the third side surface, and
wherein when viewed along the second direction, the first gate mark overlaps a pad gap provided between the first die pad and the second die pad in the first direction.

[Supplementary Note 2C]
The semiconductor device of Supplementary Note 1C, wherein a second gate mark having a surface roughness larger than that in the other regions of the fourth side surface is formed on the fourth side surface, and wherein the second gate mark overlaps the pad gap when viewed along the second direction.

[Supplementary Note 3C]

The semiconductor device of Supplementary Note 2C, wherein the sealing resin includes a first resin portion that penetrates the pad gap along the thickness direction and has the same dimension in the first direction as the pad gap, and second resin portions located at both ends of the first resin portion in the first direction, and wherein an average void amount per unit volume of the first resin portion is smaller than an average void amount per unit volume of the second resin portion.

[Supplementary Note 4C]

The semiconductor device of Supplementary Note 3C, wherein the pad gap extends along the second direction when viewed along the thickness direction.

[Supplementary Note 5C]

The semiconductor device of Supplementary Note 4C, wherein the first gate mark is located at a center of the third side surface in the first direction.

[Supplementary Note 6C]

The semiconductor device of any one of Supplementary Notes 2C to 5C, further including a plurality of first wires bonded to the first semiconductor element and one of the plurality of first terminals, wherein an angle formed by at least one of the plurality of first wires with respect to the first direction is larger than an angle formed by the first wire with respect to the second direction.

[Supplementary Note 7C]

The semiconductor device of Supplementary Note 6C, wherein the plurality of first wires includes a specific first wire located closest to the first gate mark, wherein an angle formed by the specific first wire with respect to the first direction is larger than an angle formed by the specific first wire with respect to the second direction, and wherein a length of the specific first wire is the largest among lengths of the plurality of first wires.

[Supplementary Note 8C]

The semiconductor device of Supplementary Note 6C or 7C, further including: a plurality of second wires bonded to the second semiconductor element and one of the plurality of second terminals, wherein an angle formed by at least one of the plurality of second wires with respect to the first direction is larger than an angle formed by the second wire with respect to the second direction.

[Supplementary Note 9C]

The semiconductor device of Supplementary Note 8C, wherein the plurality of second wires includes a specific second wire located closest to the first gate mark, wherein an angle formed by the specific second wire with respect to the first direction is larger than an angle formed by the specific second wire with respect to the second direction, and wherein a length of the specific second wire is the largest among lengths of the plurality of second wires.

[Supplementary Note 10C]

The semiconductor device of any one of Supplementary Notes 2C to 9C, wherein in a state where a power supply voltage is supplied to the first circuit and a power supply voltage is supplied to the second circuit, the power supply voltage supplied to the second circuit is larger than the power supply voltage supplied to the first circuit.

[Supplementary Note 11C]

The semiconductor device of any one of Supplementary Notes 2C to 10C, wherein when viewed along the second direction, the first gate mark includes a region located on an opposite side to the first semiconductor element with respect to the first die pad in the thickness direction.

[Supplementary Note 12C]

The semiconductor device of Supplementary Note 11C, wherein when viewed along the second direction, the second gate mark includes a region located on an opposite side to the first semiconductor element with respect to the first die pad in the thickness direction.

[Supplementary Note 13C]

The semiconductor device of any one of Supplementary Notes 2C to 12C, wherein the second die pad overlaps the first die pad when viewed along the first direction.

[Supplementary Note 14C]

The semiconductor device of any one of Supplementary Notes 2C to 13C, wherein the first die pad, the second die pad, the plurality of first terminals, and the plurality of second terminals are located apart from both the third side surface and the fourth side surface.

[Supplementary Note 15C]

The semiconductor device of Supplementary Note 14C, wherein when viewed along the thickness direction, each of the plurality of first terminals has a first lead part protruding from the first side surface along the first direction, and wherein when viewed along the thickness direction, each of the plurality of second terminals has a second lead part protruding from the second side surface along the first direction.

[Supplementary Note 16C]

The semiconductor device of Supplementary Note 15C, wherein the plurality of first terminals includes a pair of first support terminals located apart from each other in the second direction, and wherein the paired first support terminals are connected to both ends of the first die pad in the second direction.

[Supplementary Note 17C]

The semiconductor device of Supplementary Note 16C, wherein the plurality of second terminals includes a pair of second support terminals located apart from each other in the second direction, and wherein the paired second support terminals are connected to both ends of the second die pad in the second direction.

[Supplementary Note 18C]

The semiconductor device of any one of Supplementary Notes 1C to 17C, wherein of the first die pad and the second die pad, a specific die pad on which the insulating element is mounted is provided with a hole penetrating in the thickness direction, and wherein when viewed along the thickness direction, the hole is located between the insulating element and a specific semiconductor element, which is mounted on the specific die pad, of the first semiconductor element and the second semiconductor element.

[Supplementary Note 19C]

The semiconductor device of any one of Supplementary Notes 1C to 18C, wherein the insulating element is of an inductive type.

[Supplementary Note 1D]

A semiconductor device including:

a first die pad that is arranged on one side of a first direction orthogonal to a thickness direction;

a second die pad that is arranged on the other side of the first direction with respect to the first die pad, is located away from the first die pad in the first direction, and has a potential that is relatively different from a potential of the first die pad;

a first semiconductor element that is mounted on the first die pad and forms a first circuit together with the first die pad;

a second semiconductor element that is mounted on the second die pad and forms a second circuit together with the second die pad;

an insulating element that is mounted on one of the first die pad and the second die pad, relays transmission and reception of signals between the first circuit and the second circuit, and insulates the first circuit and the second circuit from each other;

a plurality of first terminals that includes a portion located on the one side of the first direction with respect to the first die pad and is arranged along a second direction orthogonal to both the thickness direction and the first direction, at least one of the plurality of first terminals conducting to the first circuit;

a plurality of second terminals that includes a portion located on the other side of the first direction with respect to the second die pad and is arranged along the second direction, at least one of the plurality of second terminals conducting to the second circuit; and a sealing resin that covers the first die pad, the second die pad, the first semiconductor element, the second semiconductor element, the insulating element, and a portion of each of the plurality of first terminals and the plurality of second terminals, and insulates the first die pad and the second die pad from each other, wherein the sealing resin has a top surface facing a side where the first semiconductor element is located with respect to the first die pad in the thickness direction, a bottom surface facing an opposite side to the top surface in the thickness direction, a first side surface located on the one side of the first direction and connected to the top surface and the bottom surface, a second side surface located on the other side of the first direction and connected to the top surface and the bottom surface, and a third side surface located on any side of the second direction and connected to the first side surface and the second side surface, wherein the plurality of first terminals includes a first edge terminal exposed from the first side surface and located closest to the third side surface, wherein the plurality of second terminals includes a second edge terminal exposed from the second side surface and located closest to the third side surface, and wherein a first creepage distance, which is a shortest distance from the first edge terminal to the second edge terminal along the first side surface, the third side surface, and the second side surface, is shorter than a second creepage distance, which is a shortest distance from the first edge terminal to the second edge terminal along the first side surface, the bottom surface, and the second side surface.

[Supplementary Note 2D]

The semiconductor device of Supplementary Note 1D, wherein a third creepage distance, which is a shortest distance from the first edge terminal to the second edge terminal along the first side surface, the top surface, and the second side surface, is longer than the second creepage distance.

[Supplementary Note 3D]

The semiconductor device of Supplementary Note 1D or 2D, wherein when viewed along the thickness direction, a dimension of a peripheral edge of the sealing resin along the first direction is 0.75 times or more and 3 times or less than a dimension of a peripheral edge of the sealing resin along the second direction.

[Supplementary Note 4D]

The semiconductor device of any one of Supplementary Notes 1D to 3D, wherein in a state where a power supply voltage is supplied to the first circuit and a power supply voltage is supplied to the second circuit, the power supply voltage supplied to the second circuit is larger than the power supply voltage supplied to the first circuit.

[Supplementary Note 5D]

The semiconductor device of any one of Supplementary Notes 1D to 4D, wherein each of the plurality of first terminals has a first pad part covered with the sealing resin, and a first lead part connected to the first pad part and partially exposed from the first side surface, wherein when viewed along the second direction, the first lead part of each of the plurality of first terminals is bent toward the bottom surface, and wherein when viewed along the thickness direction, the first lead part of each of the plurality of first terminals extends along the first direction.

[Supplementary Note 6D]

The semiconductor device of Supplementary Note 5D, wherein when viewed along the first direction, the first pad part of each of the plurality of first terminals overlaps the first die pad.

[Supplementary Note 7D]

The semiconductor device of Supplementary Note 5D or 6D, wherein each of the plurality of second terminals has a second pad part covered with the sealing resin, and a second lead part connected to the second pad part and partially exposed from the second side surface, wherein when viewed along the second direction, the second lead part of each of the plurality of second terminals is bent toward the bottom surface, and wherein when viewed along the thickness direction, the second lead part of each of the plurality of second terminals extends along the first direction.

[Supplementary Note 8D]

The semiconductor device of Supplementary Note 7D, wherein when viewed along the first direction, the second pad part of each of the plurality of second terminals overlaps the second die pad.

[Supplementary Note 9D]

The semiconductor device of any one of Supplementary Notes 5D to 8D, wherein when viewed along the first direction, the second die pad overlaps the first die pad.

[Supplementary Note 10D]

The semiconductor device of Supplementary Note 9D, wherein in the thickness direction, a shortest distance from the first die pad to the top surface is longer than a shortest distance from the first die pad to the bottom surface.

[Supplementary Note 11D]

The semiconductor device of any one of Supplementary Notes 5D to 10D, wherein the first die pad, the second die pad, the plurality of first terminals, and the plurality of second terminals are located apart from the third side surface.

[Supplementary Note 12D]

The semiconductor device of Supplementary Note 11D, wherein the plurality of first terminals includes a pair of first support terminals located apart from each other in the second direction, and wherein the paired first support terminals are connected to both ends of the first die pad in the second direction.

[Supplementary Note 13D]
The semiconductor device of Supplementary Note 12D, wherein the plurality of second terminals includes a pair of second support terminals located apart from each other in the second direction, and
  wherein the paired second support terminals are connected to both ends of the second die pad in the second direction.

[Supplementary Note 14D]
The semiconductor device of any one of Supplementary Notes 1D to 13D, wherein of the first die pad and the second die pad, a specific die pad on which the insulating element is mounted is provided with a hole penetrating in the thickness direction, and
  wherein when viewed along the thickness direction, the hole is located between the insulating element and a specific semiconductor element, which is mounted on the specific die pad, of the first semiconductor element and the second semiconductor element.

[Supplementary Note 15D]
The semiconductor device of any one of Supplementary Notes 1D to 14D, wherein at least one of the plurality of first terminals and the plurality of second terminals includes a dummy terminal that does not conduct to any of the first semiconductor element and the second semiconductor element.

[Supplementary Note 16D]
The semiconductor device of any one of Supplementary Notes 1D to 15D, wherein the insulating element is of an inductive type.

[Supplementary Note 1E]
A semiconductor device including:
  a first die pad that is arranged on one side of a first direction orthogonal to a thickness direction;
  a second die pad that is arranged on the other side of the first direction with respect to the first die pad, is located away from the first die pad in the first direction, and has a potential that is relatively different from a potential of the first die pad;
  a first semiconductor element that is mounted on the first die pad and forms a first circuit together with the first die pad;
  a second semiconductor element that is mounted on the second die pad and forms a second circuit together with the second die pad;
  an insulating element that is mounted on one of the first die pad and the second die pad, relays transmission and reception of signals between the first circuit and the second circuit, and insulates the first circuit and the second circuit from each other;
  a plurality of first terminals that includes a portion located on the one side of the first direction with respect to the first die pad and is arranged along a second direction orthogonal to both the thickness direction and the first direction, at least one of the plurality of first terminals conducting to the first circuit;
  a plurality of second terminals that includes a portion located on the other side of the first direction with respect to the second die pad and is arranged along the second direction, at least one of the plurality of second terminals conducting to the second circuit; and
  a sealing resin that covers the first die pad, the second die pad, the first semiconductor element, the second semiconductor element, the insulating element, and a portion of each of the plurality of first terminals and the plurality of second terminals, and insulates the first die pad and the second die pad from each other,
  wherein the sealing resin has a top surface facing a side where the first semiconductor element is located with respect to the first die pad in the thickness direction, a bottom surface facing an opposite side to the top surface in the thickness direction, and a first side surface located on the one side of the first direction and connected to the top surface and the bottom surface,
  wherein the first side surface includes a first region connected to the top surface, a second region connected to the bottom surface, and a third region connected to the first region and the second region, the plurality of first terminals being exposed to the third region, and
  wherein a surface roughness of each of the top surface, the bottom surface, the first region, and the second region is larger than a surface roughness of the third region.

[Supplementary Note 2E]
The semiconductor device of Supplementary Note 1E, wherein the first region is inclined with respect to the top surface,
  wherein the second region is inclined with respect to the bottom surface, and
  wherein when viewed along the thickness direction, the third region is located outside the top surface and the bottom surface.

[Supplementary Note 3E]
The semiconductor device of Supplementary Note 1E or 2E, wherein the sealing resin has a second side surface located on the other side of the first direction and connected to the top surface and the bottom surface,
  wherein the second side surface includes a fourth region connected to the top surface, a fifth region connected to the bottom surface, and a sixth region connected to the fourth region and the fifth region, the plurality of second terminals being exposed to the sixth region, and
  wherein a surface roughness of each of the top surface, the bottom surface, the fourth region, and the fifth region is larger than a surface roughness of the sixth region.

[Supplementary Note 4E]
The semiconductor device of Supplementary Note 3E, wherein the fourth region is inclined with respect to the top surface,
  wherein the fifth region is inclined with respect to the bottom surface, and
  wherein when viewed along the thickness direction, the sixth region is located outside the top surface and the bottom surface.

[Supplementary Note 5E]
The semiconductor device of Supplementary Note 3E or 4E, wherein the sealing resin is formed with a recess recessed from the top surface,
  wherein the sealing resin has a penetration surface that faces the same side as the top surface in the thickness direction and defines the recess, and
  wherein a surface roughness of the penetration surface is smaller than the surface roughness of the top surface.

[Supplementary Note 6E]
The semiconductor device of any one of Supplementary Notes 3E to 5E, wherein the surface roughness of each of the top surface and the bottom surface is 5 μmRz or more and 20 μmRz or less.

[Supplementary Note 7E]
The semiconductor device of any one of Supplementary Notes 3E to 6E, wherein in a state where a power supply voltage is supplied to the first circuit and a power supply voltage is supplied to the second circuit, the power supply voltage supplied to the second circuit is larger than the power supply voltage supplied to the first circuit.

[Supplementary Note 8E]

The semiconductor device of any one of Supplementary Notes 3E to 7E, wherein each of the plurality of first terminals has a first pad part covered with the sealing resin, and a first lead part connected to the first pad part and partially exposed from the first side surface, wherein when viewed along the second direction, the first lead part of each of the plurality of first terminals is bent toward the bottom surface, and wherein when viewed along the thickness direction, the first lead part of each of the plurality of first terminals extends along the first direction.

[Supplementary Note 9E]

The semiconductor device of Supplementary Note 8E, wherein each of the plurality of second terminals has a second pad part covered with the sealing resin, and a second lead part connected to the second pad part and partially exposed from the second side surface, wherein when viewed along the second direction, the second lead part of each of the plurality of second terminals is bent toward the bottom surface, and wherein when viewed along the thickness direction, the second lead part of each of the plurality of second terminals extends along the first direction.

[Supplementary Note 10E]

The semiconductor device of Supplementary Note 8E or 9E, wherein when viewed along the first direction, the second die pad overlaps the first die pad.

[Supplementary Note 11E]

The semiconductor device of any one of Supplementary Notes 8E to 10E, wherein the sealing resin has a third side surface and a fourth side surface that are located apart from each other in the second direction and are connected to the top surface and the bottom surface, and wherein a surface roughness of at least a partial region of each of the third side surface and the fourth side surface is larger than the surface roughness of each of the third region and the sixth region.

[Supplementary Note 12E]

The semiconductor device of Supplementary Note 11E, wherein the first die pad, the second die pad, the plurality of first terminals, and the plurality of second terminals are located apart from both the third side surface and the fourth side surface.

[Supplementary Note 13E]

The semiconductor device of Supplementary Note 12E, wherein the plurality of first terminals includes a pair of first support terminals located apart from each other in the second direction, and wherein the paired first support terminals are connected to both ends of the first die pad in the second direction.

[Supplementary Note 14E]

The semiconductor device of Supplementary Note 13E, wherein the plurality of second terminals includes a pair of second support terminals located apart from each other in the second direction, and wherein the paired second support terminals are connected to both ends of the second die pad in the second direction.

[Supplementary Note 15E]

The semiconductor device of any one of Supplementary Notes 1E to 14E, wherein of the first die pad and the second die pad, a specific die pad on which the insulating element is mounted is provided with a hole penetrating in the thickness direction, and wherein when viewed along the thickness direction, the hole is located between the insulating element and a specific semiconductor element, which is mounted on the specific die pad, of the first semiconductor element and the second semiconductor element.

[Supplementary Note 16E]

The semiconductor device of any one of Supplementary Notes 1E to 15E, wherein at least one of the plurality of first terminals and the plurality of second terminals includes a dummy terminal that does not conduct to any of the first semiconductor element and the second semiconductor element.

[Supplementary Note 17E]

The semiconductor device of any one of Supplementary Notes 1E to 16E, wherein the insulating element is of an inductive type.

According to the present disclosure in some embodiments, it is possible to improve an insulation withstand voltage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a conductive support member including a first die pad and a second die pad, which are separated from each other in a first direction orthogonal to a thickness direction and have relatively different potentials from each other;
   a first semiconductor element that is mounted on the first die pad and forms a first circuit together with the first die pad;
   a second semiconductor element that is mounted on the second die pad and forms a second circuit together with the second die pad;
   an insulating element that conducts to the first semiconductor element and the second semiconductor element and insulates the first circuit and the second circuit from each other; and
   a sealing resin that covers the first die pad, the second die pad, the first semiconductor element, the second semiconductor element, and the insulating element and insulates the first die pad and the second die pad from each other,
   wherein the first die pad and the second die pad overlap each other when viewed along the first direction,
   wherein when viewed along the thickness direction, a peripheral edge of the first die pad has a first near-angle portion including a first end portion in a second direction orthogonal to both the thickness direction and the first direction, and
   wherein the first near-angle portion is separated from the second die pad in the first direction toward the first end portion in the second direction.

2. The semiconductor device of claim 1,
   wherein when viewed along the thickness direction, a peripheral edge of the second die pad has a second near-angle portion including a second end portion in the second direction, and
   wherein the second near-angle portion is separated from the first die pad in the first direction toward the second end portion in the second direction.

3. The semiconductor device of claim 2, wherein the first near-angle portion has an arc shape when viewed along the thickness direction.

4. The semiconductor device of claim 3,
wherein the peripheral edge of the first die pad has a first far-angle portion located on an opposite side to the second die pad from the first end portion in the first direction,
wherein the first far-angle portion has an arc shape when viewed in the thickness direction, and
wherein when viewed along the thickness direction, a radius of curvature of the first near-angle portion is larger than a radius of curvature of the first far-angle portion.

5. The semiconductor device of claim 3, wherein when viewed along the thickness direction, a radius of curvature of the first near-angle portion is 60 µm or more and 240 µm or less.

6. The semiconductor device of claim 2, wherein the second near-angle portion has an arc shape when viewed along the thickness direction.

7. The semiconductor device of claim 6,
wherein the peripheral edge of the second die pad has a second far-angle portion located on an opposite side of the second die pad from the second end portion in the first direction,
wherein the second far-angle portion has an arc shape when viewed along the thickness direction, and
wherein when viewed in the thickness direction, a radius of curvature of the second near-angle portion is larger than a radius of curvature of the second far-angle portion.

8. The semiconductor device of claim 6, wherein when viewed along the thickness direction, a radius of curvature of the second near-angle portion is 60 µm or more and 240 µm or less.

9. The semiconductor device of claim 2,
wherein when viewed along the thickness direction, the first near-angle portion includes a third end portion that is positioned opposite to the first end portion, and the peripheral edge of the first die pad has a first near-end edge that is connected to the third end portion, extends along the second direction from the third end portion, and faces the second die pad in the first direction, and
wherein when viewed along the thickness direction, the second near-angle portion includes a fourth end portion that is positioned opposite to the second end portion, and the peripheral edge of the second die pad has a second near-end edge that is connected to the fourth end portion, extends along the second direction from the fourth end portion, and faces the first die pad in the first direction.

10. The semiconductor device of claim 9, wherein a distance in the first direction between the first near-end edge and the second near-end edge is 250 µm or more and 500 µm or less.

11. The semiconductor device of claim 1, wherein the insulating element is mounted on the first die pad and is arranged between the first semiconductor element and the second semiconductor element in the first direction.

12. The semiconductor device of claim 1, wherein the insulating element is of an inductive type.

13. The semiconductor device of claim 1, wherein each of the first semiconductor element, the second semiconductor element, and the insulating element is composed of individual elements.

14. The semiconductor device of claim 1, wherein in a state where a power supply voltage is supplied to the first circuit and a power supply voltage is supplied to the second circuit, the power supply voltage supplied to the second circuit is larger than the power supply voltage supplied to the first circuit.

15. The semiconductor device of claim 1,
wherein the conductive support member includes a plurality of first terminals that are arranged along the second direction, at least one of the plurality of first terminals conducting to the first circuit, and a plurality of second terminals that are arranged along the second direction, at least one of the plurality of second terminals conducting to the second circuit,
wherein a portion of each of the plurality of first terminals is exposed from a first side surface of the sealing resin facing one side in the first direction, and
wherein a portion of each of the plurality of second terminals is exposed from a second side surface of the sealing resin facing the other side in the first direction.

16. The semiconductor device of claim 15, wherein when viewed along the thickness direction, a minimum distance between the first die pad and the second die pad is smaller than a minimum distance between each of the plurality of first terminals and the second die pad and a minimum distance between each of the plurality of second terminals and the first die pad.

* * * * *